US012787210B2

(12) United States Patent
Thiel et al.

(10) Patent No.: US 12,787,210 B2
(45) **Date of Patent: *Nov. 3, 2026**

(54) SYSTEM FOR SUPPLYING POWER TO AT LEAST ONE POWER DISTRIBUTION AND DATA HUB USING A PORTABLE BATTERY PACK

(71) Applicant: LAT Enterprises, Inc., Raleigh, NC (US)

(72) Inventors: Laura Thiel, Raleigh, NC (US); Giancarlo Urzi, Raleigh, NC (US); Carlos Cid, Raleigh, NC (US)

(73) Assignee: LAT Enterprises, Inc., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/575,093

(22) Filed: Mar. 23, 2026

(65) Prior Publication Data

US 2026/0223315 A1 Jul. 30, 2026

Related U.S. Application Data

(63) Continuation of application No. 19/294,530, filed on Aug. 8, 2025, now Pat. No. 12,610,496, which is a (Continued)

(51) Int. Cl.
*H01M 50/247* (2021.01)
*H01M 50/103* (2021.01)

(Continued)

(52) U.S. Cl.
CPC ........ *H05K 7/1492* (2013.01); *H01M 50/103* (2021.01); *H01M 50/121* (2021.01);

(Continued)

(58) Field of Classification Search
CPC .. H01M 50/247; H01M 50/24; H01M 50/202; H01M 50/121; H01M 50/227; H01M 50/103; H01M 50/16
See application file for complete search history.

(56) References Cited

U.S. PATENT DOCUMENTS

| | | | |
|---|---|---|---|
| 1,901,232 | A | 3/1933 | Glowacki |
| RE21,577 | E | 9/1940 | Brownlee |

(Continued)

FOREIGN PATENT DOCUMENTS

| | | | |
|---|---|---|---|
| BR | 102012032925 A2 | 8/2014 | |
| CA | 2794979 A1 | 10/2011 | |

(Continued)

OTHER PUBLICATIONS (computer-generated translation of BR-102012032925) Lago et al., "Personal Monitoring System", Aug. 26, 2014.

(Continued)

*Primary Examiner* — Jane J Rhee
(74) *Attorney, Agent, or Firm* — Neo IP

(57) ABSTRACT

A system for supplying power to at least one power distribution and data hub using a portable battery pack including a battery enclosed by a wearable and replaceable pouch or skin is disclosed, wherein the pouch or skin can be provided in different colors and/or patterns. Further, the pouch or skin can be MOLLE-compatible. The battery comprises a battery element housed between a battery cover and a back plate, wherein the battery element, battery cover, and back plate have a slight curvature or contour. Further, the battery comprises flexible leads.

20 Claims, 36 Drawing Sheets

Related U.S. Application Data continuation of application No. 18/814,938, filed on Aug. 26, 2024, now Pat. No. 12,414,257, which is a continuation of application No. 17/370,579, filed on Jul. 8, 2021, now Pat. No. 12,082,364, which is a continuation of application No. 16/732,785, filed on Jan. 2, 2020, now Pat. No. 11,064,630, which is a continuation of application No. 15/886,351, filed on Feb. 1, 2018, now Pat. No. 10,531,590, which is a continuation-in-part of application No. 15/836,259, filed on Dec. 8, 2017, now Pat. No. 10,476,054, which is a continuation-in-part of application No. 15/720,270, filed on Sep. 29, 2017, now Pat. No. 10,461,289, which is a continuation-in-part of application No. 15/664,776, filed on Jul. 31, 2017, now Pat. No. 11,462,649, which is a continuation-in-part of application No. 15/470,382, filed on Mar. 27, 2017, now Pat. No. 11,302,987, said application No. 15/720,270 is a continuation-in-part of application No. 14/520,821, filed on Oct. 22, 2014, now Pat. No. 9,780,344, said application No. 15/470,382 is a continuation-in-part of application No. 14/516,127, filed on Oct. 16, 2014, now abandoned.

(51) Int. Cl.

| | |
|---|---|
| ***H01M 50/121*** | (2021.01) |
| ***H01M 50/16*** | (2021.01) |
| ***H01M 50/202*** | (2021.01) |
| ***H01M 50/227*** | (2021.01) |
| ***H01M 50/24*** | (2021.01) |
| ***H02B 1/26*** | (2006.01) |
| ***H04L 69/14*** | (2022.01) |
| ***H05K 7/14*** | (2006.01) |

(52) U.S. Cl.

CPC ......... *H01M 50/16* (2021.01); *H01M 50/202* (2021.01); *H01M 50/227* (2021.01); *H01M 50/24* (2021.01); *H01M 50/247* (2021.01); *H02B 1/26* (2013.01); *H04L 69/14* (2013.01)

(56) References Cited

U.S. PATENT DOCUMENTS

| | | | |
|---|---|---|---|
| 2,416,984 | A | 3/1947 | Farr |
| 2,450,369 | A | 9/1948 | Alexander |
| 2,501,725 | A | 3/1950 | Knopp |
| 2,800,807 | A | 7/1957 | Gomersall et al. |
| 3,926,499 | A | 12/1975 | Bailey et al. |
| 3,952,694 | A | 4/1976 | McDonald |
| 3,968,348 | A | 7/1976 | Stanfield |
| 4,080,677 | A | 3/1978 | Koehler |
| 4,081,061 | A | 3/1978 | Tucker |
| 4,303,083 | A | 12/1981 | Burruss, Jr. |
| 4,346,151 | A | 8/1982 | Uba et al. |
| 4,656,770 | A | 4/1987 | Nuttle |
| 4,872,414 | A | 10/1989 | Asquith |
| 4,944,916 | A | 7/1990 | Franey |
| 4,979,502 | A | 12/1990 | Hunt |
| 5,185,042 | A | 2/1993 | Ferguson |
| 5,245,943 | A | 9/1993 | Hull et al. |
| 5,326,297 | A | 7/1994 | Loughlin |
| 5,340,662 | A | 8/1994 | Mccarter |
| 5,421,287 | A | 6/1995 | Yonover |
| 5,522,943 | A | 6/1996 | Spencer et al. |
| 5,537,022 | A | 7/1996 | Huang |
| D376,579 | S | 12/1996 | Bunyea et al. |
| 5,610,496 | A | 3/1997 | Hofbauer et al. |
| 5,653,367 | A | 8/1997 | Abramson |
| 5,680,026 | A | 10/1997 | Lueschen |
| 5,701,067 | A | 12/1997 | Kaji et al. |
| D392,249 | S | 3/1998 | Nakazawa et al. |
| 5,724,707 | A | 3/1998 | Kirk et al. |
| 5,736,954 | A | 4/1998 | Veazey |
| 5,808,865 | A | 9/1998 | Alves |
| 5,853,915 | A | 12/1998 | Suto |
| 5,861,223 | A | 1/1999 | Motlagh |
| 5,869,204 | A | 2/1999 | Kottke et al. |
| 5,944,567 | A | 8/1999 | Ratajczak et al. |
| 6,093,884 | A | 7/2000 | Toyomura et al. |
| 6,115,277 | A | 9/2000 | Plichta et al. |
| 6,172,892 | B1 | 1/2001 | Plichta et al. |
| 6,193,678 | B1 | 2/2001 | Brannon |
| 6,239,701 | B1 | 5/2001 | Vasquez et al. |
| 6,259,228 | B1 | 7/2001 | Becker et al. |
| 6,281,594 | B1 | 8/2001 | Sarich |
| 6,303,248 | B1 | 10/2001 | Peterson |
| 6,313,396 | B1 | 11/2001 | Glenn |
| 6,351,908 | B1 | 3/2002 | Thomas |
| 6,380,713 | B2 | 4/2002 | Namura |
| 6,396,403 | B1 | 5/2002 | Haner |
| 6,415,734 | B1 | 7/2002 | LaPuzza |
| 6,477,035 | B1 | 11/2002 | Cepas et al. |
| 6,546,873 | B1 | 4/2003 | Andrejkovics et al. |
| 6,641,432 | B1 | 11/2003 | Ouyoung |
| 6,659,320 | B1 | 12/2003 | Alves et al. |
| 6,727,197 | B1 | 4/2004 | Wilson et al. |
| 6,784,833 | B1 | 8/2004 | Evans |
| 6,866,527 | B2 | 3/2005 | Potega |
| 6,870,089 | B1 | 3/2005 | Gray |
| 6,945,803 | B2 | 9/2005 | Potega |
| 7,074,520 | B2 | 7/2006 | Probst et al. |
| 7,124,593 | B2 | 10/2006 | Feher |
| 7,141,330 | B2 | 11/2006 | Aoyama |
| D539,217 | S | 3/2007 | Hamaguchi |
| 7,221,552 | B1 | 5/2007 | Brown |
| 7,356,934 | B2 | 4/2008 | McCambridge et al. |
| D577,333 | S | 9/2008 | Daniel et al. |
| 7,443,627 | B1 | 10/2008 | Krishnamoorthy et al. |
| 7,489,105 | B2 | 2/2009 | Weinstein et al. |
| 7,494,348 | B1 | 2/2009 | Tyler et al. |
| 7,611,255 | B1 | 11/2009 | Lagassey |
| 7,624,453 | B2 | 12/2009 | Rene et al. |
| 7,695,334 | B2 | 4/2010 | Yonover et al. |
| 7,697,269 | B2 | 4/2010 | Yang et al. |
| 7,712,645 | B2 | 5/2010 | Calkin |
| 7,769,465 | B2 | 8/2010 | Matos |
| 7,782,610 | B2 | 8/2010 | Diebel et al. |
| 7,798,090 | B2 | 9/2010 | Hatfield |
| 7,805,114 | B1 | 9/2010 | Quintana et al. |
| 7,878,678 | B1 | 2/2011 | Stamatatos |
| 7,931,178 | B2 | 4/2011 | Rome et al. |
| D664,498 | S | 7/2012 | Liu |
| 8,258,394 | B2 | 9/2012 | Baruh |
| 8,415,924 | B2 | 4/2013 | Matthias et al. |
| D686,155 | S | 7/2013 | Nguyen |
| 8,587,261 | B2 | 11/2013 | Sassen et al. |
| 8,633,619 | B2 | 1/2014 | Robinson et al. |
| 8,638,011 | B2 | 1/2014 | Robinson et al. |
| 8,647,777 | B2 | 2/2014 | Yasunaga et al. |
| 8,720,762 | B2 | 5/2014 | Hilliard et al. |
| 8,736,108 | B1 | 5/2014 | Nielson et al. |
| 8,775,846 | B2 | 7/2014 | Robinson et al. |
| 8,832,981 | B2 | 9/2014 | Desaulniers |
| 8,945,328 | B2 | 2/2015 | Longinotti-Buitoni et al. |
| 8,984,666 | B1 | 3/2015 | LoBue |
| 9,029,681 | B1 | 5/2015 | Nielson et al. |
| 9,057,361 | B2 | 6/2015 | Donelan et al. |
| 9,093,586 | B2 | 7/2015 | Lentine et al. |
| 9,138,022 | B2 | 9/2015 | Walker |
| 9,141,143 | B2 | 9/2015 | Morita |
| 9,143,053 | B1 | 9/2015 | Lentine et al. |
| 9,144,255 | B1 | 9/2015 | Perciballi |
| 9,160,022 | B2 | 10/2015 | Pruett et al. |
| 9,230,486 | B2 | 1/2016 | Klement et al. |
| D756,908 | S | 5/2016 | Chung |
| 9,335,811 | B2 | 5/2016 | Long et al. |
| D762,564 | S | 8/2016 | Patton et al. |
| 9,496,448 | B2 | 11/2016 | Cruz-Campa et al. |
| 9,508,881 | B2 | 11/2016 | Tauke-Pedretti et al. |

(56) References Cited

U.S. PATENT DOCUMENTS 9,531,322 B2 12/2016 Okandan et al.
9,548,411 B2 1/2017 Nielson et al.
9,559,219 B1 1/2017 Okandan et al.
9,634,485 B2 4/2017 Long et al.
9,634,491 B2 4/2017 Robinson et al.
9,640,965 B1 5/2017 Long et al.
9,653,632 B1 5/2017 Beitman, Sr.
9,680,318 B2 6/2017 Carkner et al.
9,709,362 B2 7/2017 Shelley
9,780,344 B2 10/2017 Thiel et al.
D826,845 S 8/2018 Greiner
D844,557 S 4/2019 Wang
10,250,134 B2 4/2019 Long et al.
10,281,240 B2 5/2019 Cole et al.
10,326,284 B2 6/2019 Long et al.
10,333,315 B2 6/2019 Robinson et al.
10,361,629 B2 7/2019 Long et al.
10,461,289 B2 10/2019 Thiel et al.
10,476,054 B2 11/2019 Thiel et al.
10,531,590 B2 1/2020 Thiel et al.
D874,721 S 2/2020 Lai
10,587,116 B2 3/2020 Long et al.
10,594,142 B2 3/2020 Long et al.
10,616,534 B2 4/2020 Thiel et al.
D889,401 S 7/2020 Li
10,727,457 B2 7/2020 Thiel et al.
D897,946 S 10/2020 Liu
D899,355 S 10/2020 Sommerfeld et al.
10,848,067 B2 11/2020 Long et al.
10,862,320 B2 12/2020 Carkner et al.
D907,572 S 1/2021 Merrill et al.
D911,926 S 3/2021 Li
10,944,140 B2 3/2021 Thiel et al.
10,951,865 B2 3/2021 Thiel et al.
10,991,992 B2 4/2021 Thiel et al.
D921,576 S 6/2021 Baker et al.
D926,120 S 7/2021 Richard
11,064,630 B2 7/2021 Thiel et al.
11,108,230 B2 8/2021 Long et al.
D930,574 S 9/2021 Schramm et al.
D930,575 S 9/2021 Schramm et al.
D932,439 S 10/2021 Baker
D941,751 S 1/2022 Boris
D942,967 S 2/2022 Yan
D943,511 S 2/2022 Liu
D943,512 S 2/2022 Liu
11,258,366 B2 2/2022 Long et al.
11,283,265 B2 3/2022 Robinson et al.
D949,094 S 4/2022 Liu
D949,095 S 4/2022 Boris
11,304,500 B2 4/2022 Thiel et al.
11,355,928 B2 6/2022 Long et al.
D965,512 S 10/2022 Liao
D965,513 S 10/2022 Liao
D966,184 S 10/2022 Cheng
D967,010 S 10/2022 Liao
D967,755 S 10/2022 Liao
11,477,853 B2 10/2022 Gray et al.
11,569,667 B2 1/2023 Robinson et al.
D988,252 S 6/2023 Horikoshi et al.
D988,253 S 6/2023 Watanabe et al.
D988,254 S 6/2023 Katsumoto et al.
D988,255 S 6/2023 Watanabe et al.
D991,160 S 7/2023 Lai et al.
D993,166 S 7/2023 Horikoshi et al.
D993,167 S 7/2023 Horikoshi et al.
D993,168 S 7/2023 Horikoshi et al.
D993,169 S 7/2023 Watanabe et al.
D1,001,061 S 10/2023 Wang
11,800,067 B2 10/2023 Thiel et al.
11,862,763 B2 1/2024 Thiel et al.
11,876,241 B2 1/2024 Thiel et al.
11,876,354 B2 1/2024 Thiel et al.
D1,017,531 S 3/2024 Li et al.
D1,019,539 S 3/2024 Li et al.
D1,019,540 S 3/2024 Li et al.
D1,029,751 S 6/2024 Chen
D1,030,638 S 6/2024 Wang et al.
12,068,600 B2 8/2024 Long et al.
12,088,244 B2 9/2024 Thiel et al.
12,114,747 B2 10/2024 Thiel et al.
12,119,461 B2 10/2024 Thiel et al.
D1,054,974 S 12/2024 Feng
D1,055,845 S 12/2024 Wu
12,237,701 B2 2/2025 Thiel et al.
12,289,004 B2 4/2025 Thiel et al.
12,294,200 B2 5/2025 Thiel et al.
12,294,231 B2 5/2025 Thiel et al.
2002/0074370 A1 6/2002 Quintana et al.
2002/0148078 A1 10/2002 Salentine et al.
2002/0178558 A1 12/2002 Doshi et al.
2003/0029494 A1 2/2003 Ohkubo
2003/0038611 A1 2/2003 Morgan
2003/0098060 A1 5/2003 Yoshimi
2003/0165744 A1 9/2003 Schubert et al.
2004/0144580 A1 7/2004 Wu
2004/0154076 A1 8/2004 Yoo
2004/0237178 A1 12/2004 Landeros
2005/0140331 A1 6/2005 McQuade
2005/0151930 A1 7/2005 Harris
2005/0161079 A1 7/2005 Gray
2005/0210722 A1 9/2005 Graef et al.
2006/0028166 A1 2/2006 Closset et al.
2006/0147172 A1 7/2006 Luther et al.
2006/0225781 A1 10/2006 Locher
2006/0267547 A1 11/2006 Godovich
2007/0030146 A1 2/2007 Shepherd
2007/0061941 A1 3/2007 Makabe et al.
2007/0099488 A1 5/2007 Huffman et al.
2007/0125815 A1 6/2007 Tong
2007/0222410 A1 9/2007 Lee
2007/0245444 A1 10/2007 Brink
2007/0295772 A1 12/2007 Woodmansee
2008/0052439 A1 2/2008 Matos
2008/0190476 A1 8/2008 Baruh
2008/0223428 A1 9/2008 Zeira
2008/0223431 A1 9/2008 Chu
2008/0231225 A1 9/2008 Lin
2009/0004909 A1 1/2009 Puzio et al.
2009/0039122 A1 2/2009 Antonioni
2009/0044852 A1 2/2009 Shadbolt et al.
2009/0114690 A1 5/2009 Landay
2009/0131165 A1 5/2009 Buchner et al.
2009/0164174 A1 6/2009 Bears et al.
2009/0229655 A1 9/2009 Lee
2009/0269943 A1 10/2009 Palli et al.
2009/0272773 A1 11/2009 Andrade
2009/0279810 A1 11/2009 Nobles
2010/0008028 A1 1/2010 Richardson et al.
2010/0115680 A1 5/2010 Thomas et al.
2010/0147604 A1 6/2010 Sakita
2010/0173504 A1 7/2010 Parnapy et al.
2010/0213309 A1 8/2010 Parks
2010/0253501 A1 10/2010 Gibson
2010/0287681 A1 11/2010 Storms, Jr. et al.
2010/0300744 A1 12/2010 Romanko et al.
2011/0049992 A1 3/2011 Sant'Anselmo et al.
2011/0059642 A1 3/2011 Slippy et al.
2011/0064983 A1 3/2011 Yokoyama et al.
2011/0070472 A1 3/2011 Cui et al.
2011/0097069 A1 4/2011 Braithwaite
2011/0100425 A1 5/2011 Osamura et al.
2011/0101794 A1 5/2011 Schroeder et al.
2011/0162690 A1 7/2011 Workman et al.
2011/0173731 A1 7/2011 McElroy et al.
2011/0183183 A1 7/2011 Grady et al.
2011/0204114 A1 8/2011 Miller
2011/0242134 A1 10/2011 Miller et al.
2011/0277809 A1 11/2011 Dalland et al.
2011/0278338 A1 11/2011 Darnell, II et al.
2011/0290683 A1 12/2011 High et al.
2011/0291607 A1 12/2011 Rossi et al.
2012/0025766 A1 2/2012 Reade et al.
2012/0043937 A1 2/2012 Williams

(56) References Cited

U.S. PATENT DOCUMENTS

| | | | |
|---|---|---|---|
| 2012/0045929 | A1 | 2/2012 | Streeter et al. |
| 2012/0060261 | A1 | 3/2012 | Raviv |
| 2012/0073623 | A1 | 3/2012 | Jones et al. |
| 2012/0090659 | A1 | 4/2012 | Muchow et al. |
| 2012/0094166 | A1 | 4/2012 | Lee et al. |
| 2012/0100414 | A1 | 4/2012 | Sonta |
| 2012/0114990 | A1 | 5/2012 | Jeong et al. |
| 2012/0140419 | A1 | 6/2012 | Ribas et al. |
| 2012/0156911 | A1 | 6/2012 | Smith |
| 2012/0186000 | A1 | 7/2012 | Raviv |
| 2012/0214042 | A1 | 8/2012 | Wiegert |
| 2012/0227792 | A1 | 9/2012 | Chen et al. |
| 2012/0235477 | A1 | 9/2012 | Korman |
| 2012/0240999 | A1 | 9/2012 | Yoshida et al. |
| 2012/0289081 | A1 | 11/2012 | Izzard |
| 2013/0034765 | A1 | 2/2013 | Kowalski |
| 2013/0043827 | A1 | 2/2013 | Weinstein et al. |
| 2013/0049991 | A1 | 2/2013 | Mothaffar |
| 2013/0084473 | A1 | 4/2013 | Wahlquist et al. |
| 2013/0089756 | A1 | 4/2013 | Kwag |
| 2013/0164567 | A1 | 6/2013 | Olsson et al. |
| 2013/0181666 | A1 | 7/2013 | Matthias et al. |
| 2013/0183562 | A1 | 7/2013 | Workman et al. |
| 2013/0263922 | A1 | 10/2013 | Jung et al. |
| 2013/0294712 | A1 | 11/2013 | Seuk |
| 2013/0298958 | A1 | 11/2013 | Kopylov |
| 2013/0305528 | A1 | 11/2013 | Anderson |
| 2014/0061273 | A1 | 3/2014 | Bullivant et al. |
| 2014/0062381 | A1 | 3/2014 | Teggatz et al. |
| 2014/0072864 | A1 | 3/2014 | Suzuta et al. |
| 2014/0082814 | A1 | 3/2014 | Rober et al. |
| 2014/0095915 | A1 | 4/2014 | Hitchcock et al. |
| 2014/0101831 | A1 | 4/2014 | Balzano |
| 2014/0142507 | A1 | 5/2014 | Armes |
| 2014/0150957 | A1 | 6/2014 | Romero |
| 2014/0206976 | A1 | 7/2014 | Thompson et al. |
| 2014/0210399 | A1 | 7/2014 | Urschel et al. |
| 2014/0226920 | A1 | 8/2014 | Passavia |
| 2014/0361726 | A1 | 12/2014 | Carkner |
| 2015/0060430 | A1 | 3/2015 | Tsuge et al. |
| 2015/0086868 | A1 | 3/2015 | Inoue et al. |
| 2015/0114444 | A1 | 4/2015 | Lentine et al. |
| 2015/0114451 | A1 | 4/2015 | Anderson et al. |
| 2015/0118543 | A1 | 4/2015 | Kim et al. |
| 2015/0128845 | A1 | 5/2015 | Desaulniers |
| 2015/0132622 | A1 | 5/2015 | Gohl et al. |
| 2015/0198670 | A1 | 7/2015 | Thiel |
| 2015/0200318 | A1 | 7/2015 | Thiel |
| 2015/0216245 | A1 | 8/2015 | Kinsley |
| 2015/0216274 | A1 | 8/2015 | Akin et al. |
| 2015/0263377 | A1 | 9/2015 | Brooks et al. |
| 2015/0295617 | A1 | 10/2015 | Lai et al. |
| 2016/0026423 | A1 | 1/2016 | Zenoff |
| 2016/0043505 | A1 | 2/2016 | Wu et al. |
| 2016/0112004 | A1 | 4/2016 | Thiel et al. |
| 2016/0118634 | A1 | 4/2016 | Thiel et al. |
| 2016/0141904 | A1 | 5/2016 | Zhijian |
| 2016/0183394 | A1 | 6/2016 | Raschilla et al. |
| 2016/0360146 | A1 | 12/2016 | Smith |
| 2017/0045337 | A1 | 2/2017 | Kim |
| 2017/0050259 | A1 | 2/2017 | Schraff et al. |
| 2017/0110896 | A1 | 4/2017 | Gissin et al. |
| 2017/0214103 | A1 | 7/2017 | Onnerud et al. |
| 2017/0229692 | A1 | 8/2017 | Thiel et al. |
| 2017/0245567 | A1 | 8/2017 | Fathollahi et al. |
| 2017/0259956 | A1 | 9/2017 | Hori et al. |
| 2017/0263902 | A1 | 9/2017 | Hwang et al. |
| 2017/0264116 | A1 | 9/2017 | Carkner et al. |
| 2017/0264237 | A1 | 9/2017 | La Due |
| 2017/0280797 | A1 | 10/2017 | Bayliss |
| 2018/0040910 | A1 | 2/2018 | Chung et al. |
| 2018/0047994 | A1 | 2/2018 | Perry et al. |
| 2018/0053919 | A1 | 2/2018 | Thiel et al. |
| 2018/0062197 | A1 | 3/2018 | Thiel et al. |
| 2018/0102518 | A1 | 4/2018 | Thiel et al. |
| 2018/0102656 | A1 | 4/2018 | Thiel et al. |
| 2018/0145445 | A1 | 5/2018 | Louis et al. |
| 2018/0168065 | A1 | 6/2018 | Thiel et al. |
| 2018/0249133 | A1 | 8/2018 | Thiel et al. |
| 2018/0258882 | A1 | 9/2018 | Thiel et al. |
| 2018/0309307 | A1 | 10/2018 | Carkner |
| 2019/0081493 | A1 | 3/2019 | Thiel et al. |
| 2019/0109349 | A1 | 4/2019 | Thiel et al. |
| 2019/0133303 | A1 | 5/2019 | Thiel et al. |
| 2020/0099023 | A1 | 3/2020 | Thiel et al. |
| 2020/0112189 | A1 | 4/2020 | McLean |
| 2020/0187379 | A1 | 6/2020 | Thiel et al. |
| 2020/0288089 | A1 | 9/2020 | Thiel et al. |
| 2020/0313610 | A1 | 10/2020 | Thiel et al. |
| 2020/0343493 | A1 | 10/2020 | Thiel et al. |
| 2021/0005850 | A1 | 1/2021 | Thiel et al. |
| 2021/0005936 | A1 | 1/2021 | Jeong |
| 2021/0032008 | A1 | 2/2021 | Luo |
| 2021/0119192 | A1 | 4/2021 | Gotcher |
| 2021/0273468 | A1 | 9/2021 | Reimann |
| 2021/0280933 | A1 | 9/2021 | Thiel et al. |
| 2021/0288375 | A1 | 9/2021 | Baker |
| 2021/0289174 | A1 | 9/2021 | Thiel et al. |
| 2021/0296925 | A1 | 9/2021 | Long et al. |
| 2021/0313629 | A1 | 10/2021 | Thiel et al. |
| 2022/0052536 | A1 | 2/2022 | Thiel et al. |
| 2022/0231369 | A1 | 7/2022 | Thiel et al. |
| 2022/0240654 | A1 | 8/2022 | Thiel et al. |
| 2022/0285936 | A1 | 9/2022 | Long et al. |
| 2023/0034714 | A1 | 2/2023 | Thiel et al. |
| 2023/0208114 | A1 | 6/2023 | Thiel et al. |
| 2023/0367284 | A1 | 11/2023 | Moore et al. |
| 2023/0370414 | A1 | 11/2023 | Moore et al. |
| 2023/0412119 | A1 | 12/2023 | Thiel et al. |
| 2024/0113656 | A1 | 4/2024 | Thiel et al. |
| 2024/0115020 | A1 | 4/2024 | Thiel et al. |
| 2024/0128526 | A1 | 4/2024 | Thiel et al. |
| 2024/0145836 | A1 | 5/2024 | Thiel et al. |
| 2024/0145840 | A1 | 5/2024 | Thiel et al. |
| 2024/0146037 | A1 | 5/2024 | Thiel et al. |
| 2024/0186602 | A1 | 6/2024 | Nguyen et al. |
| 2024/0250509 | A1 | 7/2024 | Thiel et al. |
| 2024/0250541 | A1 | 7/2024 | Thiel et al. |
| 2024/0266851 | A1 | 8/2024 | Thiel et al. |
| 2024/0285062 | A1 | 8/2024 | Thiel et al. |
| 2024/0297615 | A1 | 9/2024 | Thiel et al. |
| 2024/0339708 | A1 | 10/2024 | Thiel et al. |
| 2024/0405316 | A1 | 12/2024 | Ma |
| 2024/0422296 | A1 | 12/2024 | Thiel et al. |
| 2024/0431065 | A1 | 12/2024 | Thiel et al. |
| 2025/0015374 | A1 | 1/2025 | Thiel et al. |
| 2025/0015417 | A1 | 1/2025 | Carlucci et al. |
| 2025/0022968 | A1 | 1/2025 | Thiel et al. |
| 2025/0023334 | A1 | 1/2025 | Thiel et al. |
| 2025/0023512 | A1 | 1/2025 | Thiel et al. |
| 2025/0038166 | A1 | 1/2025 | Chen et al. |
| 2025/0105641 | A1 | 3/2025 | Thiel et al. |
| 2025/0112339 | A1 | 4/2025 | Li et al. |
| 2025/0118976 | A1 | 4/2025 | Thiel et al. |
| 2025/0141047 | A1 | 5/2025 | Zhang et al. |
| 2025/0149646 | A1 | 5/2025 | Kang et al. |
| 2025/0167568 | A1 | 5/2025 | Thiel et al. |
| 2025/0167726 | A1 | 5/2025 | Thiel et al. |
| 2025/0174741 | A1 | 5/2025 | Zhu et al. |
| 2025/0226546 | A1 | 7/2025 | Xu et al. |
| 2025/0226677 | A1 | 7/2025 | Thiel et al. |
| 2025/0233160 | A1 | 7/2025 | Jung |
| 2025/0246667 | A1 | 7/2025 | Jeong |
| 2025/0246770 | A1 | 7/2025 | Jun et al. |
| 2025/0246775 | A1 | 7/2025 | Zhu et al. |
| 2025/0246778 | A1 | 7/2025 | Jung et al. |
| 2025/0246780 | A1 | 7/2025 | Ko et al. |
| 2025/0246787 | A1 | 7/2025 | Jung |
| 2025/0253430 | A1 | 8/2025 | Jeong |
| 2025/0260214 | A1 | 8/2025 | Thiel et al. |
| 2025/0267241 | A1 | 8/2025 | Thiel et al. |
| 2025/0300252 | A1 | 9/2025 | Thiel et al. |

(56) References Cited

U.S. PATENT DOCUMENTS

| | | | |
|---|---|---|---|
| 2025/0300289 | A1 | 9/2025 | Thiel et al. |
| 2025/0309825 | A1 | 10/2025 | Thiel et al. |
| 2025/0364822 | A1 | 11/2025 | Thiel et al. |
| 2025/0365884 | A1 | 11/2025 | Thiel et al. |
| 2026/0012026 | A1 | 1/2026 | Thiel et al. |

FOREIGN PATENT DOCUMENTS

| | | | |
|---|---|---|---|
| CN | 202474897 | U | 10/2012 |
| CN | 202931205 | U | 5/2013 |
| CN | 203434648 | U | 2/2014 |
| CN | 203435168 | U | 2/2014 |
| CN | 205452304 | U | 8/2016 |
| DE | 102011054322 | A1 | 4/2012 |
| DE | 202012104339 | U1 | 2/2014 |
| GB | 2502661 | A | 12/2013 |
| GB | 2518669 | A | 4/2015 |
| GB | 2553537 | A | 3/2018 |
| JP | 2002325339 | A | 11/2002 |
| JP | 2003174179 | A | 6/2003 |
| JP | 2004103248 | A | 4/2004 |
| JP | 2014003846 | A | 1/2014 |
| KR | 101145898 | B1 | 5/2012 |
| KR | 101159750 | B1 | 6/2012 |
| KR | 101294972 | B1 | 8/2013 |
| WO | 2005027780 | A2 | 3/2005 |
| WO | 2013106474 | A1 | 7/2013 |
| WO | 2015181673 | A1 | 12/2015 |
| WO | 2016061508 | A1 | 4/2016 |
| WO | 2017040724 | A1 | 3/2017 |

OTHER PUBLICATIONS

CaSZLUTION Bag. Amazon. https://www.amazon.com/dp/B0DJ8TV2VX.%20Accessed%2021%20Nov.%202024. Accessed Nov. 21, 2024.

DE 202012104339 Machine English translation (Year: 2014).

EE-Dan; Repair Your Laptop Power Cord; Instructables.com; published Jun. 11, 2013; https://www.instructables.com/Repair-Your-Laptop-Power-Cord/ (Year: 2013).

Electropaedia; Battery and Energy Technologies; printout from Jul. 2, 2012; pp. 1-5 (Year: 2012).

Epsilor; ELI-0414 Rechargeable Li-ion Military Battery; accessed and printed Apr. 21, 2020 (Year: 2020).

Machine translation of CN202931205U, Liu et al., 2013 (Year: 2013).

Machine translation of JP 2002-325339A, Okada Tadao, 2002 (Year: 2002).

Machine translation of JP 2004-103248; accessed and printed Aug. 7, 2021 (Year: 2004).

SATGEAR. https://satgear.com/products/starlink-gen-3-4-bag-backpack. Accessed Nov. 21, 2024.

Simon Tay, "DIY Spring Cable Support—To prevent cable damage", Dec. 13, 2013, YouTube, (Year: 2013).

Starlink Mini Specifications https://www.starlink.com/specifications?spec=5 Accessed Nov. 22, 2024.

STARLINK Roam. https://www.starlink.com/roam Accessed Nov. 21, 2024.

Translation of CN205452304 (Year: 2016).

Westover, Brian and Kan, Michael. SpaceX Selling $199 Backpack for Its Portable V4 Starlink Dish. PC Magazine, Nov. 12, 2024, https://www.pcmag.com/news/spacex-selling-199-backpack-for-its-portable-v4-starlink-dish. Accessed Nov. 21, 2024.

Yunhuan Group; 3 prong Australia AC power cord; archived Jul. 1, 2016; https://web.archive.org/web/20160701194647/http://www.yunhuanelectric.com/Australia-AC-Power-Cord-03.html (Year: 2016).

(PLAN-A)

(SIDE)

(PLAN-B)

(END-A)

(END-B)

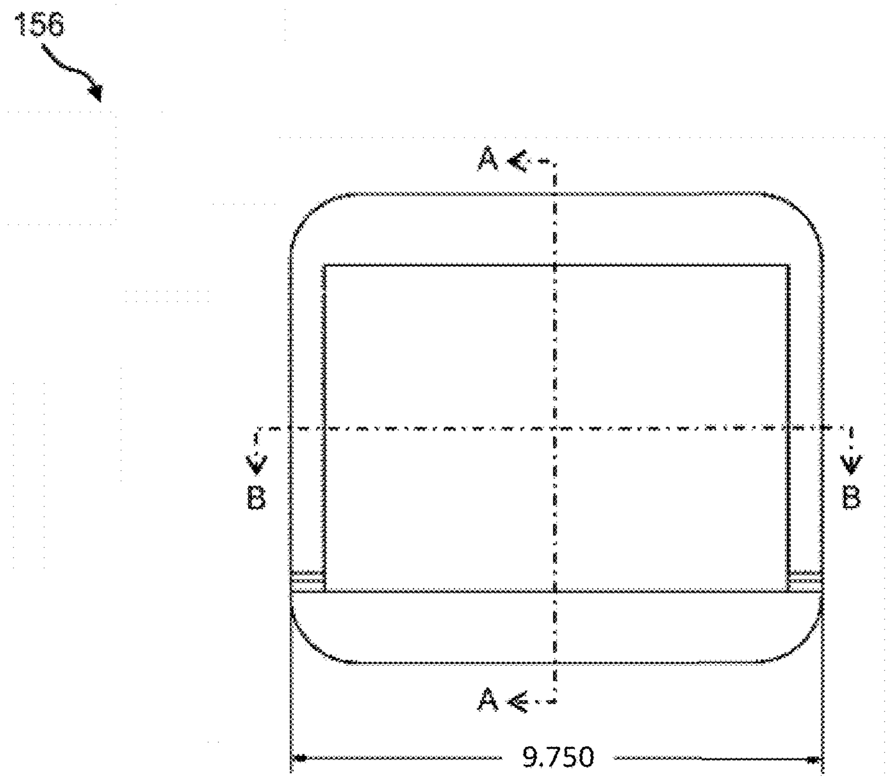
FIG. 14A
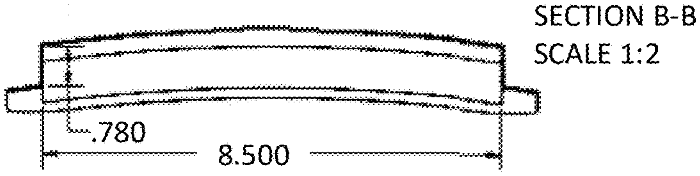
SECTION B-B
SCALE 1:2
FIG. 14B
FIG. 14C
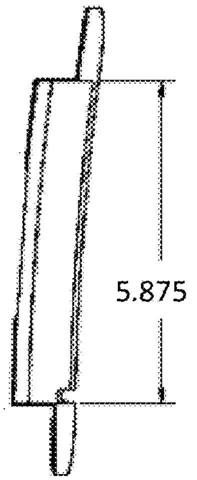
SECTION A-A
SCALE 1:2
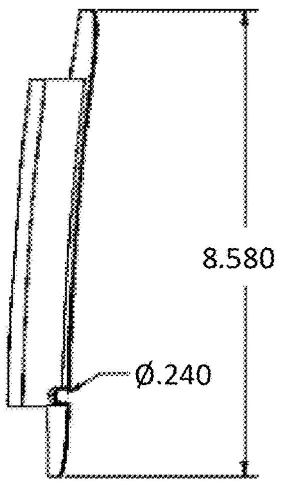
FIG. 14D

SYSTEM FOR SUPPLYING POWER TO AT LEAST ONE POWER DISTRIBUTION AND DATA HUB USING A PORTABLE BATTERY PACK

CROSS REFERENCE TO RELATED APPLICATIONS

This application is related to and claims priority from the following U.S. patents and patent applications: this application is a continuation of U.S. application Ser. No. 19/294,530, filed Aug. 8, 2025, which is a continuation of U.S. application Ser. No. 18/814,938, filed Aug. 26, 2024, which is a continuation of U.S. application Ser. No. 17/370,579, filed Jul. 8, 2021, which is a continuation of U.S. application Ser. No. 16/732,785, filed Jan. 2, 2020, which is a continuation of U.S. application Ser. No. 15/886,351, filed Feb. 1, 2018, which is a continuation-in-part of U.S. application Ser. No. 15/836,259, filed Dec. 8, 2017, which is a continuation-in-part of U.S. application Ser. No. 15/720,270, filed Sep. 29, 2017, which is a continuation-in-part of U.S. application Ser. No. 14/520,821, filed Oct. 22, 2014, now U.S. Pat. No. 9,780,344. U.S. application Ser. No. 15/720,270 is also a continuation-in-part of U.S. application Ser. No. 15/664,776, filed Jul. 31, 2017, which is a continuation-in-part of U.S. application Ser. No. 15/470,382, filed Mar. 27, 2017, which is a continuation-in-part of U.S. application Ser. No. 14/516,127, filed Oct. 16, 2014. Each of the U.S. Applications mentioned above is incorporated herein by reference in its entirety.

BACKGROUND OF THE INVENTION

1. Field of the Invention

The present invention relates generally to portable equipment for military, law enforcement, aviation, personal survival, hiking, sporting, recreation, hunting, water sports, and camping applications and, more particularly, to a system for supplying power to at least one power distribution and data hub using a portable battery pack including one or more batteries enclosed by a wearable and replaceable pouch or skin.

2. Description of the Prior Art

Portable power sources are used in, for example, military applications, law enforcement applications, aviation applications, wilderness and personal survival applications, hiking and camping applications, sporting and recreation applications, hunting applications, land surveying and expedition applications, and disaster relief efforts. For example, portable battery packs exist for carrying in a backpack or for wearing on the body. These battery packs, however, can be heavy and inconvenient to access and connect to devices requiring electrical power. Further, some applications require that the appearance of the battery pack blend with the environment in which they are used. Current battery packs, however, might not offer flexibility of appearance or the consumer is forced to buy one battery pack for one environment and a different battery pack for a different environment.

Additionally, portable battery packs are increasingly required to provide power to a plurality of peripheral electronic devices. The plurality of peripheral electronic devices is often connected to a power distribution and data hub, which supplies power to the plurality of peripheral electronic devices and transfers data between the plurality of peripheral electronic devices.

Prior art patent documents include the following:

U.S. Pat. No. 2,501,725 for instrument structure for portable testing voltmeters by inventor Knopp, filed Apr. 9, 1945 and issued Mar. 28, 1950, is directed to portable electric voltage testers and more particularly in the instruments used in such testers; for indicating the values of alternating and direct current voltages, and the polarity of unidirectional current circuits tested; the presence or absence of electrical energy on metallic parts in the vicinity of electrical energy sources; etc.

U.S. Pat. No. 5,340,662 for emergency battery system with an infinite shelf life by inventor McCarter, filed Jan. 15, 1993 and issued Aug. 23, 1994, is directed to an emergency battery system having an infinite shelf life, comprising a first primary reserve, water-activated battery that can be connected directly to an emergency appliance to provide voltage therein once activated, that can be connected to a self-contained, rechargeable battery utilized with the water-activated battery and stored for long periods of time to provide charge to the rechargeable battery, which itself can then be connected to an electrical emergency appliance, or the water-activated battery is connected to a power conversion circuit that can provide a variety of voltages to emergency electrical appliances that already have their own self-contained, rechargeable batteries. The emergency battery system described can be used to power emergency appliances, such as lights, lanterns, emergency radios, or DC-powered telephones. As long as the water-activated battery is kept free of moisture or water, the shelf life is virtually infinite.

U.S. Pat. No. 5,537,022 for enclosed battery holder by inventor Huang, filed Aug. 22, 1995 and issued Jul. 16, 1996, is directed to an enclosed battery charger including a seat, a cover, and a conductive metal plate means. The seat is provided with a partition which has one end thereof extending upwardly to form a partition rib for preventing contact of two conductive metal plates. A front wall of the seat is provided with an inverted-L shaped hook piece, and a rear wall of the seat is provided with an engaging hole. The cover is provided with a rib having a rib section projected from an inner side thereof. The rib and rib section of the cover enclose a rib of the seat. The cover also has a hook piece which is retained by the engaging hole. The cover further has a slot corresponding to the hook piece of the front wall. A push-button switch and a metal piece are further provided to control connection of electricity. A post is disposed in the seat for preventing the wires and the conductive metal plates from slipping off. In addition, an insulated plate is passed through a slot in the cover to be disposed between the batteries and the conductive metal plates for preventing abnormal electricity discharge.

U.S. Pat. No. 5,653,367 for holster arrangement for a transportable communications device by inventor Abramson, filed Sep. 27, 1995 and issued Aug. 5, 1997, is directed to a holster arrangement for a transportable communications device that is worn by a user and is arranged to have a holder portion positioned on either side of the user's torso. Straps extending from a shoulder pad are utilized to support the holder portion and to secure the holster arrangement to the user. The holder portion is arranged to support a case in varied positions with the case being mountable on the holder portion at a substantially vertical position and at angular positions to the holder portion. Two angular mounting positions are provided to facilitate the use of the holster arrangement when fitted to either side of the user. The case for holding the communications device is readily detached from the holder of the holster arrangement.

U.S. Pat. No. 5,680,026 for tool belt with battery assembly by inventor Lueschen filed Mar. 21, 1994 and issued Oct. 21, 1997, is directed to an apparatus comprising: a battery assembly including exactly five parallel rows of C cells, each row having exactly four C cells arranged end to end in series, all of the rows being electrically connected together in series, a casing which surrounds the rows, a cable having a first end inside the casing, the first end of the cable having a first lead electrically connected to one end of the series connection of the rows, and the first end of the cable having a second lead electrically connected to the other end of the series connection of the rows, the cable having a second end outside the casing, and a male connector electrically connected to the second end of the cable; a belt adapted to be worn around the waist of a user, the belt having an adjustable girth so as to fit users having different waist sizes; a pocket supported by the belt and slideably movable along the girth of the belt, the pocket closely housing the battery assembly; and a portable, hand held, electrically powered cable tie tensioning tool, the tool having a female connector connected to the male connector of the battery assembly.

U.S. Pat. No. 6,259,228 for battery pack and protective pouch therefor by inventors Becker et al., filed Feb. 11, 2000 and issued Jul. 10, 2001, is directed to a protective housing for a jump-starting battery pack including a flexible sheet of multi-layered, electrically insulating fabric material including inner and outer nylon layers and a foam padding layer sandwiched therebetween adapted to be folded around the case of a battery pack positioned in the middle of the sheet and held closed by Velcro-type closures. Retaining straps secure the battery pack in place, one of the straps having stacks of secured-together folds positioned on opposite sides of the case to provide supports on which the connector clamps of the battery pack jumper cables can be clamped, with the cables projecting from the open top of the housing to serve as handles.

U.S. Pat. No. 6,380,713 for battery pack by inventor Namura, filed Apr. 25, 2001 and issued Apr. 30, 2002, is directed to a battery pack holding a first block adjacent to a second block in a case. The first and second blocks are a plurality of circular cylindrical batteries arranged in the same horizontal plane. The first and second blocks are each made up of N batteries lined up side-by-side in parallel fashion to form a lateral battery array, and M perpendicular batteries in close proximity to an electrode end of the lateral battery array and oriented at right angles to the batteries of the lateral battery array. The circular cylindrical batteries of the first and second blocks are arranged with point-by-point symmetry about the center of the rectangular case. Further, the electrode ends of perpendicular batteries protrude beyond a side of the lateral battery array towards the neighboring block to provide center region space between the first and second blocks.

U.S. Pat. No. 6,641,432 for waterproof cell cabinet by inventor Ouyoung, filed Oct. 16, 2002 and issued Nov. 4, 2003, is directed to a waterproof cell cabinet comprised of a hollow casing, a cell holder, a connection disk, a lid and a pair of locking plates; the casing being adapted with a coupling flange and two positioning channels on the inner circumference of the coupling flange and containing a retaining plate with resilient member and the cell holder in the casing, multiple rooms in the center of the casing with each provided with an induction coil; the connection disk being adapted to the front of the cell holder and integrated with two fixtures sandwiching a dovetail one end, and two retaining plates on both sides of the other end; the lid having on its one end provided with a dish and a rib at the center of the dish; two wings being provided on the outer circumference of the lid and a locking button extending from the other end of the lid to lock into the dovetail; two semi-circular locking plates each containing a semi-circular channel being provided between the connection disk and the lid; two fixation blocks being provided on the inner circumference of the locking plate to lock into a locking hole; and the lid being fully secured in the coupling flange to provide an enclosed space.

U.S. Pat. No. 6,727,197 for wearable transmission device by inventors Wilson et al., filed Nov. 17, 2000 and issued Apr. 27, 2004, is directed to a knitted, woven, or braided textile ribbon including fibers and having a length and selvage edges and one or more transmission elements running the length of the ribbon in place of one or more of the fibers and integrated with the fibers to transmit data and/or power along the length of the ribbon.

U.S. Pat. No. 7,074,520 for contoured casing of mating clamshell portions for an electrochemical cell by inventors Probst et al., filed Nov. 4, 2005 and issued Jul. 11, 2006, is directed to an electrochemical cell of either a primary or a secondary chemistry housed in a casing having opposed major side walls of a contoured shape.

U.S. Pat. No. 7,141,330 for secondary battery accommodation case by inventor Aoyama, filed Mar. 4, 2003 and issued Nov. 28, 2006, is directed to a secondary battery accommodation case with improved exterior surface having no parting line in two or more exterior faces out of four exterior faces encircling the battery accommodation portion. It comprises a substantially rectangular bottom case having a battery accommodation portion for accommodating secondary batteries and a top case to be assembled with the bottom case for closing the battery accommodation portion. In the assembled condition of the top case and the bottom case, the exterior face of the top case closing the secondary battery accommodation portion is made equal to or lower than two or more open edges out of four exterior faces encircling the battery accommodation portion in the bottom case.

US Publication No. 20090279810 for battery bag by inventor Nobles, filed May 6, 2008 and published Nov. 12, 2009, is directed to a battery bag assembly including an elongated watertight bag (WTB), a sealable access port (SAP), a battery tray (BT), a power feed-through (PFT), and an electric power conduit (EPC). SAP has an elongated configuration extending along an elongated length of the WTB. BT is disposed within the WTB so that its elongated configuration is aligned with the elongated length of the WTB. BT has electrical connector sockets (EPSs) mounted thereon for mating with oppositely sexed connectors provided on batteries. PFT is disposed on a wall of the watertight bag. PFT is configured to provide a watertight seal for an electrical conductor passing from an interior of the watertight bag to an exterior of the watertight bag. EPC is electrically connected for coupling electric power from the EPSs on the BT to a remote device.

U.S. Pat. No. 7,697,269 for housing mechanism for electronic device by inventors Yang et al., filed Dec. 27, 2006 and issued Apr. 13, 2010, is directed to an exemplary housing mechanism for an electronic device including a cover and a frame. The cover has a cover body, a sealing element, and a sidewall formed around the cover body. A surface of a distal end of the sidewall is recessed thereby forming a receiving slot therein. The sealing element has a connecting portion and a positioning portion connected to the connecting portion. The connecting portion is fixedly received in the receiving slot of the cover. The frame has a positioning slot defined therein and the positioning portion of the sealing element is for reception in the positioning slot of the frame when the cover is closed to the frame.

US Publication No. 20110070472 for watertight battery cover assembly for electronic device by inventors Cui et al., filed Mar. 22, 2010 and published Mar. 24, 2011, is directed to a battery cover assembly used in an electronic device. The battery cover assembly includes a main body, a battery cover, and a gasket. The main body defines a receiving cavity including a peripheral wall. The battery cover includes a frame. The gasket is assembled in the battery cover. The frame is latched in the receiving cavity, the gasket is caught between the frame and the peripheral wall. The disclosure further discloses an electronic device using the battery cover assembly.

US Publication No. 20120045929 for PALS compliant routing system by inventors Streeter et al., filed Aug. 23, 2011 and published Feb. 23, 2012, is directed to a PALS compliant routing system including flexible fabric cabling routed through the webbing of a PALS grid. A first connector or device is coupled to the cabling. Other connectors coupled to the cabling subsystem include a retention mechanism configured to retain them in the channels of the PALS webbing.

US Publication No. 20130294712 for ammunition magazine pouch by inventor Seuk, filed Oct. 30, 2012 and published Nov. 7, 2013, is directed to a hydration pouch including an elastic band that compresses the bottom portion of the hydration bladder inside the pouch to more evenly distribute the fluid contents of the bladder vertically within the pouch, thereby preventing the pooling of the fluid contents in the bottom of the bladder.

US Publication No. 20140072864 for packaging material for lithium ion battery, lithium ion battery, and method for manufacturing lithium ion battery by inventors Suzuta et al., filed Nov. 8, 2013 and published Mar. 13, 2014, is directed to a packaging material for a lithium ion battery including: a base material layer that is formed from a film obtained by biaxially stretching a multi-layered coextruded film including a first thermoplastic resin layer having rigidity and chemical resistance and being disposed at an outer side thereof, a second thermoplastic resin layer having a capability of propagating stress and adhesiveness, and a third thermoplastic resin layer having toughness; a metal foil layer that is laminated on one surface of the base material layer; an anti-corrosion-treated layer that is laminated on the metal foil layer; an inner adhesive layer that is laminated on the anti-corrosion-treated layer; and a sealant layer that is laminated on the inner adhesive layer.

U.S. Pat. No. 8,720,762 for load carrier systems and associated manufacturing methods by inventors Hilliard et al., filed Jun. 17, 2011 and issued May 13, 2014, is directed to load carrier systems and associated manufacturing methods. The patent discloses that a load carrier system can include a unitary piece of material. The unitary piece of material can include a body portion comprising a first face side, an opposing face side, a first peripheral edge and an opposing second peripheral edge; and one or more straps comprising a respective extended end, wherein the straps are an integral part of the body portion; wherein the one or more straps are folded over onto the first face side adjacent to the first peripheral edge; and wherein at least one respective end of the one or more straps is fastened to the opposing second peripheral edge.

U.S. Pat. No. 9,144,255 for system for attaching accessories to tactical gear by inventor Perciballi, filed Feb. 1, 2013 and issued Sep. 29, 2015, is directed to designs and methods for a reversible, textile-based tactical article. The tactical article comprises a textile based panel perforated with an array of slots arranged in vertical and horizontal, spaced apart rows. The panel may be adapted for attaching accessories to either side by lacing a strap through a row of the slots and through webbing loops on the accessory positioned between the slots. One side of the panel may have a first appearance, and the other side a second appearance that is different from the first appearance.

US Publication No. 20150295617 for waterproof case by inventors Lai et al., filed Apr. 13, 2015 and published Oct. 15, 2015, is directed to a protective case for an electronic device including a housing, a case cover and a gasket positioned between the housing and the case cover. The housing may include a case member, having a plurality of housing snap attachment structures formed therein. The case cover may likewise include case cover snap attachment structures formed thereon that couple with the housing snap fit structures. The gasket is positioned between planar surfaces of the case member and case cover so that it is axially compressed between the case member and the case cover to provide a water and air tight seal, with the compression of the gasket being maintained by the connection of the housing snap attachment structures and the case cover snap attachment structures.

US Publication No. 20170263902 for waterproof battery case by inventor Hwang, filed Jun. 30, 2016 and published Sep. 14, 2017, is directed to a waterproof battery case comprising: a case body including a base and a top cover, wherein adjacent surfaces thereof are correspondingly formed with a flange and a recess in which an elastic sealing member is mounted, the base is formed with an accommodation space allowing at least one battery to be accommodated, a stepped engaging hole and through hole are formed between the outer wall of the base the accommodation space; an electrode plate set, including at least one anode contact and at least one cathode contact accommodated in the accommodation space; and a waterproof structure, including an elastic waterproof plug allowing two wires to be integrally embedded therein, wherein a plug head at one end thereof is formed with a neck part having the circumference formed with at least one convex rib, the other end thereof is formed with an engaging sheet sleeved with the engaging hole.

SUMMARY OF THE INVENTION

The present invention relates generally to portable equipment for military, law enforcement, aviation, personal survival, hiking, watersports, and camping applications and, more particularly, to a system for supplying power to at least one power distribution and data hub using a portable battery pack including one or more batteries enclosed by a wearable and replaceable pouch or skin.

In one embodiment, the present invention provides a system for supplying power to at least one power distribution and data hub using a portable battery pack including one or more batteries enclosed in a wearable pouch and at least one power distribution and data hub, wherein the one or more batteries include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch, and one or more openings through which the one or more flexible omnidirectional leads from the one or more batteries can be accessed, wherein the one or more batteries are operable to supply power to the at least one power distribution and data hub, and wherein the at least one power distribution and data hub is operable to supply power to at least one peripheral device.

In another embodiment, the present invention provides a system for supplying power to at least one power distribution and data hub using a portable battery pack including one or more batteries enclosed in a wearable pouch and at least one power distribution and data hub, wherein the one or more batteries are rechargeable and include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch, and one or more openings through which the one or more flexible omnidirectional leads from the one or more batteries can be accessed, wherein the one or more flexible omnidirectional leads are operable to charge at least one of the one or more batteries, wherein the one or more batteries are operable to supply power to the at least one power distribution and data hub, and wherein the at least one power distribution and data hub is operable to supply power to at least one peripheral device.

In yet another embodiment, the present invention provides a system for supplying power to at least one power distribution and data hub using a portable battery pack including one or more batteries enclosed in a wearable pouch and at least one power distribution and data hub, wherein the one or more batteries include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch, one or more openings through which the one or more flexible omnidirectional leads from the one or more batteries can be accessed, and a pouch attachment ladder system (PALS) operable to attach the wearable pouch to a load-bearing platform, wherein the one or more batteries are operable to supply power to the at least one power distribution and data hub, and wherein the at least one power distribution and data hub is operable to supply power to at least one peripheral device.

These and other aspects of the present invention will become apparent to those skilled in the art after a reading of the following description of the preferred embodiment when considered with the drawings, as they support the claimed invention.

BRIEF DESCRIPTION OF THE DRAWINGS

FIG. 14A illustrates a top perspective view of the battery cover of the portable battery pack.

FIG. 14B illustrates a cross-section view of the battery cover of the portable battery pack.

FIG. 14C illustrates another cross-section view of the battery cover of the portable battery pack.

FIG. 14D illustrates yet another cross-section view of the battery cover of the portable battery pack.

DETAILED DESCRIPTION

Figure 1:
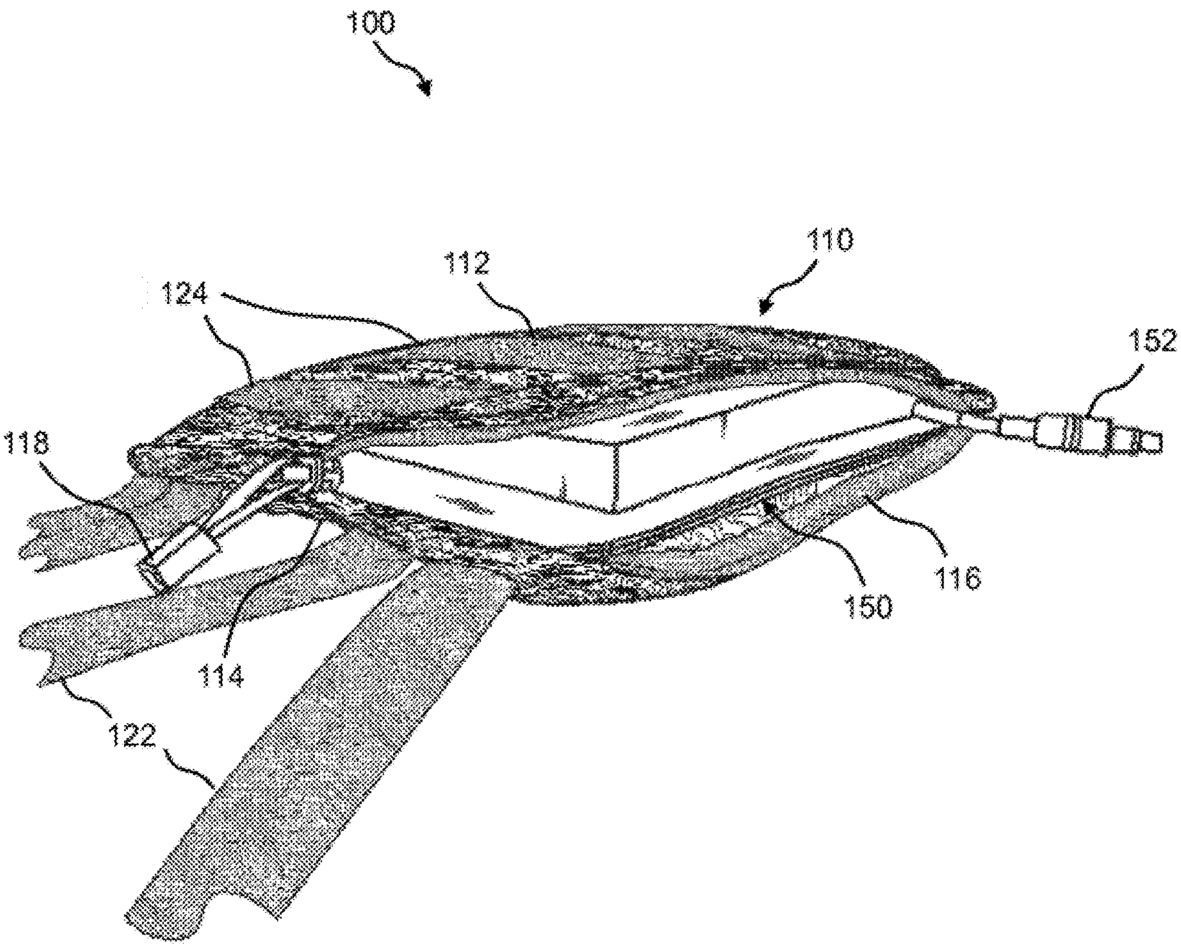
FIG. 1 illustrates a perspective view of an example of the portable battery pack that comprises a battery enclosed by a wearable pouch or skin.

The present invention is generally directed to a system for supplying power to at least one power distribution and data hub using a portable battery pack including a wearable and replaceable pouch or skin with one or more batteries enclosed in the pouch or skin for military, law enforcement, aviation, personal survival, hiking, sports, recreation, hunting, land surveying, expedition, watersports, and camping applications.

In one embodiment, the present invention provides a system for supplying power to at least one power distribution and data hub using a portable battery pack including one or more batteries enclosed in a wearable pouch and at least one power distribution and data hub, wherein the one or more batteries include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch, and one or more openings through which the one or more flexible omnidirectional leads from the one or more batteries can be accessed, wherein the one or more batteries are operable to supply power to the at least one power distribution and data hub, and wherein the at least one power distribution and data hub is operable to supply power to at least one peripheral device.

In another embodiment, the present invention provides a system for supplying power to at least one power distribution and data hub using a portable battery pack including one or more batteries enclosed in a wearable pouch and at least one power distribution and data hub, wherein the one or more batteries are rechargeable and include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch, and one or more openings through which the one or more flexible omnidirectional leads from the one or more batteries can be accessed, wherein the one or more flexible omnidirectional leads are operable to charge at least one of the one or more batteries, wherein the one or more batteries are operable to supply power to the at least one power distribution and data hub, and wherein the at least one power distribution and data hub is operable to supply power to at least one peripheral device.

In yet another embodiment, the present invention provides a system for supplying power to at least one power distribution and data hub using a portable battery pack including one or more batteries enclosed in a wearable pouch and at least one power distribution and data hub, wherein the one or more batteries include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch, one or more openings through which the one or more flexible omnidirectional leads from the one or more batteries can be accessed, and a pouch attachment ladder system (PALS) operable to attach the wearable pouch to a load-bearing platform, wherein the one or more batteries are operable to supply power to the at least one power distribution and data hub, and wherein the at least one power distribution and data hub is operable to supply power to at least one peripheral device.

None of the prior art discloses a system for supplying power to at least one power distribution and data hub using a portable battery pack including one or more batteries enclosed in a wearable pouch, wherein the one or more batteries include at least one battery element, a battery cover, a battery back plate, and one or more flexible omnidirectional leads that include a connector portion and a wiring portion, wherein a flexible spring is provided around the wiring portion such that a portion of the flexible spring is positioned inside the battery cover and a portion of the flexible spring is positioned outside the battery cover.

Referring now to the drawings in general, the illustrations are for the purpose of describing one or more preferred embodiments of the invention and are not intended to limit the invention thereto.

In some embodiments, the present invention provides a portable battery pack including a battery enclosed by, e.g., inside of, a wearable and replaceable pouch or skin, wherein the pouch or skin can be provided in different colors and/or patterns. Namely, a set of multiple interchangeable pouches or skins can be provided with one battery unit. This feature is particularly beneficial when it is required that the portable battery pack blend into different environments, such as in military applications. In one example, if the portable battery pack is used in a jungle or wilderness environment, the battery can be placed inside a camouflage pouch or skin. In another example, if the portable battery pack is used in an arctic environment, the battery can be placed inside a white-colored pouch or skin. In yet another example, if the portable battery pack is used in a desert environment, the battery can be placed inside a sand-colored pouch or skin.

Representative camouflages include, but are not limited to, Universal Camouflage Pattern (UCP), also known as ACUPAT or ARPAT or Army Combat Uniform; MultiCam, also known as Operation Enduring Freedom Camouflage Pattern (OCP); Universal Camouflage Pattern-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Overwhite Snow Digital Camouflage, Urban Digital Camouflage, and Tactical Assault Camouflage (TACAM).

Therefore, an aspect of the portable battery pack is that it provides a battery in combination with one or more wearable and replaceable pouches or skins, wherein the one or more pouches or skins can be different colors and/or patterns.

Another aspect of the portable battery pack is that the battery has one or more leads that can be flexed repeatedly in any direction without breaking or failing. This means the portable battery pack is operable to deliver energy from the battery to power consuming devices located in different areas of the load bearing equipment. Similarly, the portable battery pack is operable to receive energy from charging devices located in different areas of the load bearing equipment to the battery.

Yet another aspect of the portable battery pack is that the battery and pouch or skin are lightweight and contoured for comfortable wearing or ease of fastening to other equipment, such as a backpack or body armor, while still maintaining the lowest possible profile. Advantageously, this low profile prevents the portable battery pack from interfering with the wearer while in motion or seated.

Still another aspect of the portable battery pack is that the pouch or skin can be MOLLE-compatible. "MOLLE" means Modular Lightweight Load-carrying Equipment, which is the current generation of load-bearing equipment and backpacks utilized by a number of NATO armed forces. The portable battery pack can also be made to affix to other equipment (e.g., chair or seat, boat or kayak, helmet) or a user's body (e.g., back region, chest region, abdominal region, arm, leg) using straps, snaps, hook and loop tape, snaps, ties, buckles, and/or clips for other applications.

Figure 2:
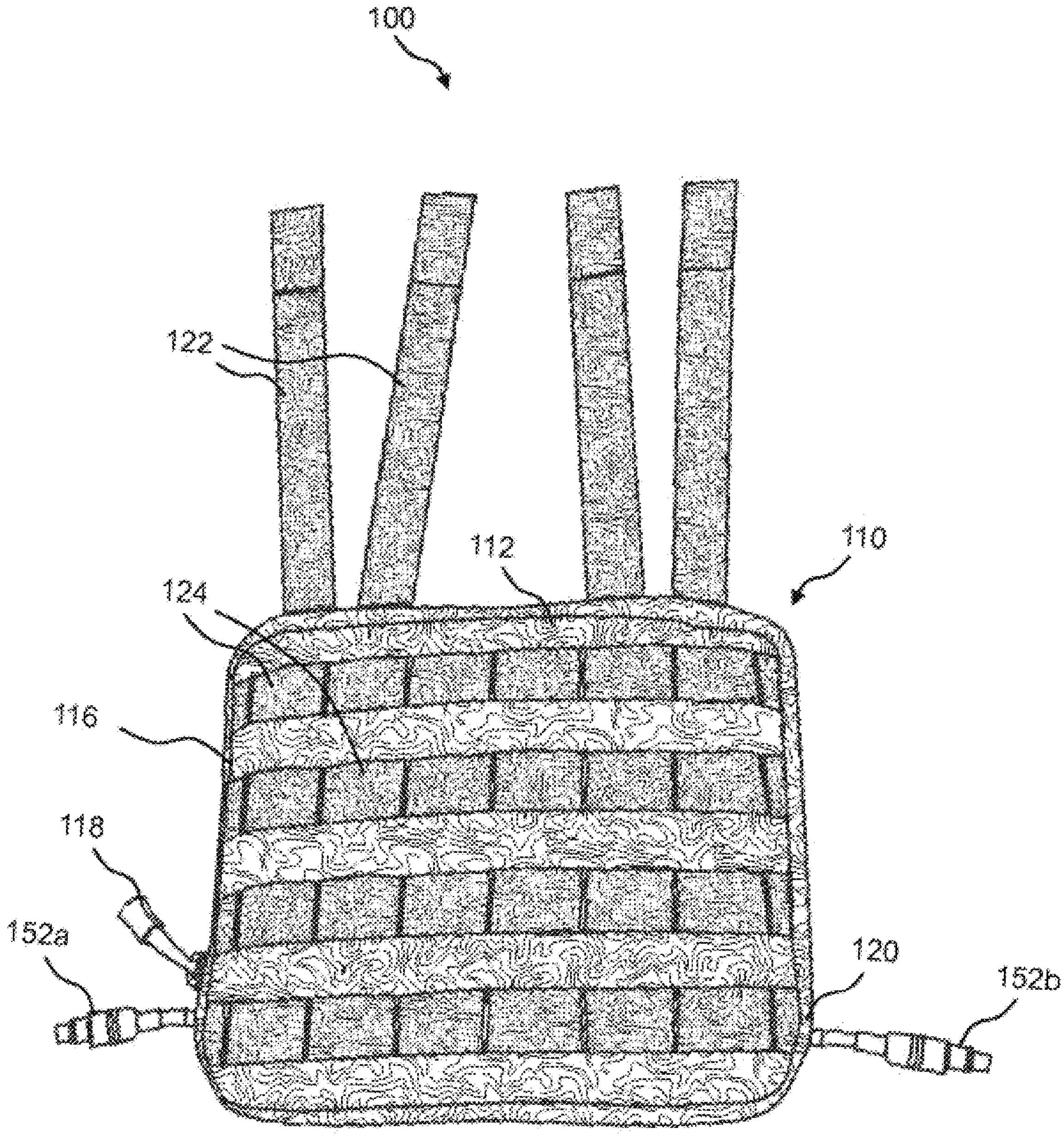
FIG. 2 illustrates a front perspective view of an example of the portable battery pack that comprises a battery enclosed by a wearable pouch or skin.
Figure 3:
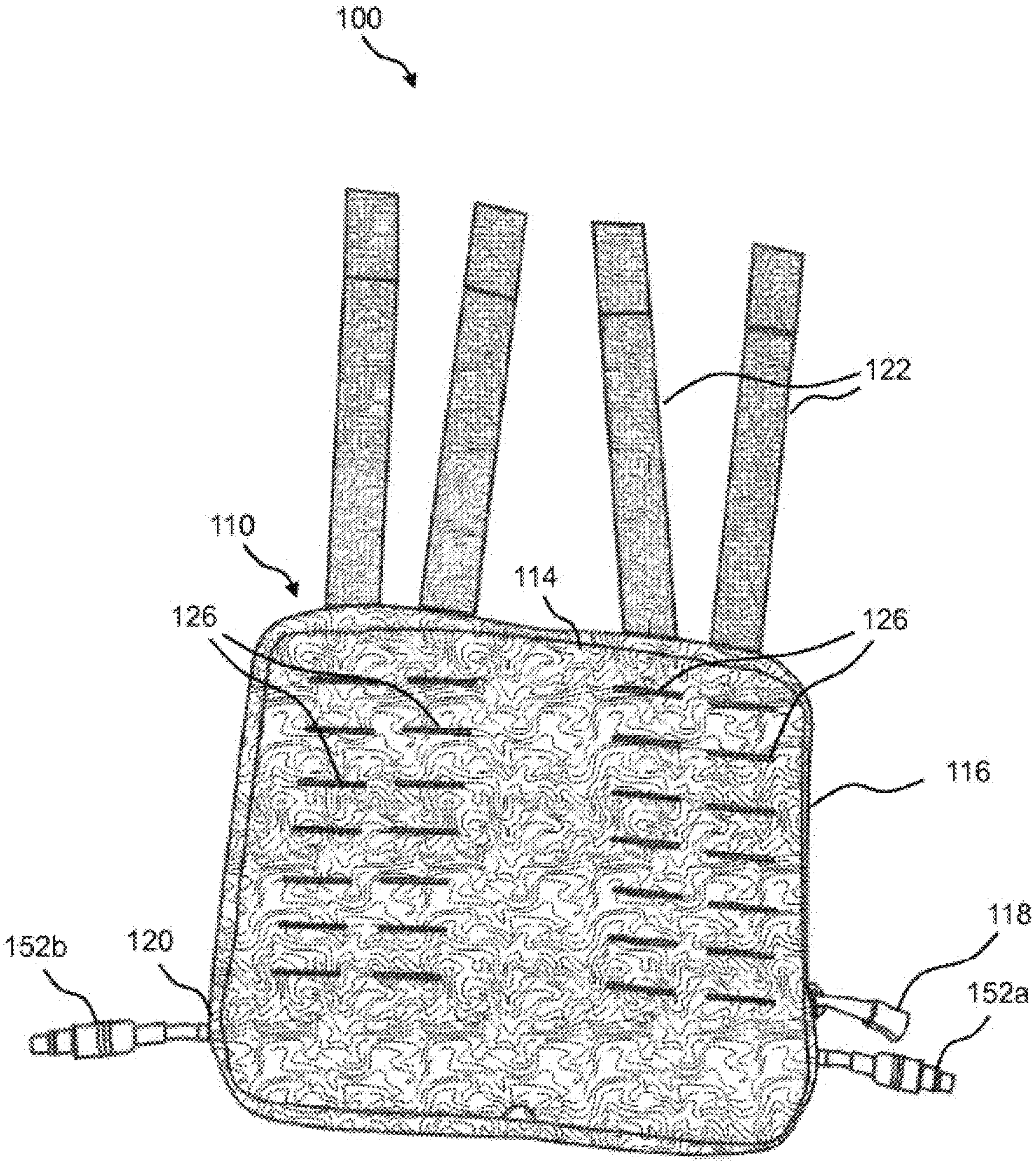
FIG. 3 illustrates a back perspective view of an example of the portable battery pack that comprises a battery enclosed by a wearable pouch or skin.

FIGS. 1-3 are perspective views of an example of the portable battery pack 100 that includes a battery enclosed by a wearable pouch or skin. For example, portable battery pack 100 includes a pouch 110 for holding a battery 150. The pouch 110 is a wearable pouch or skin that can be sized in any manner that substantially corresponds to a size of the battery 150. In one example, the pouch 110 is sized to hold a battery 150 that is about 9.75 inches long, about 8.6 inches wide, and about 1 inch thick.

In a preferred embodiment, the pouch 110 is formed of a flexible, durable, and waterproof or at least water-resistant material. For example, the pouch 110 is formed of polyester, polyvinyl chloride (PVC)-coated polyester, vinyl-coated polyester, nylon, canvas, PVC-coated canvas, or polycotton canvas. In one embodiment, the pouch 110 is formed of a material that is laminated to or treated with a waterproofing or water repellant material (e.g., rubber, PVC, polyurethane, silicone elastomer, fluoropolymers, wax, thermoplastic elastomer). Additionally or alternatively, the pouch 110 is treated with a UV coating to increase UV resistance. The exterior finish of the pouch 110 can be any color, such as white, brown, green, orange (e.g., international orange), yellow, black, or blue, or any pattern, such as camouflage, as provided herein, or any other camouflage in use by the military, law enforcement, or hunters. For example, in FIGS. 1-3, the pouch 110 is shown to have a camouflage pattern. In one embodiment, the exterior of the pouch 110 includes a reflective tape, fabric, or material. Advantageously, the reflective tape, fabric, or material improves visibility of the user in low-light conditions.

The pouch 110 has a first side 112 and a second side 114. The pouch 110 also includes a pouch opening 116, which is the opening through which the battery 150 is fitted into the pouch 110. In the example shown in FIGS. 1-3, the pouch opening 116 is opened and closed using a zipper, as the pouch 110 includes a zipper tab 118. Other mechanisms, however, can be used for holding the pouch opening 116 of the pouch 110 open or closed, such as, a hook and loop system (e.g., VELCRO®), buttons, snaps, hooks, ties, clips, buckles, and the like. Further, a lead opening 120 (see FIG. 2, FIG. 3, FIG. 5) is provided on the end of the pouch 110 that is opposite the pouch opening 116. For example, the lead opening 120 can be a 0.5-inch long slit or a 0.75-inch long slit in the edge of the pouch 110. In one embodiment, the lead opening 120 is finished or reinforced with stitching. In another embodiment, the lead opening 120 is laser cut.

The battery 150 includes at least one lead. In one example, the battery 150 is a rechargeable battery with two leads 152 (e.g., a first lead **152*a* and a second lead 152*b*) as shown in FIGS. 2-3. Each lead 152 can be used for both the charging function and the power supply function. In other words, the leads 152*a*, 152*b* are not dedicated to the charging function only or the power supply function only, both leads 152*a*, 152*b* can be used for either function at any time or both at the same time. In one example, the first lead 152*a* can be used for charging the battery 150 while the second lead 152*b* can be used simultaneously for powering equipment, or both leads 152 can be used for powering equipment, or both leads 152 can be used for charging the battery 150**.

Each lead is preferably operable to charge and discharge at the same time. In one example, a Y-splitter with a first connector and a second connector is attached to a lead. The Y-splitter allows the lead to supply power to equipment via the first connector and charge the battery via the second connector at the same time. Thus, the leads are operable to allow power to flow in and out of the battery simultaneously.

In another embodiment, each lead is operable to charge or discharge, but not operable to charge and discharge simultaneously. In one embodiment, the battery includes at least one sensor operable to determine if a lead is connected to a load or a power supply. If the at least one sensor determines that a lead is connected to a load, the discharging function is enabled and the charging function is disabled. If the at least one sensor determines that a lead is connected to a power supply, the charging function is enabled and the discharging function is disabled.

In a preferred embodiment, a dust cap is used to cover a corresponding lead. Advantageously, the dust cap protects the connector from dust and other environmental contaminants that may cause battery failure in the field. The dust cap is preferably permanently attached to the corresponding lead. Alternatively, the dust cap is removably attachable to the corresponding lead.

The battery is operable to be charged using at least one charging device. In a preferred embodiment, the at least one charging device is an alternating current (AC) adapter, a solar panel, a generator, a portable power case, a fuel cell, a vehicle battery, a rechargeable battery, and/or a non-rechargeable battery. Examples of a portable power case are disclosed in US Publication No. 20170229692 and U.S. application Ser. Nos. 15/664,776 and 15/836,299, each of which is incorporated herein by reference in its entirety. In one embodiment, the battery is connected to the at least one charging device through a direct current-direct current (DC-DC) converter cable.

In another embodiment, the battery is operable to be charged via inductive charging. In one embodiment, the battery is operable to be charged using an inductive charging mat. In an alternative embodiment, the battery is operable to be charged using an inductive puck worn in a pocket, on the back of a helmet, or in a rucksack. In one embodiment, the inductive puck is powered using a DC power source. Advantageously, this reduces the number of cables required for a user, which prevents users from accidentally disconnecting cables (e.g., when getting in and out of spaces like vehicles). Additionally, this allows a user to use proximity charging, which allows the user to focus on the task at hand instead of spending a few seconds connecting the battery to a charging device, which may be located behind the user in a rucksack. Further, this embodiment eliminates the possibility of reverse polarity and arcing between connectors caused by the electrical potential. The inductive puck is operable to charge additional power consuming devices carried by a user (e.g., a smartphone, a tablet).

In one embodiment, the battery is operable to be charged by harvesting ambient radiofrequency (RF) waves. Alternatively, the battery is operable to be charged by capturing exothermic body reactions (e.g., heat, sweat). In one embodiment, the battery is operable to be charged using thermoelectric generators, which use temperature differences between the body and the external environment to generate energy. In another embodiment, the battery is operable to be charged using sweat (e.g., using lactate). In an alternative embodiment, the battery is operable to be charged using friction (e.g., triboelectric effect) or kinetic energy. In yet another example, the battery is operable to be charged by a pedal power generator. In one embodiment, the battery is connected to the pedal power generator through a direct current-direct current (DC-DC) converter cable.

The battery is also operable to be charged using energy generated from running water and wind energy. In one embodiment, the wind energy is generated using an unmanned aerial system or drone on a tether. In an alternative embodiment, the wind energy is generated using a drive along turbine.

With respect to using the battery 150 with pouch 110, first the user unzips the pouch opening 116, then the user inserts one end of the battery 150 that has, for example, the second lead **152*b* through the pouch opening 116 and into the compartment inside the pouch 110. At the same time, the user guides the end of the second lead 152*b* through the lead opening 120, which allows the housing of the battery 150 to fit entirely inside of the pouch 110, as shown in FIG. 1. The first lead 152*a* is left protruding out of the unzipped portion of the pouch opening 116. Then the user zips the pouch opening 116 closed, leaving the zipper tab 118 snugged up against the first lead 152*a*, as shown in FIG. 2 and FIG. 3. FIG. 2 shows the portable battery pack 100 with the first side 112 of the pouch 110 up, whereas FIG. 3 shows the portable battery pack 100 with the second side 114 of the pouch 110** up.

As previously described, the battery has at least one lead. In one embodiment, the pouch has an opening for each corresponding lead. In one example, the battery has four leads and the pouch has four openings corresponding to the four leads. Alternatively, the pouch utilizes the zippered pouch opening to secure one lead and has an opening for each remaining lead. In one example, the battery has four leads and the pouch has three openings for three of the four leads. The remaining lead is secured by the zipper.

In another embodiment, the pouch has a seal around an opening for a corresponding lead. The seal is tight around the lead, which prevents water from entering the pouch through the opening. In one embodiment, the seal is formed of a rubber (e.g., neoprene).

In a preferred embodiment, the pouch of the portable battery pack is MOLLE-compatible. In one embodiment, the pouch incorporates a pouch attachment ladder system (PALS), which is a grid of webbing used to attach smaller equipment onto load-bearing platforms, such as vests and backpacks. For example, the PALS grid consists of horizontal rows of 1-inch (2.5 cm) webbing, spaced about one inch apart, and reattached to the backing at 1.5-inch (3.8 cm) intervals. In one embodiment, the webbing is formed of nylon (e.g., CORDURA® nylon webbing, MIL-W-43668 Type III nylon webbing). Accordingly, a set of straps 122 (e.g., four straps 122) are provided on one edge of the pouch 110 as shown in FIGS. 2-3. Further, rows of webbing 124 (e.g., four rows 124) are provided on the first side 112 of the pouch 110, as shown in FIG. 2. Additionally, rows of slots or slits 126 (e.g., seven rows of slots or slits 126) are provided on the second side 114 of the pouch 110, as shown in FIG. 3. In a preferred embodiment, the set of straps 122, the rows of webbing 124, and the rows of slots or slits 126 replicate and duplicate the MOLLE underneath the portable battery pack on the load bearing equipment. Advantageously, this allows for minimal disruption to the user because the user can place additional gear pouches or gear (e.g., water bottle, antenna pouch) on the MOLLE of the portable battery pack in an equivalent location.

In other embodiments, the portable battery pack is made to affix to other equipment (e.g., chair or seat, boat or kayak, helmet) or a user's body (e.g., back region, chest region, abdominal region, arm, leg) using straps, snaps, hook and loop tape, snaps, buckles, ties, and/or clips. In one example, the portable battery pack is made to affix to a seat of a kayak using at least one strap and at least one side-release buckle. In another example, the portable battery pack is made to affix to a user's body using two shoulder straps. In yet another example, the portable battery pack includes two shoulder straps, a chest strap, and a side-release buckle for the chest strap.

Figure 4:
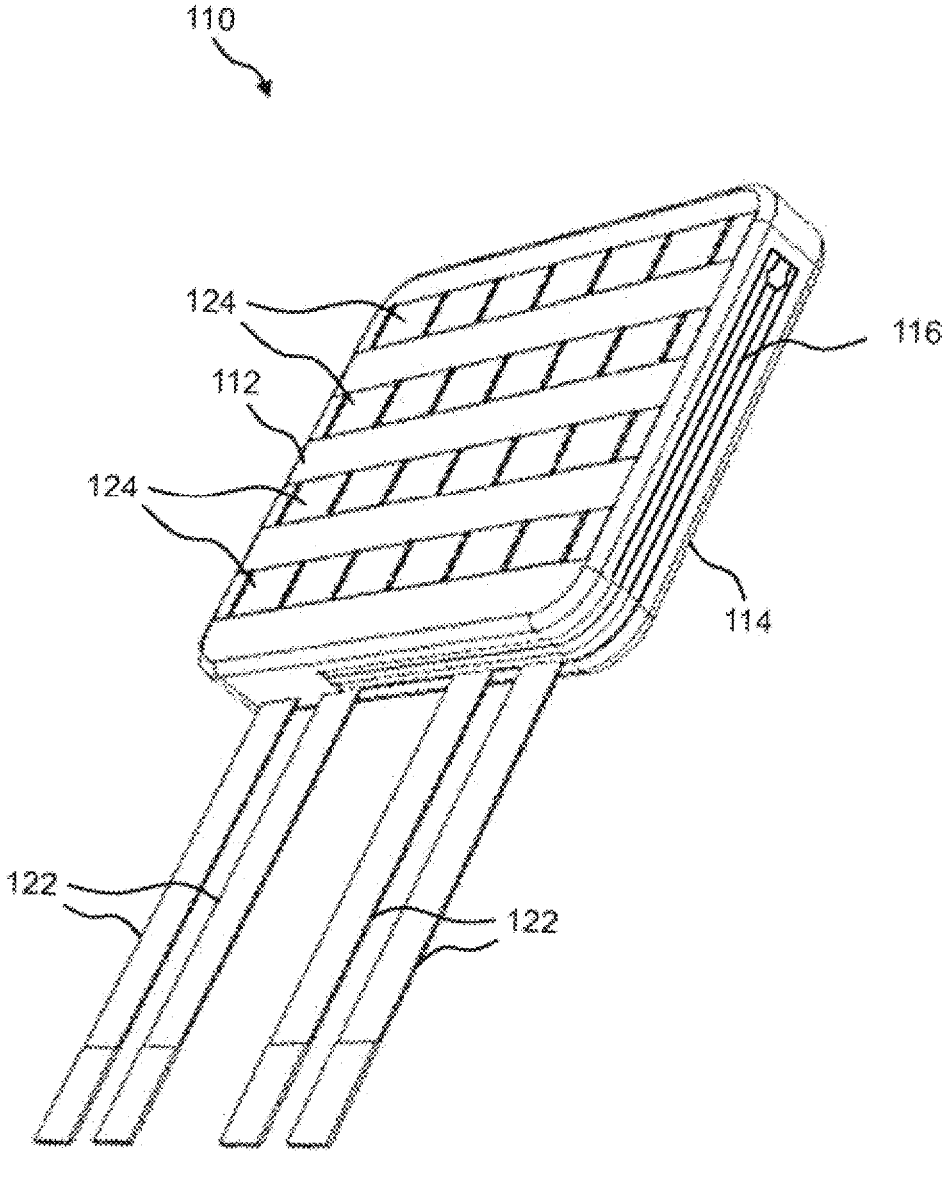
FIG. 4 illustrates an angled perspective view of the front of the wearable pouch or skin of the portable battery pack.
Figure 5:
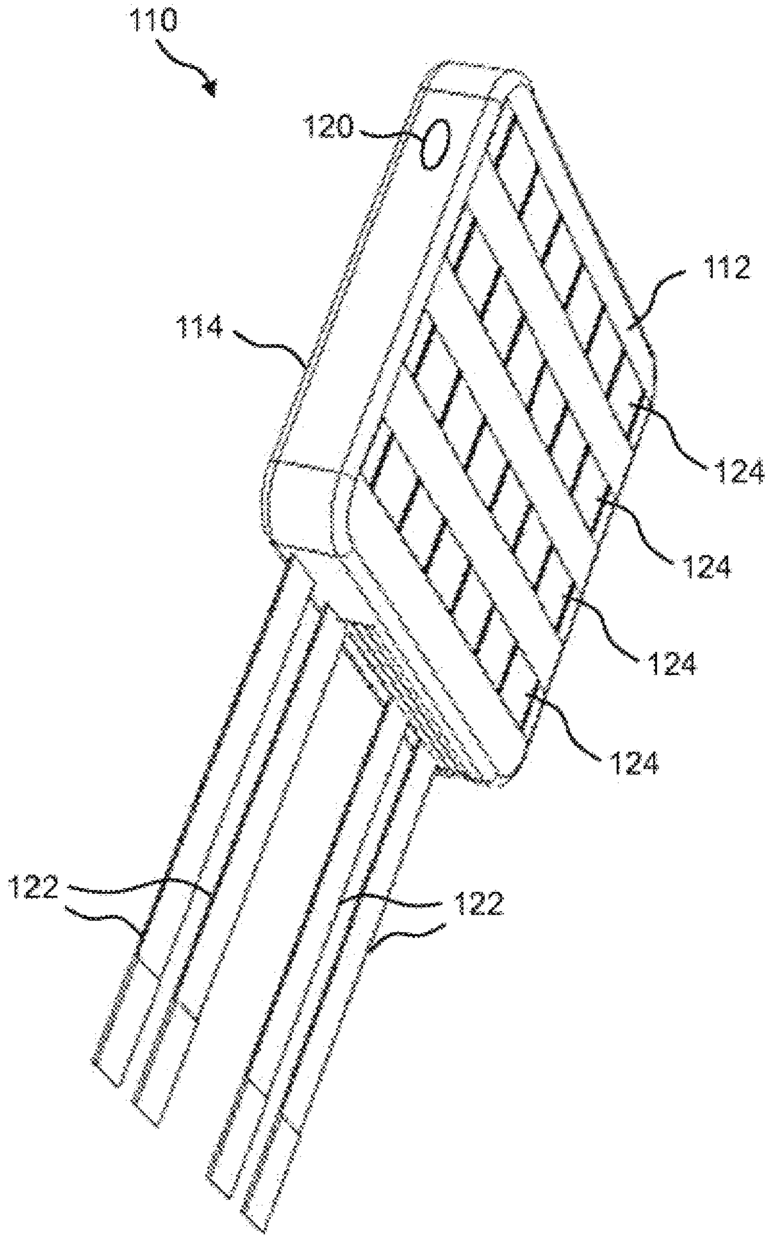
FIG. 5 illustrates another angled perspective view of one embodiment of the front of the wearable pouch or skin of the portable battery pack.
Figure 6:
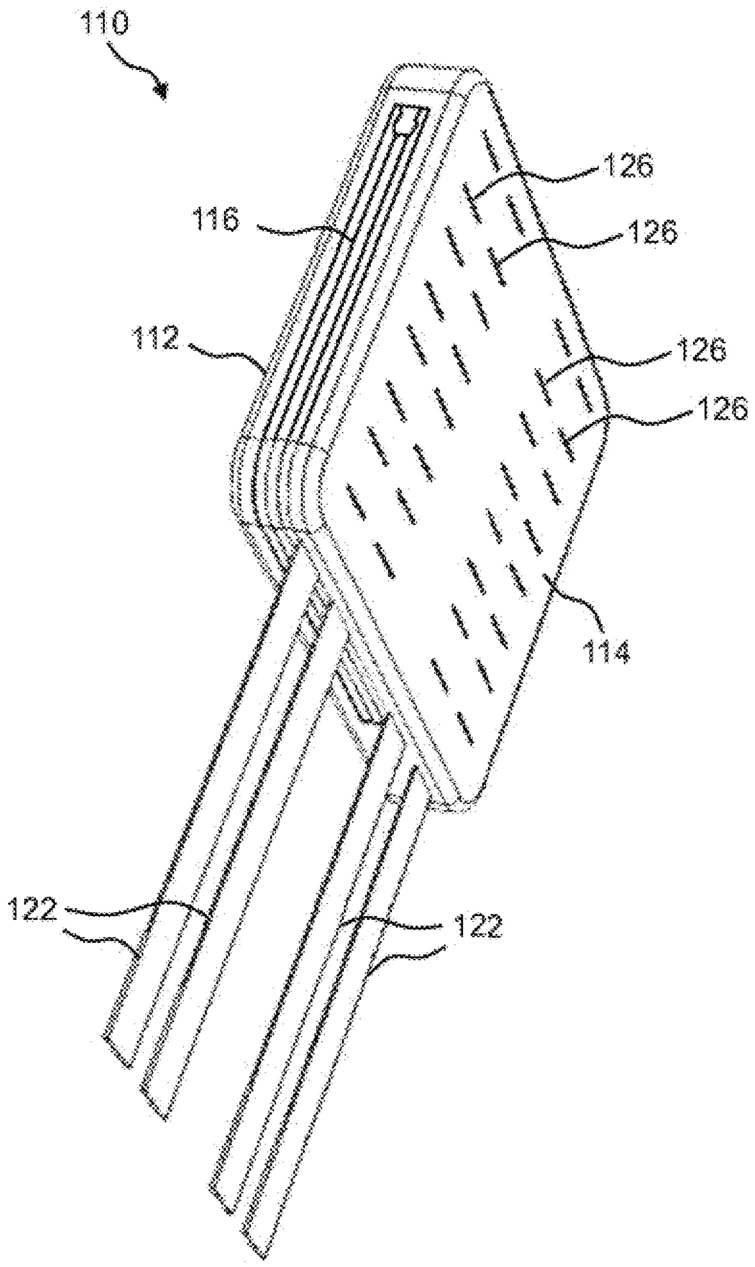
FIG. 6 illustrates an angled perspective view of one embodiment of the back of the wearable pouch or skin of the portable battery pack.

FIGS. 4-6 are perspective views of an example of the pouch 110 of the portable battery pack 100. FIG. 4 shows details of the first side 112 of the pouch 110 and of the edge of the pouch 110 that includes the pouch opening 116. FIG. 4 shows the pouch opening 116 in the zipper closed state. Again, four rows of webbing 124 are provided on the first side 112 of the pouch 110. FIG. 5 also shows details of the first side 112 of the pouch 110 and shows the edge of the pouch 110 that includes the lead opening 120. FIG. 6 shows details of the second side 114 of the pouch 110 and shows the edge of the pouch 110 that includes the pouch opening 116. FIG. 6 shows the pouch opening 116 in the zipped closed state. Again, seven rows of slots or slits 126 are provided on the second side 114 of the pouch 110.

Figure 7A:
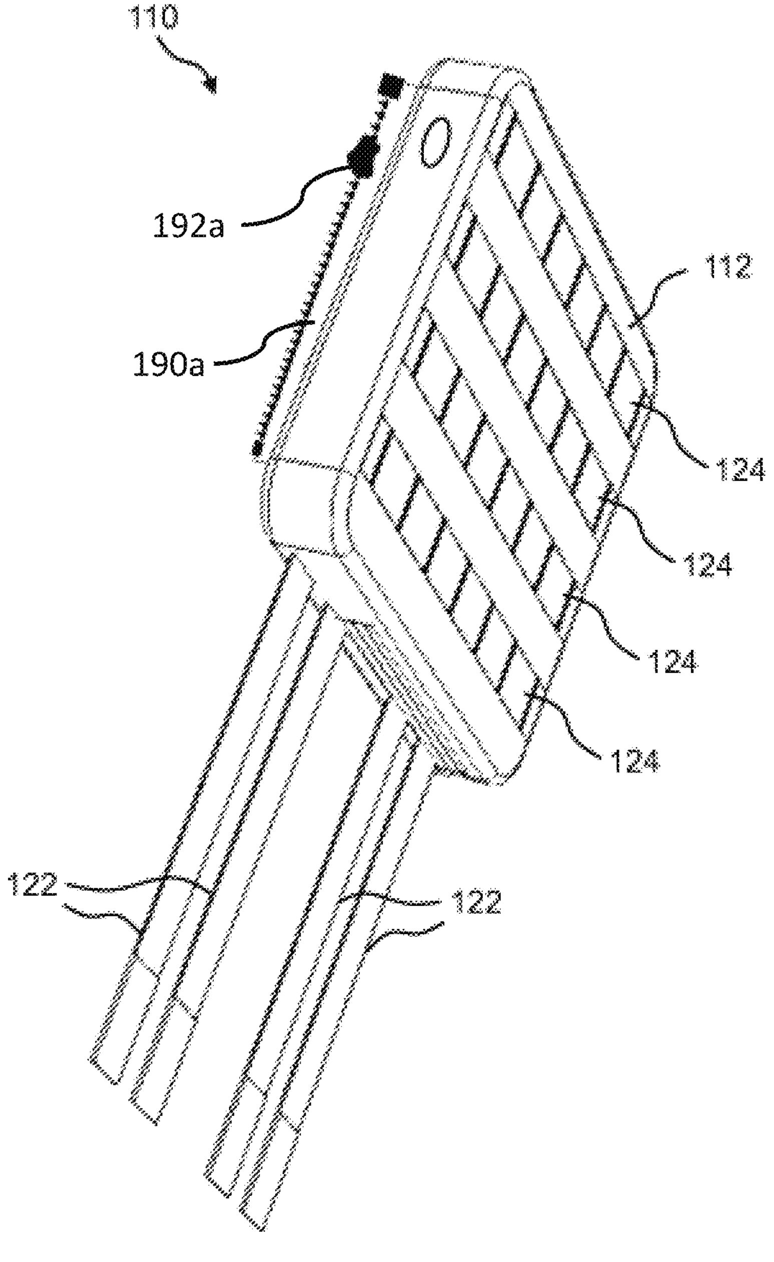
FIG. 7A illustrates another angled perspective view of another embodiment of the front of the wearable pouch or skin of the portable battery pack.
Figure 7B:
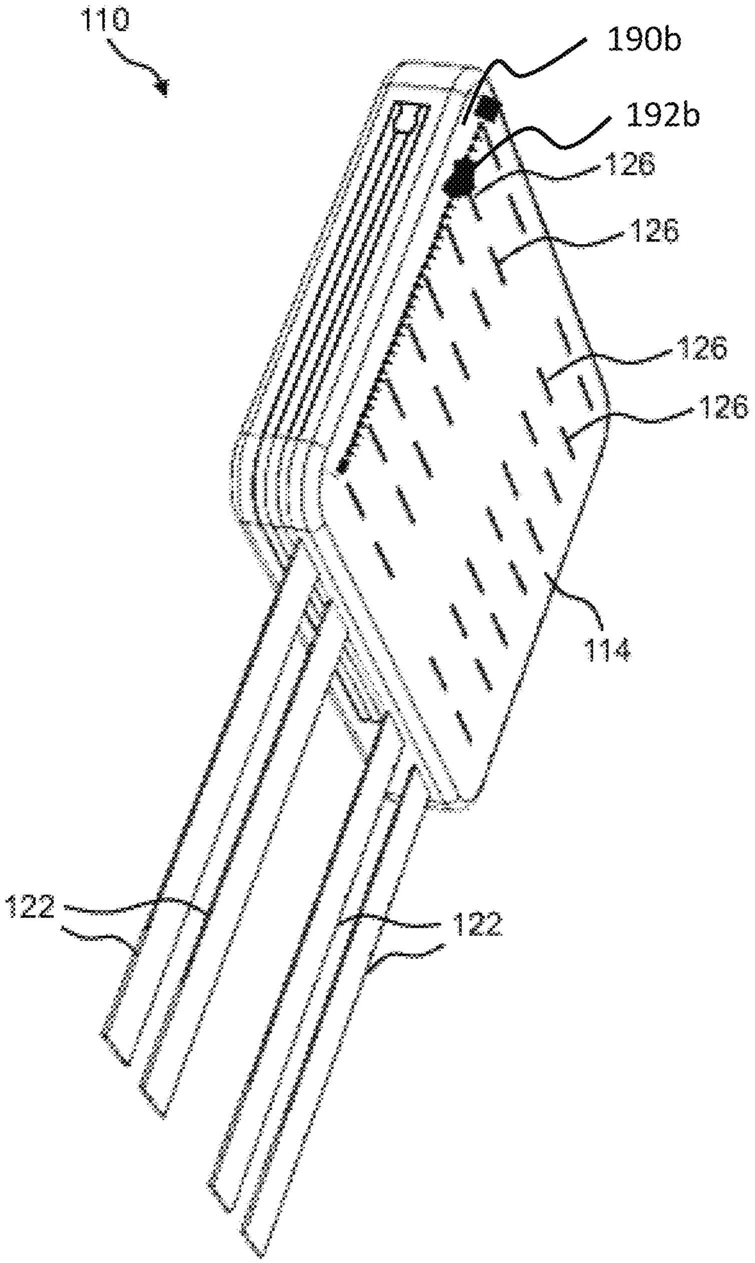
FIG. 7B illustrates an angled perspective view of another embodiment of the back of the wearable pouch or skin of the portable battery pack.

In another embodiment, the portable battery pack is made to affix to a plate carrier, body armor, or a vest with at least one single width of zipper tape sewn on the front panel or the back panel (e.g., JPC 2.0™ by Crye Precision) as shown in FIGS. 7A-7B. FIG. 7A shows details of the first side 112 of the pouch 110 including a single width of zipper tape **190*a* and a zipper slider 192*a*. The single width of zipper tape 190*a* mates with a corresponding single width of zipper tape on the plate carrier, the body armor, or the vest. FIG. 7B shows details of the second side 114 of the pouch 110 including a single width of zipper tape 190*b* and a zipper slider 192*b*. The single width of zipper tape 190*b*** mates with a corresponding single width of zipper tape on the plate carrier, the body armor, or the vest.

Figure 8:
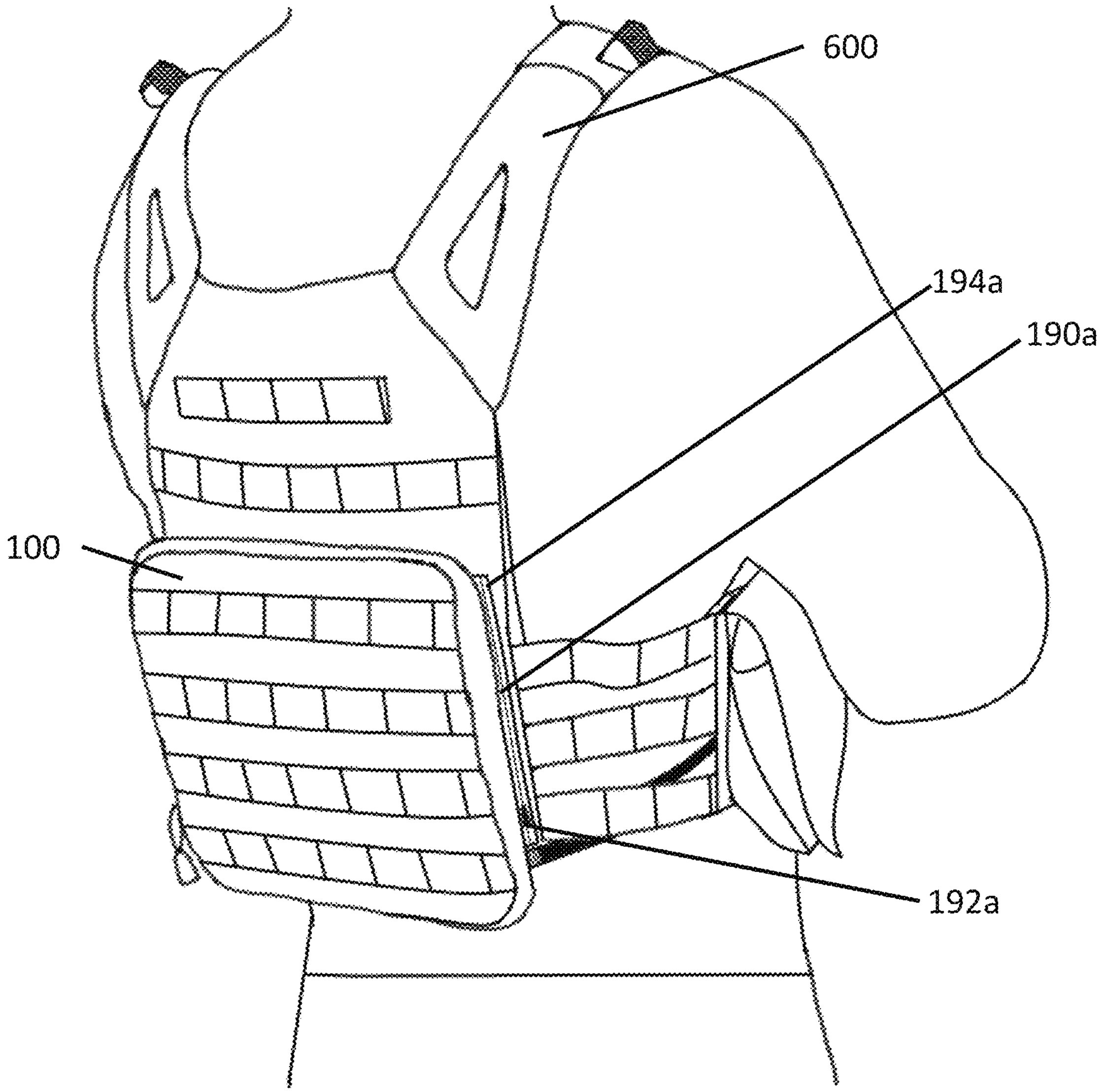
FIG. 8 shows a side perspective view of the portable battery pack affixed to a vest using zippers.

FIG. 8 shows a side perspective view of the portable battery pack 100 affixed to a vest 600 using zippers. A first single width of zipper tape **190*a* is shown mated with a corresponding first single width of zipper tape 194*a* on a right side of the vest 600 using a first zipper slider 192*a*, thereby attaching the portable battery pack 100 to the vest 600. Similarly, a second single width of zipper tape (not shown) is mated with a second corresponding single width of zipper tape (not shown) on a left side of the vest 600** using a second zipper slider (not shown). Advantageously, this allows cables to extend out of the pouch through an opening in the second side of the pouch because the rows of slots or slits are not required to the secure the pouch to the vest.

Figure 9A:
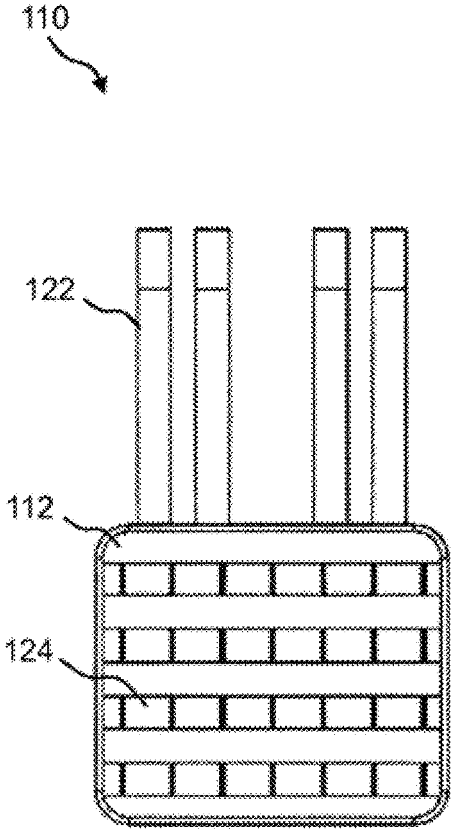
FIG. 9A illustrates a front perspective view of the wearable pouch or skin of the portable battery pack.
Figure 9B:
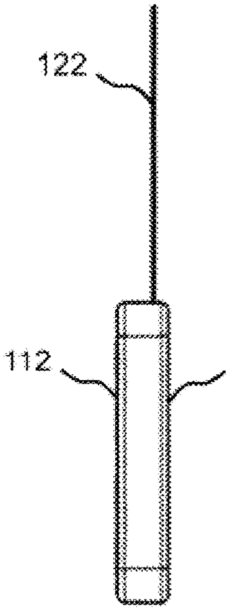
FIG. 9B illustrates a side perspective view of the wearable pouch or skin of the portable battery pack.
Figure 9C:
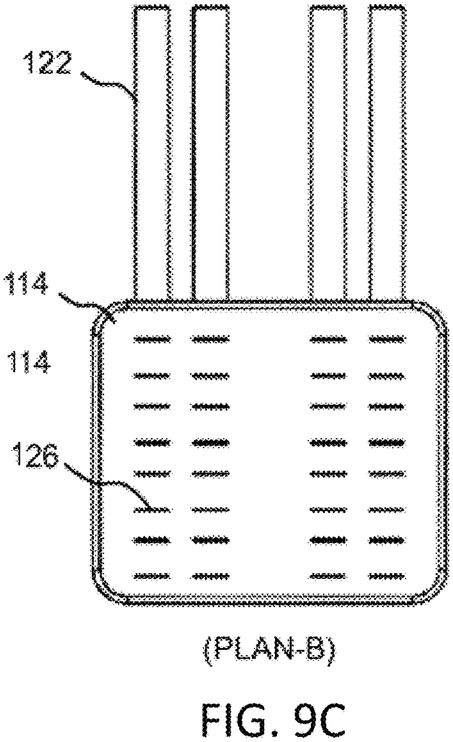
FIG. 9C illustrates a back perspective view of the wearable pouch or skin of the portable battery pack.
Figure 9D:
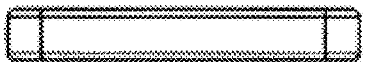
FIG. 9D illustrates a perspective view of an end of the wearable pouch or skin of the portable battery pack.
Figure 9E:
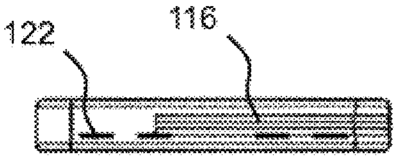
FIG. 9E illustrates a perspective view of another end of the wearable pouch or skin of the portable battery pack.
Figure 10:
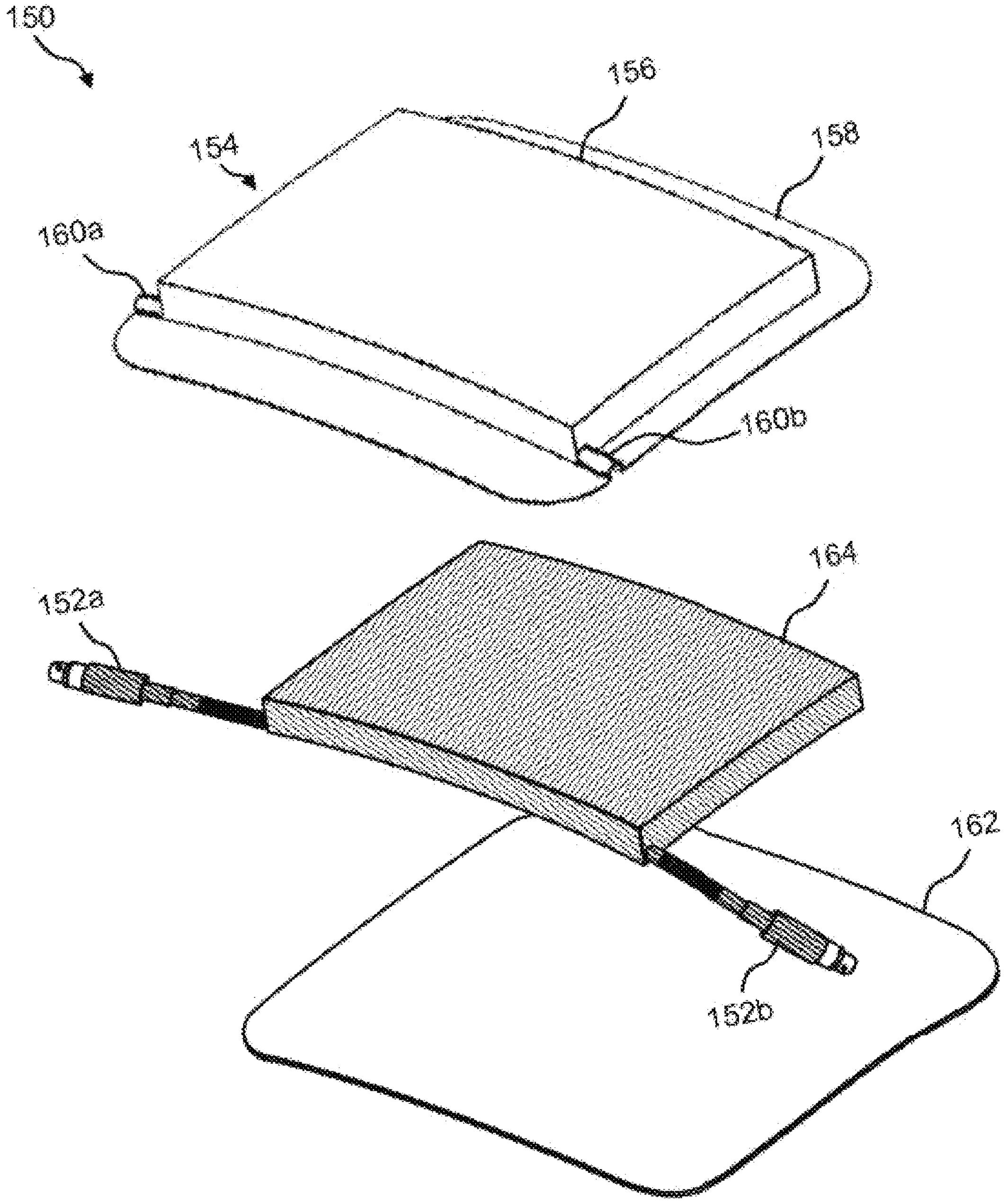
FIG. 10 illustrates an exploded view of an example of the battery of the portable battery pack.

FIGS. 9A-9E illustrate various other views of the pouch 110 of the portable battery pack 100. FIG. 9A shows a view (i.e., "PLAN-A") of the first side 112 of the pouch 110. FIG. 9B shows a side view of the pouch 110. FIG. 9C shows a view (i.e., "PLAN-B") of the second side 114 of the pouch 110. FIG. 9D shows an end view (i.e., "END-A") of the non-strap end of the pouch 110. FIG. 9E shows an end view (i.e., "END-B") of the strap 122-end of the pouch 110. FIG. 10 is an exploded view of an example of the battery 150 of the portable battery pack 100. The battery 150 includes a battery element 164 that is housed between a battery cover 154 and a back plate 162. The battery element 164 supplies the first lead **152*a* and the second lead 152*b*. The battery element 164 is formed of a plurality of sealed battery cells or individually contained battery cells, i.e. batteries with their own cases, removably disposed therein. In a preferred embodiment, the battery cells are electrochemical battery cells, and more preferably, include lithium ion rechargeable batteries. In one embodiment, the battery cells are lithium metal or lithium ferrous phosphate cells. In an alternative embodiment, the battery cells are all-solid-state cells (e.g., using glass electrolytes and alkaline metal anodes), such as those disclosed in US Publication Nos. 20160368777 and 20160365602, each of which is incorporated by reference in its entirety. In another embodiment, the battery is formed using at least one metal-organic framework. In one embodiment, the battery cells are 18350, 14430, 14500, 18500, 16650, 18650, 21700, or 26650 cylindrical cells. In one embodiment, the plurality of battery cells are operable to be constructed and configured in parallel, series, or a combination. The plurality of battery cells are configured to be in one group or more than one group. Advantageously, subdividing the plurality of battery cells into more than one group allows a larger quantity of lithium ion batteries to arrive by air that otherwise could not be transported due to regulations. In one example, the output of the battery element 164** can be from about 5 volts DC to about 90 volts DC at from about 0.25 amps to about 10 amps.

The plurality of battery cells is preferably connected to the leads via a battery management system. The battery management system protects the battery from operating outside of a safe operating area by including at least one safety cutoff. The at least one safety cutoff relates to voltage, temperature, state of charge, state of health, and/or current. In another embodiment, the battery management system calculates a charge current limit, a discharge current limit, an energy delivered since last charge, a charge delivered, a charge stored, a total energy delivered since first use, a total operating time since first use, and/or a total number of cycles.

In one embodiment, the plurality of battery cells is removably disposed within the battery cover and the back plate. For example, the plurality of battery cells can be replaced if they no longer hold a sufficient charge. In one embodiment, the plurality of battery cells is removably disposed within the battery cover and the back plate as a battery cartridge. In a preferred embodiment, the battery cartridge slides into an opening in the battery cover or the back plate through a battery access panel. In one embodiment, the battery cartridge is a spring-loaded cartridge. Additionally or alternatively, the battery cartridge has flat contacts and pins. The battery cartridge preferably has features that allow the battery cartridge to matingly fit with features in the opening. In another embodiment, the plurality of battery cells is removably disposed within the battery cover and the back plate using a battery holder or a snap connector. In one embodiment, the battery holder or the snap connector is electrically connected to the battery management system via a mating connector (e.g., a rectangular connector), such as those available from MOLEX® or POWERPOLE® by Anderson Power.

The battery access panel is preferably accessed within the battery cover or the back plate via a door on hinges, which allows the door to stay anchored to the device. Alternatively, the door is secured to the battery cover or the back plate by screws. The battery access panel preferably contains a gasket that provides a water tight seal when the door is secured to the battery cover or the back plate.

Alternatively, the plurality of battery cells is sealed within the battery cover and the back plate. In one embodiment, the plurality of battery cells is sealed using an adhesive and/or at least one mechanical fastener (e.g., screws, rivets, pins). In another embodiment, the plurality of battery cells is sealed within the battery cover and the back plate via bonding (e.g., solvent bonding, fusion bonding) and/or welding (e.g., vibration welding, ultrasonic welding).

The battery cover 154 includes a compartment 156 that is sized to receive at least one battery element 164. In a preferred embodiment, the compartment 156 is substantially rectangular in shape with a top hat style rim 158 provided around the perimeter of the compartment 156. The battery cover 154 incudes at least one channel formed in the battery cover 154 to accommodate a wire of a corresponding lead. The example in FIG. 10 shows two channels 160 (e.g., channels 160*a*, 160*b*) formed in the battery cover 154 (one on each side) to accommodate the wires of the first lead 152*a* and the second lead 152*b* passing therethrough. More details of the leads 152 and the battery cover 154 are shown and described herein below with reference to FIG. 16.

The battery cover 154 and the back plate 162 is formed of plastic using, for example, a thermoform process or an injection molding. The back plate 162 can be mechanically attached to the rim 158 of the battery cover 154 via, for example, an ultrasonic spot welding process or an adhesive. Advantageously, the top hat style rim 158 provides a footprint for the ultrasonic spot welding process and provides structural integrity for the battery. In one embodiment, a water barrier material (e.g., silicone) is applied to the mating surfaces of the rim 158 and the back plate 162. In another embodiment, the battery cover 154, the back plate 162, and/or the battery element 164 has a slight curvature or contour for conforming to, for example, the user's vest, backpack, or body armor. In one example, the curvature of the portable battery pack is engineered to match the outward curve of body armor. Advantageously, this means that the portable battery pack does not jostle as the operator moves, which results in less caloric energy expenditure when the operator moves. Alternatively, the battery cover 154, the back plate 162, and/or the battery element 164 can have a slight outward curvature or contour for conforming to a user's body (e.g., back region, chest region, abdominal region, arm, leg). In yet another embodiment, the battery cover 154, the back plate 162, and/or the battery element 164 can have a slight outward curvature or contour for conforming to a user's helmet or hat. More details of the battery cover 154 are shown and described herein below with reference to FIG. 13 and FIGS. 14A-14D. More details of the back plate 162 are shown and described herein below with reference to FIGS. 15A-15C.

As previously described, the housing of the at least one battery includes a battery cover and a back plate. In one embodiment, the battery includes more than one battery element encased in the housing. The output voltages of the more than one battery element are operable to be the same or different. In one example, a first battery element has an output voltage of 16.8V and a second battery element has an output voltage of 16.8V. In another example, a first battery element has an output voltage of 16.8V and a second battery element has an output voltage of 5V. Advantageously, including more than one battery element encased in the housing allows a larger quantity of lithium ion batteries to arrive by air that otherwise could not be transported due to regulations.

Figure 11:
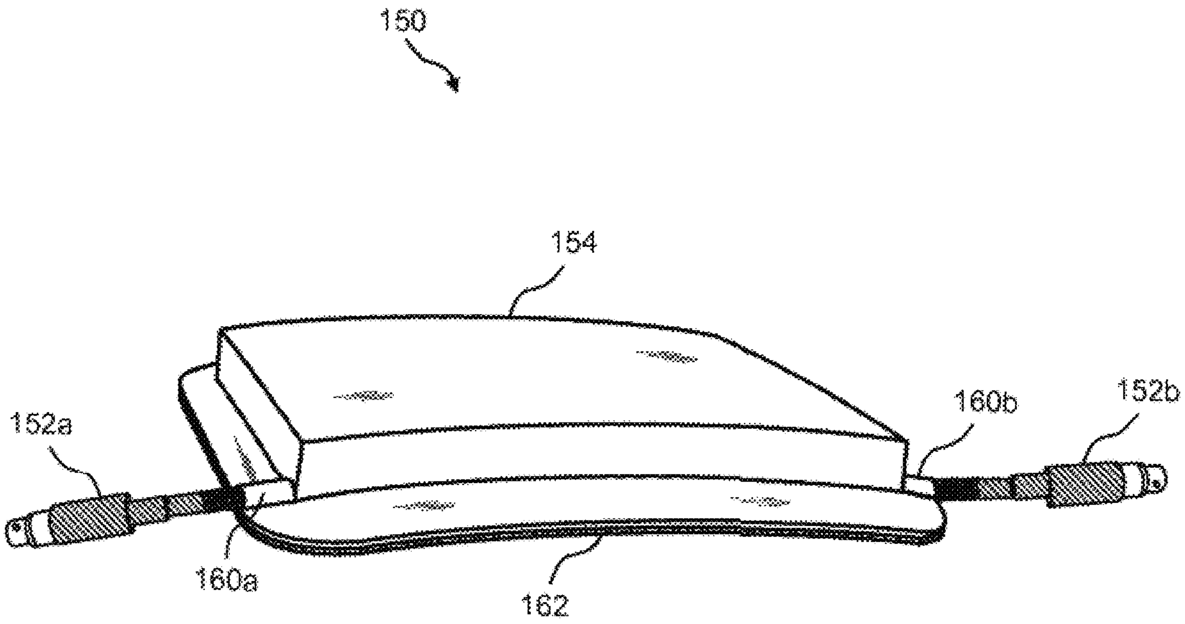
FIG. 11 illustrates a top perspective view of the battery of the portable battery pack when assembled.
Figure 12:
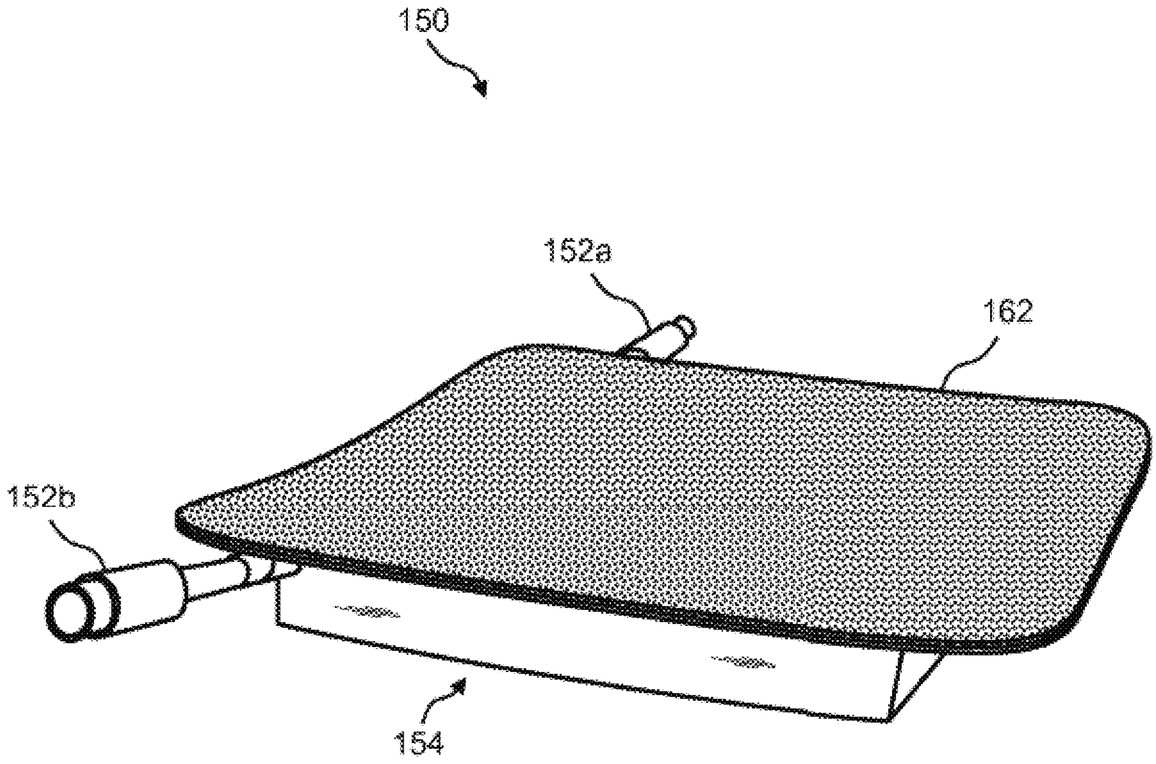
FIG. 12 illustrates a bottom perspective view of the battery of the portable battery pack when assembled.

FIGS. 11-12 are perspective views of the battery 150 of the portable battery pack 100 when fully assembled. FIG. 11 shows a view of the battery cover 154-side of the battery 150, while FIG. 12 shows a view of the back plate 162-side of the battery 150.

Figure 13:
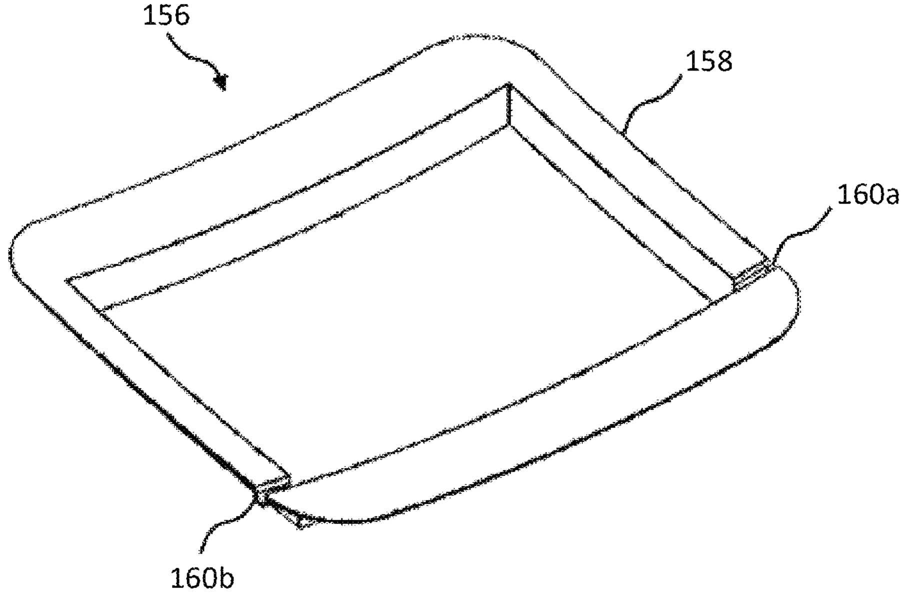
FIG. 13 illustrates a perspective view of the battery cover of the portable battery pack.

FIG. 13 is a perspective view of the side of the battery cover 154 that faces the battery element 164. FIGS. 14A-14D shows various other views of the battery cover 154 of the battery 150 of the portable battery pack 100, including example dimensions of the battery cover 154. FIG. 14A illustrates a top perspective view of the battery cover of the portable battery pack. FIG. 14B illustrates a cross-section view of the battery cover of the portable battery pack. FIG. 14C illustrates another cross-section view of the battery cover of the portable battery pack. FIG. 14D illustrates yet another cross-section view of the battery cover of the portable battery pack.

Figure 15A:
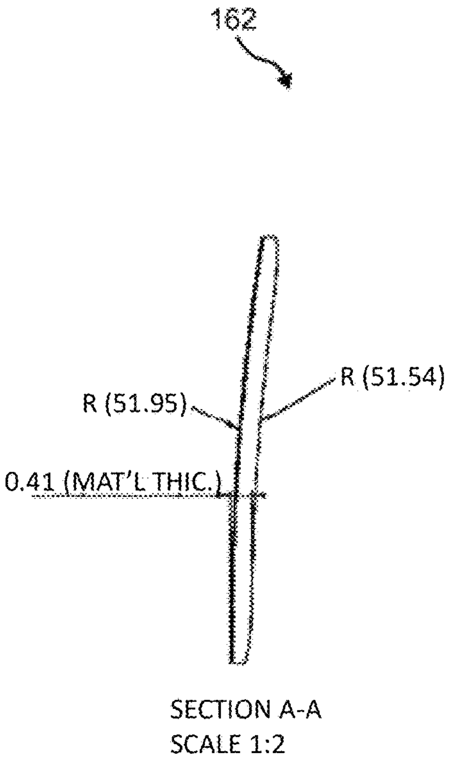
FIG. 15A illustrates a cross-section view of the back plate of the battery of the portable battery pack.
Figure 15B:
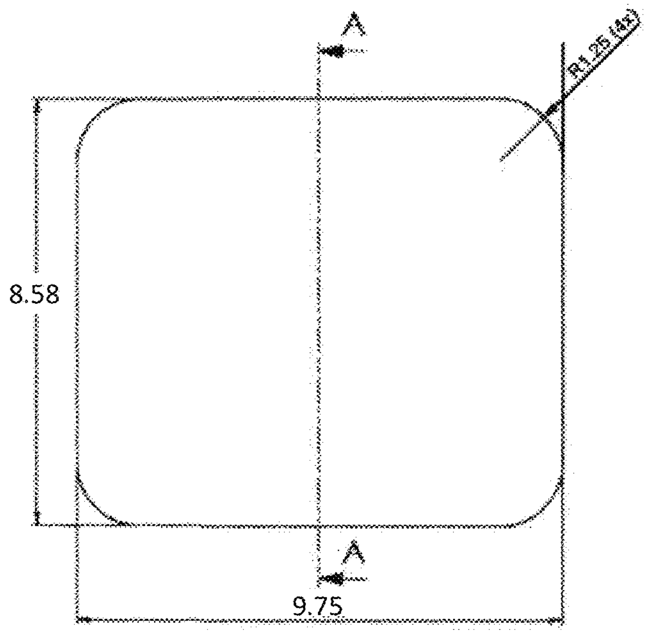
FIG. 15B illustrates a view of the back plate of the battery of the portable battery pack.
Figure 15C:
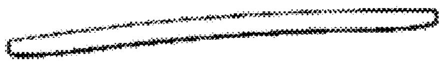
FIG. 15C illustrates another view of the back plate of the battery of the portable battery pack.

FIGS. 15A-15C illustrate various views of the back plate 162 of the battery 150 and show the contour and example dimensions of the back plate 162. FIG. 15A illustrates a cross-section view of the back plate of the battery of the portable battery pack. FIG. 15B illustrates a view of the back plate of the battery of the portable battery pack. FIG. 15C illustrates another view of the back plate of the battery of the portable battery pack. In one example, the back plate 162 is about 9.75 inches long, about 8.6 inches wide, and about 0.4 inches thick.

Figure 16:
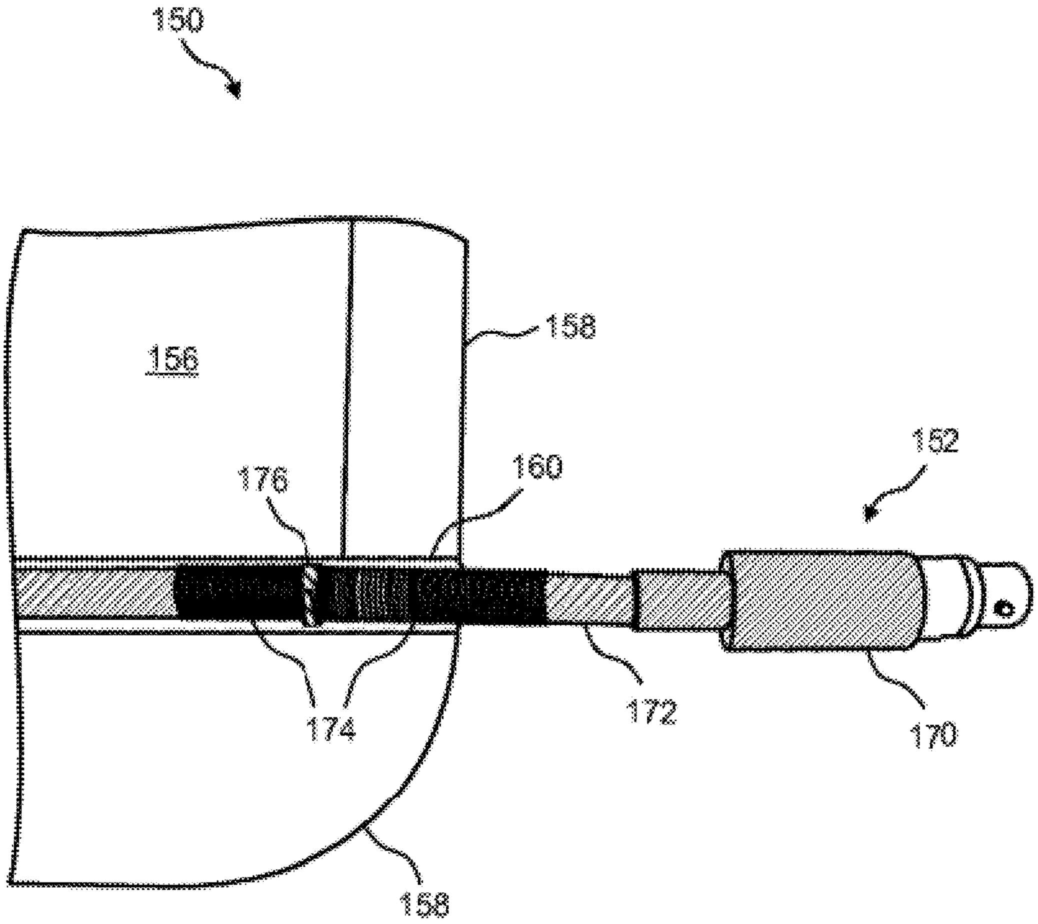
FIG. 16 illustrates a cutaway view of a portion of the battery, which shows more details of the flexible omnidirectional battery leads.

FIG. 16 is a cutaway view of a portion of the battery 150, which shows more details of the flexible omnidirectional battery leads 152. Each lead 152 has a connector portion 170 and a wiring portion 172. The wiring portion 172 is electrically connected to the battery element 164. In one embodiment, the wiring portion 172 is formed of a saltwater resistant cable. The connector portion 170 can be any type or style of connector needed to mate to the equipment to be used with the battery 150 of the portable battery pack 100.

In a preferred embodiment, the connector portion 170 is a female circular type of connector (e.g., TAJIMI™ part number R04-P5f). In an alternative embodiment, at least one connector portion 170 is a male universal serial bus (USB), micro USB, lightning, and/or Firewire connector. In yet another embodiment, the connector portion 170 has an Ingress Protection (IP) rating of IP2X, IP3X, IP4X, IP5X, IP6X, IPX1, IPX2, IPX3, IPX4, IPX5, IPX6, IPX7, or IPX8. More preferably, the connector portion 170 has an IP rating of IPX6, IPX7, or IPX8. IP ratings are described in IEC standard 60529, ed. 2.2 (May 2015), published by the International Electrotechnical Commission, which is incorporated herein by reference in its entirety. In one embodiment, the connector portion meets standards described in Department of Defense documents MIL-STD-202E, MIL-STD-202F published February 1998, MIL-STD-202G published 18 Jul. 2003, and/or MIL-STD-202H published 18 Apr. 2015, each of which is incorporated herein by reference in its entirety.

The wiring portion 172 is fitted into a channel 160 formed in the battery cover 154 such that the connector portion 170 extends away from the battery cover 154. A spring 174 is provided around the wiring portion 172, such that a portion of the spring 174 is inside the battery cover 154 and a portion of the spring 174 is outside the battery cover 154. In one example, the spring 174 is a steel spring that is from about 0.25 inches to about 1.5 inches long. The wiring portion 172 of the lead 152 and the spring 174 are held securely in the channel 160 of the battery cover 154 via a clamping mechanism 176. Alternatively, the wiring portion of the lead and the spring are held securely in the channel of the battery cover using an adhesive, a retention pin, a hex nut, a hook anchor, and/or a zip tie.

The presence of the spring 174 around the wiring portion 172 of the lead 152 allows the lead 152 to be flexed in any direction for convenient connection to equipment from any angle. The presence of the spring 174 around the wiring portion 172 of the lead 152 also allows the lead 152 to be flexed repeatedly without breaking or failing. The design of the leads 152 provides benefit over conventional leads and/or connectors of portable battery packs that are rigid, wherein conventional rigid leads allow connection from one angle only and are prone to breakage if bumped.

In one embodiment, a layer of heat shrink tubing is placed around the wiring portion before the spring is placed around the wiring portion. The heat shrink tubing is preferably flexible. Advantageously, the heat shrink tubing provides additional waterproofing for the battery.

In one embodiment, the battery includes at least one step up voltage converter and/or at least one step down voltage converter. In one example, the battery includes a step up voltage converter from 16.8V to 29.4V. In another example, the battery includes a step down voltage converter from 16.8V to 5V. Advantageously, this allows the portable battery pack to power devices (e.g., smartphones) with a charging voltage of 5V. This also reduces the bulk outside the portable battery pack because the step down voltage converter is housed within the battery element and a separate external voltage converter is not required.

In one embodiment, the wearable pouch includes a material for dissipating heat. Additionally or alternatively, the battery of the wearable battery pack includes at least one layer of a material for dissipating heat. Examples of a material for dissipating heat are disclosed in US Publication Nos. 20170229692 and 20160112004 and U.S. application Ser. No. 15/664,776, each of which is incorporated herein by reference in its entirety.

Figure 17A:
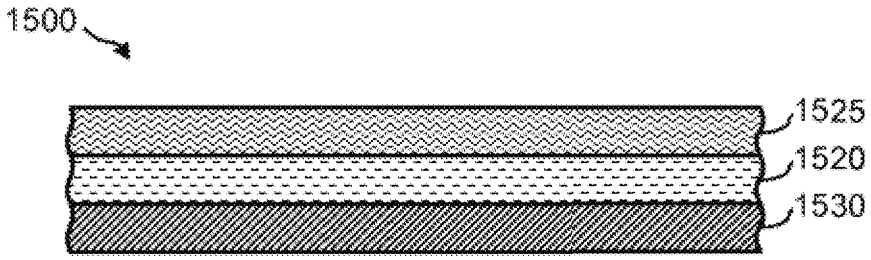
FIG. 17A illustrates a cross-sectional view of one embodiment of a structure that includes a material for dissipating heat.
Figure 17B:
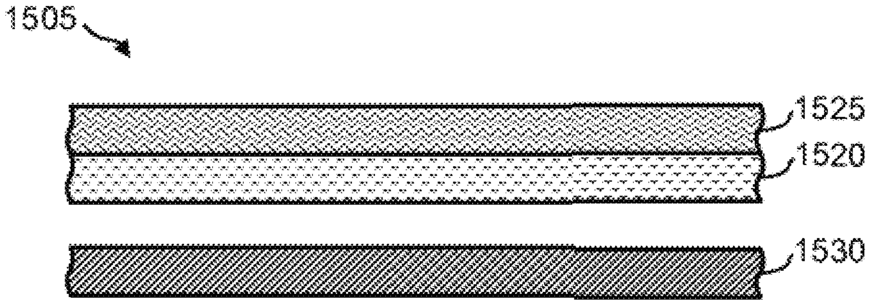
FIG. 17B illustrates a cross-sectional view of one embodiment of another structure that includes a material for dissipating heat.
Figure 17C:
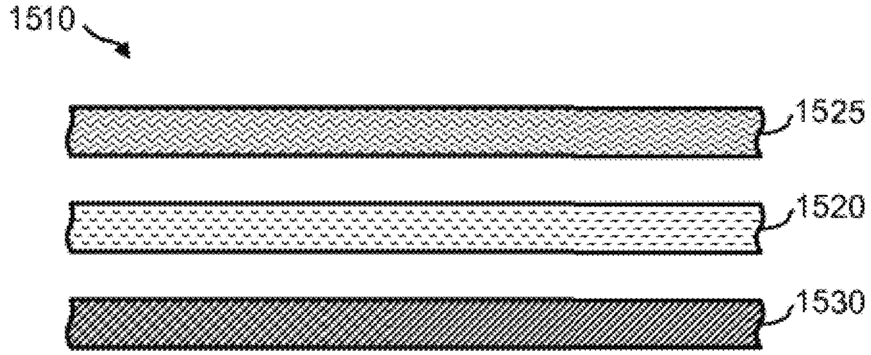
FIG. 17C illustrates a cross-sectional view of one embodiment of yet another structure that includes a material for dissipating heat.

FIGS. 17A-17D are cross-sectional views of examples of structures that include a material for dissipating heat from electronic devices and/or clothing. The heat-dissipating material can be used in combination with, for example, one or two substrates. For example, FIG. 17A shows a structure 1500 that includes a heat-dissipating layer 1520. The heat-dissipating layer 1520 can be sandwiched between a first substrate 1525 and a second substrate 1530.

The heat-dissipating layer 1520 can be any material that is suitable for dissipating heat from electronic devices and/or clothing. The heat-dissipating layer 1520 can be from about 20 μm thick to about 350 μm thick in one example. In particular embodiments, the heat-dissipating layer 1520 can have a thickness ranging from about 1 mil to about 6 mil, including, but not limited to, 1, 2, 3, 4, 5, and 6 mil, or about 25 μm to about 150 μm, including, but not limited to, 25, 50, 75, 100, 125, and 150 μm. Examples of the heat-dissipating layer 1520 include anti-static, anti-radio frequency (RF), and/or anti-electromagnetic interference (EMI) materials, such as copper shielding plastic or copper particles bonded in a polymer matrix, as well as anti-tarnish and anti-corrosion materials. A specific example of the heat-dissipating layer 1520 is the anti-corrosive material used in Corrosion Intercept Pouches, catalog number 034-2024-10, available from University Products Inc. (Holyoke, Mass.). The anti-corrosive material is described in U.S. Pat. No. 4,944,916 to Franey, which is incorporated by reference herein in its entirety. Such materials can be formed of copper shielded or copper impregnated polymers including, but not limited to, polyethylene, low-density polyethylene, high-density polyethylene, polypropylene, and polystyrene. In another embodiment, the heat shielding or blocking and/or heat-dissipating layer is a polymer with aluminum and/or copper particles incorporated therein. In particular, the surface area of the polymer with aluminum and/or copper particles incorporated therein preferably includes a large percent by area of copper and/or aluminum. By way of example and not limitation, the surface area of the heat-dissipating layer includes about 25% by area copper and/or aluminum, 50% by area copper and/or aluminum, 75% by area copper and/or aluminum, or 90% by area copper and/or aluminum. In one embodiment, the heat shielding or blocking and/or heat-dissipating layer is substantially smooth and not bumpy. In another embodiment, the heat shielding or blocking and/or heat-dissipating layer is not flat but includes folds and/or bumps to increase the surface area of the layer. Alternatively, the heat-shielding or blocking and/or heat-dissipating layer 1520 includes a fabric having at least one metal incorporated therein or thereon. The fabric further includes a synthetic component, such as by way of example and not limitation, a nylon, a polyester, or an acetate component. Preferably, the at least one metal is selected from the group consisting of copper, nickel, aluminum, gold, silver, tin, zinc, and tungsten.

The first substrate 1525 and the second substrate 1530 can be any flexible or rigid substrate material. An example of a flexible substrate is any type of fabric. Examples of rigid substrates include, but are not limited to, glass, plastic, and metal. For example and not limitation, a rigid substrate is configured to be the housing of any device. In one example, both the first substrate 1525 and the second substrate 1530 are flexible substrates. In another example, both the first substrate 1525 and the second substrate 1530 are rigid substrates. In yet another example, the first substrate 1525 is a flexible substrate and the second substrate 1530 is a rigid substrate. In still another example, the first substrate 1525 is a rigid substrate and the second substrate 1530 is a flexible substrate. Further, the first substrate 1525 and the second substrate 1530 can be single-layer or multi-layer structures.

Figure 17D:
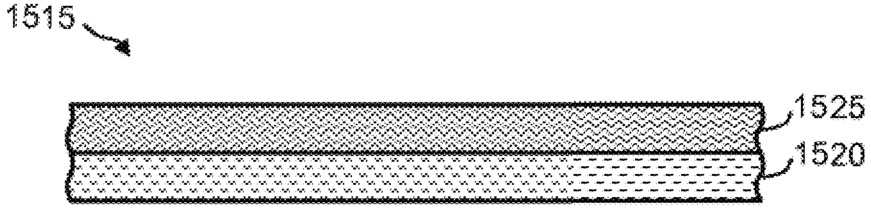
FIG. 17D illustrates a cross-sectional view of one embodiment of yet another structure that includes a material for dissipating heat.

In structure 1500 of FIG. 17A, the heat-shielding or blocking and/or heat-dissipating layer 1520, the first substrate 1525, and the second substrate 1530 are bonded or otherwise attached together, by way of example and not limitation, by adhesive, laminating, stitching, or hook-and-loop fastener system. In another example and referring now to FIG. 17B, in a structure 1505, the first substrate 1525 is bonded to one side of the heat shielding or blocking and/or heat-dissipating layer 1520, whereas the second substrate 1530 is not bonded or otherwise attached to the other side of the heat shielding or blocking and/or heat-dissipating layer 1520. In yet another example and referring now to FIG. 17C, in a structure 1510, the first substrate 1525 is provided loosely against one side of the heat shielding or blocking and/or heat-dissipating layer 1520 and the second substrate 1530 is provided loosely against the other side of the heat-dissipating layer 1520. The first substrate 1525 and the second substrate 1530 are not bonded or otherwise attached to the heat shielding or blocking and/or heat-dissipating layer 1520. In still another example and referring now to FIG. 17D, in a structure 1515, the heat shielding or blocking and/or heat-dissipating layer 1520 is provided in combination with the first substrate 1525 only, either bonded or loosely arranged. In FIG. 17D, if the two layers are loosely arranged, the heat-dissipating layer 1520 is not bonded or otherwise attached to the first substrate 1525. The material for dissipating heat is not limited to the structures 1500, 1505, 1510, 1515. These structures are exemplary only.

In one embodiment, the pouch includes at least one layer of a material to dissipate heat on the first side and/or the second side. In one embodiment, the first substrate is an interior layer of the pouch and the second substrate is an exterior layer of the pouch. In an alternative embodiment, a structure (e.g., the structure 1515 of FIG. 17D) is formed separately and then inserted into the pouch. Advantageously, this provides for retrofitting the pouch with heat protection from the heat-shielding or blocking and/or heat-dissipating material layer or coating.

Figure 18:
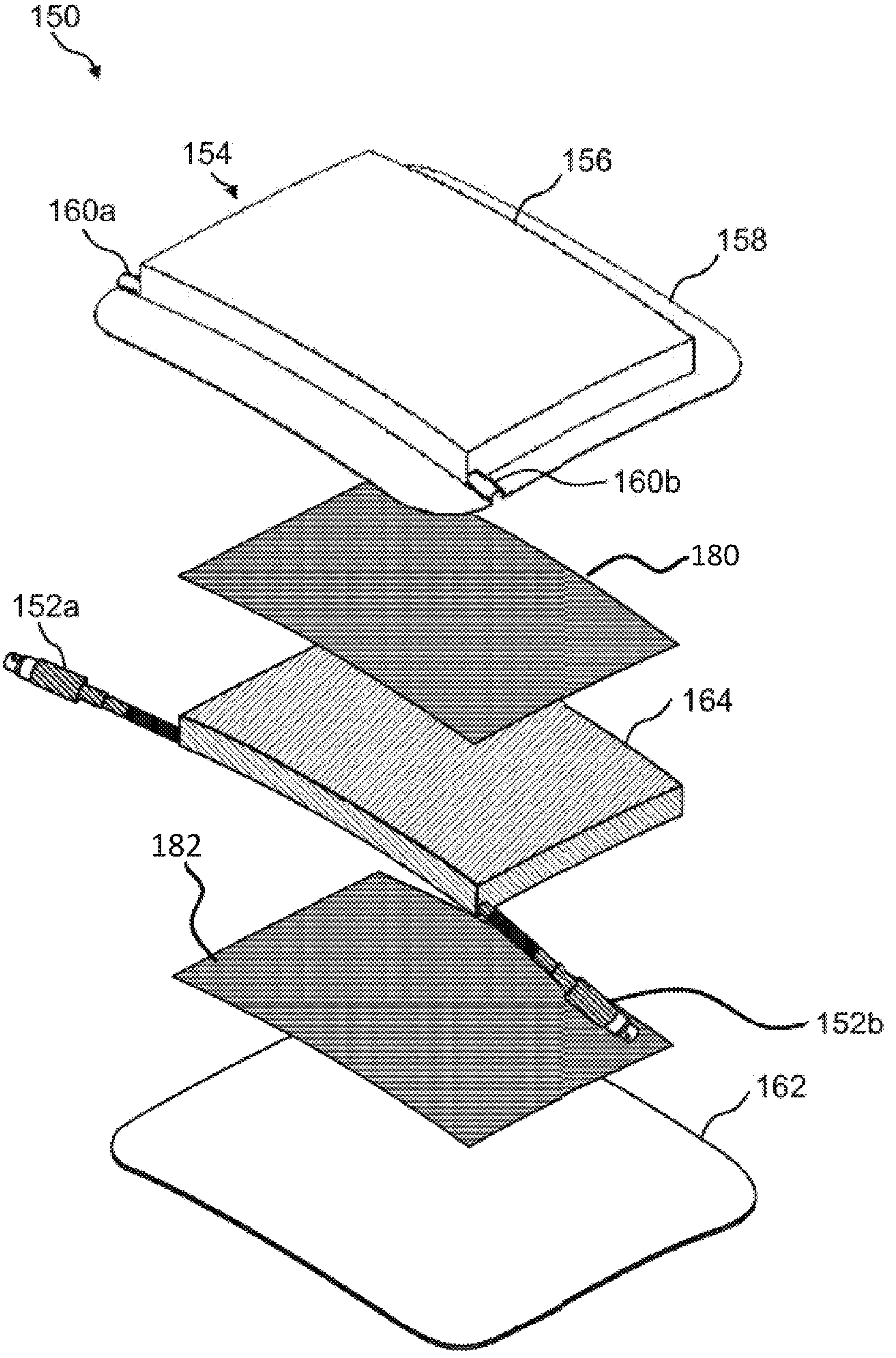
FIG. 18 illustrates an exploded view of an example of a battery of a portable battery pack into which a heat dissipating material is installed.

In a preferred embodiment, the battery includes at least one layer of a material to dissipate heat. FIG. 18 illustrates an exploded view of an example of a battery 150 of the portable battery pack 100 into which the heat dissipating material is installed. The battery 150 includes a battery element 164 that is housed between a battery cover 154 and a back plate 162. A first heat-dissipating layer 180 is between the battery cover 154 and the battery element 164. The first heat-dissipating layer 180 protects the battery from external heat sources (e.g., a hot vehicle). A second heat-dissipating layer 182 is between the battery element 164 and the back plate 162. The second heat-dissipating layer 182 protects the user from heat given off by the battery element 164. In another embodiment, the battery 150 includes only the first heat-dissipating layer 180. In yet another embodiment, the battery 150 includes only the second heat-dissipating layer 182.

In another embodiment, the pouch includes at least one layer of a material to provide resistance to bullets and/or shrapnel. In one embodiment, the at least one layer of a material to provide resistance to bullets and/or shrapnel is formed from an aramid (e.g., KEVLAR®, TWARON®), an ultra-high-molecular-weight polyethylene fiber (UHMWPE) (e.g., SPECTRA®, DYNEEMA®), a polycarbonate (e.g., LEXAN®), a carbon fiber composite material, ceramic, steel, and/or titanium. In one embodiment, the pouch is sized to fit the battery and the at least one layer of a material to provide resistance to bullets and/or shrapnel. In another embodiment, the at least one layer of a material to provide resistance to bullets and/or shrapnel is incorporated into the pouch itself. In yet another embodiment, the at least one layer of a material to provide resistance to bullets and/or shrapnel is housed in a built-in pocket inside of the pouch or permanently affixed (e.g., laminated, stitched, adhered) to the pouch.

In a preferred embodiment, the at least one layer of a material to provide resistance to bullets and/or shrapnel is on the first side (i.e., the exterior facing side) of the pouch. Advantageously, this layer protects the battery as well as the user. In one embodiment, the at least one layer of a material to provide resistance to bullets and/or shrapnel has a slight curvature or contour for conforming to the battery cover. Additionally or alternatively, the at least one layer of a material to provide resistance to bullets and/or shrapnel is on the second side (i.e., the user facing side) of the pouch. In one embodiment, the at least one layer of a material to provide resistance to bullets and/or shrapnel has a slight curvature or contour for conforming to the back plate. Advantageously, this layer provides additional protection to the user.

In another embodiment, the battery includes a material to provide resistance to bullets and/or shrapnel. In one embodiment, the material to provide resistance to bullets and/or shrapnel is incorporated into the battery cover and/or back plate. In an alternative embodiment, the material to provide resistance to bullets and/or shrapnel is between the battery cover and the battery element. Advantageously, this layer protects the plurality of battery cells housed in the battery as well as the user. Additionally or alternatively, the material to provide resistance to bullets and/or shrapnel is between the battery element and the back plate. Advantageously, this layer provides additional protection to the user.

As previously described, the pouch is preferably formed of a flexible, durable, and waterproof and/or water-resistant material. In one embodiment, seams of the pouch are sewn with an anti-wick or non-wicking thread. In one example, the anti-wick or non-wicking polyester thread is a bonded polyester thread with wax coating (e.g., DABOND®). The wax coating on the thread plugs stitch holes to waterproof seams. Alternatively, seams are joined together using ultrasonic welding.

In one embodiment, the pouch includes drainage holes to remove water from the pouch. The drainage holes are formed of a mesh fabric. Alternatively, the drainage holes are formed using holes with grommets in the waterproof and/or water-resistant material.

In another embodiment, the pouch incudes at least one desiccant to remove moisture from the pouch. In one embodiment, the at least one desiccant includes silica. Alternatively, the at least one desiccant includes activated charcoal, calcium sulfate, calcium chloride, and/or molecular sieves (e.g., zeolites).

The portable battery pack includes leads having a connector portion. As previously described, the connector portion can be any type or style of connector needed to mate to equipment to be used with the battery of the portable battery pack. In one embodiment, a cord connector is used to protect a mated connection between the connector portion and the equipment. Examples of a cord connector include U.S. Pat. Nos. 5,336,106, 5,505,634, and 5,772,462, each of which is incorporated herein by reference in its entirety. Alternatively, a piece of heat shrink tubing is positioned to cover a mated connection between the connector portion and the equipment. In a preferred embodiment, the heat shrink tubing is sized to cover at least 0.25 inch of cabling on either side of the mated connection. Heat is then applied using a heat gun or hair dryer to shrink the tubing and seal the mated connection.

In one embodiment, the portable battery pack includes at least one processor. The at least one processor is preferably housed in the battery. In another embodiment, the at least one processor is incorporated into control electronics used to determine the state of charge (SOC) of the portable battery pack. Examples of state of charge indicators are disclosed in US Publication Nos. 20170269162 and 20150198670, each of which is incorporated herein by reference in its entirety.

Figure 19:
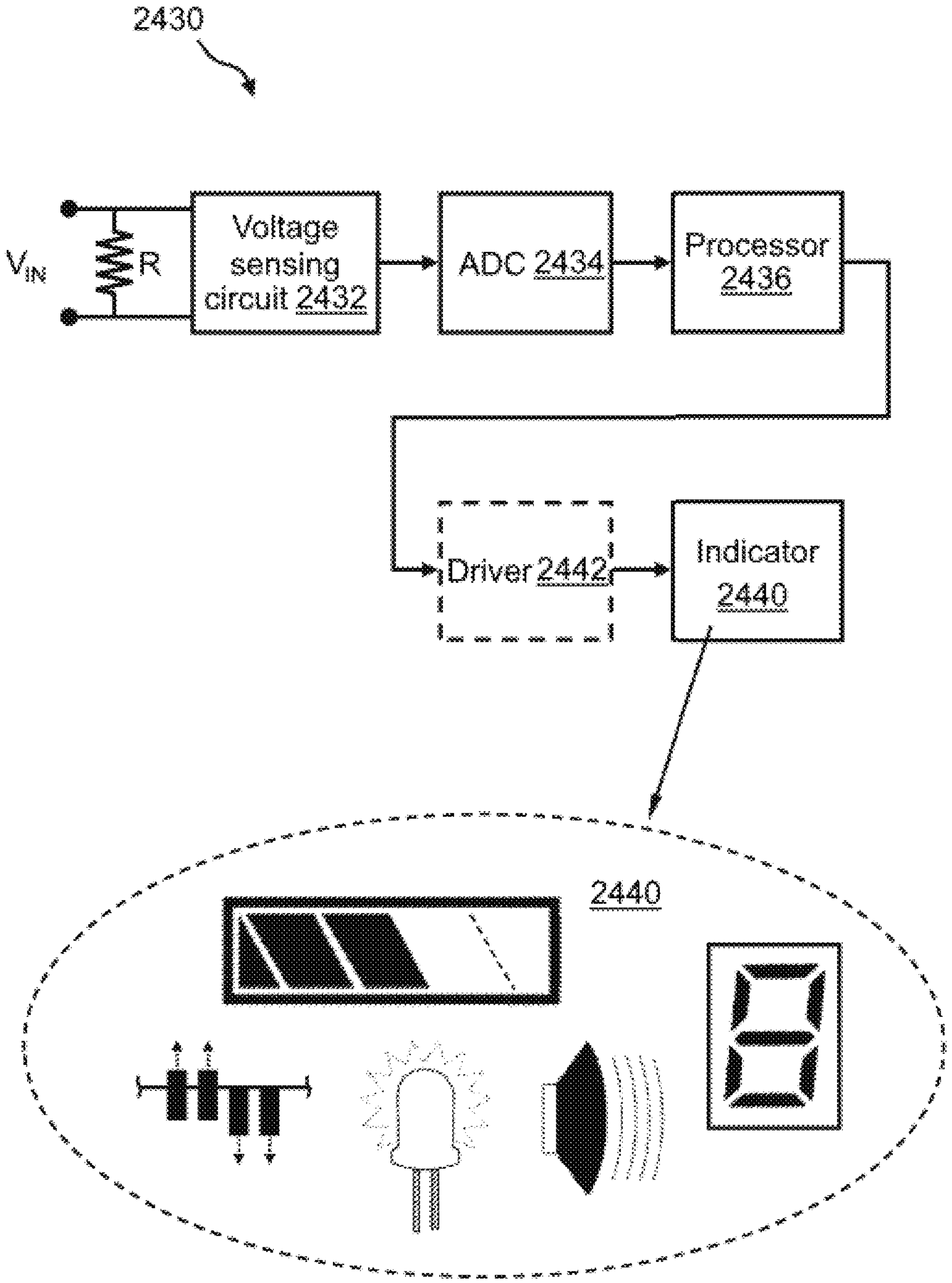
FIG. 19 illustrates a block diagram of one embodiment of the control electronics for a state of charge indicator incorporated into the portable battery pack.

FIG. 19 illustrates a block diagram of one embodiment of the control electronics for a state of charge indicator incorporated into the portable battery pack. In this example, the control electronics 2430 includes a voltage sensing circuit 2432, an analog-to-digital converter (ADC) 2434, a processor 2436, the indicator 2440, and optionally a driver 2442.

The voltage sensing circuit 2432 can be any standard voltage sensing circuit, such as those found in volt meters. An input voltage VIN is supplied via the power BUS. In one embodiment, the voltage sensing circuit 2432 is designed to sense any direct current (DC) voltage in the range of from about 0 volts DC to about 50 volts DC. In one embodiment, the voltage sensing circuit 2432 includes standard amplification or de-amplification functions for generating an analog voltage that correlates to the amplitude of the input voltage VIN that is present. The ADC 2434 receives the analog voltage from the voltage sensing circuit 2432 and performs a standard analog-to-digital conversion.

The processor 2436 manages the overall operations of the SOC indicator. The processor 2436 is any controller, microcontroller, or microprocessor that is capable of processing program instructions.

The indicator 2440 is any visual, audible, or tactile mechanism for indicating the state of charge of the portable battery pack. A preferred embodiment of a visual indicator is at least one 5-bar liquid crystal display (LCD), wherein five bars flashing or five bars indicates greatest charge and one bar or one bar flashing indicates least charge. Another example of a visual indicator is at least one seven-segment numeric LCD, wherein the number 5 flashing or the number 5 indicates greatest charge and the number 1 or the number 1 flashing indicates least charge. Alternatively, the at least one LCD displays the voltage of the portable battery pack as measured by the control electronics.

The at least one LCD is preferably covered with a transparent material. In a preferred embodiment, the cover is formed of a clear plastic (e.g., poly(methyl methacrylate)). This provides an extra layer of protection for the at least one LCD, much like a screen protector provides an extra layer of protection for a smartphone. This increases the durability of the at least one LCD. In one embodiment, the at least one LCD is on the housing of the battery. In a preferred embodiment, the housing of the battery includes a waterproof sealant (e.g., silicone) around the cover.

Alternatively, a visual indicator is at least one LED. One preferred embodiment of a visual indicator is a set of light-emitting diodes (LEDs) (e.g., 5 LEDs), wherein five lit LEDs flashing or five lit LEDs indicates greatest charge and one lit LED or one lit LED flashing indicates least charge. In one embodiment, the LEDs are red, yellow, and/or green. In one example, two of the LEDs are green to indicate a mostly full charge on the portable battery pack, two of the LEDs are yellow to indicate that charging will soon be required for the portable battery pack, and one LED is red to indicate that the portable battery pack is almost drained. In a preferred embodiment, at least three bars, lights, or numbers are used to indicate the state of charge.

In one embodiment, the at least one LED is preferably covered with a transparent material. In a preferred embodiment, the cover is formed of a clear plastic (e.g., poly(methyl methacrylate)). This provides an extra layer of protection for the at least one LED. This increases the durability of the at least one LED. In one embodiment, the at least one LCD is on the housing of the battery. In a preferred embodiment, the housing of the battery includes a waterproof sealant (e.g., silicone) around the cover.

One example of an audible indicator is any sounds via an audio speaker, such as beeping sounds, wherein five beeps indicates greatest charge and one beep indicates least charge. Another example of an audible indicator is vibration sounds via any vibration mechanism (e.g., vibration motor used in mobile phones), wherein five vibration sounds indicates greatest charge and one vibration sound indicates least charge.

One example of a tactile indicator is any vibration mechanism (e.g., vibration motor used in mobile phones), wherein five vibrations indicate greatest charge and one vibration indicate least charge. Another example of a tactile indicator is a set of pins that rise up and down to be felt in Braille-like fashion, wherein five raised pins indicates greatest charge and one raised pin indicates least charge.

In one example, the processor 2436 is able to drive indicator 2440 directly. In one embodiment, the processor 2436 is able to drive directly a 5-bar LCD or a seven-segment numeric LCD. In another example, however, the processor 2436 is not able to drive indicator 2440 directly. In this case, the driver 2442 is provided, wherein the driver 2442 is specific to the type of indicator 2440 used in the control electronics 2430.

Additionally, the processor 2436 includes internal programmable functions for programming the expected range of the input voltage VIN and the correlation of the value the input voltage VIN to what is indicated at the indicator 2440. In other words, the discharge curve of the portable battery pack can be correlated to what is indicated at indicator 2440. In one embodiment, the processor 2436 is programmed based on a percent discharged or on an absolute value present at the input voltage VIN.

In one embodiment, the control electronics includes at least one antenna, which allows the portable battery pack to send information (e.g., state of charge information) to at least one remote device (e.g., smartphone, tablet, laptop computer, satellite phone) and/or receive information (e.g., software updates, activation of kill switch) from at least one remote device. The at least one antenna provides wireless communication, standards-based or non-standards-based, by way of example and not limitation, radiofrequency, BLUETOOTH®, ZIGBEE®, Near Field Communication, or similar commercially used standards.

Figure 20A:
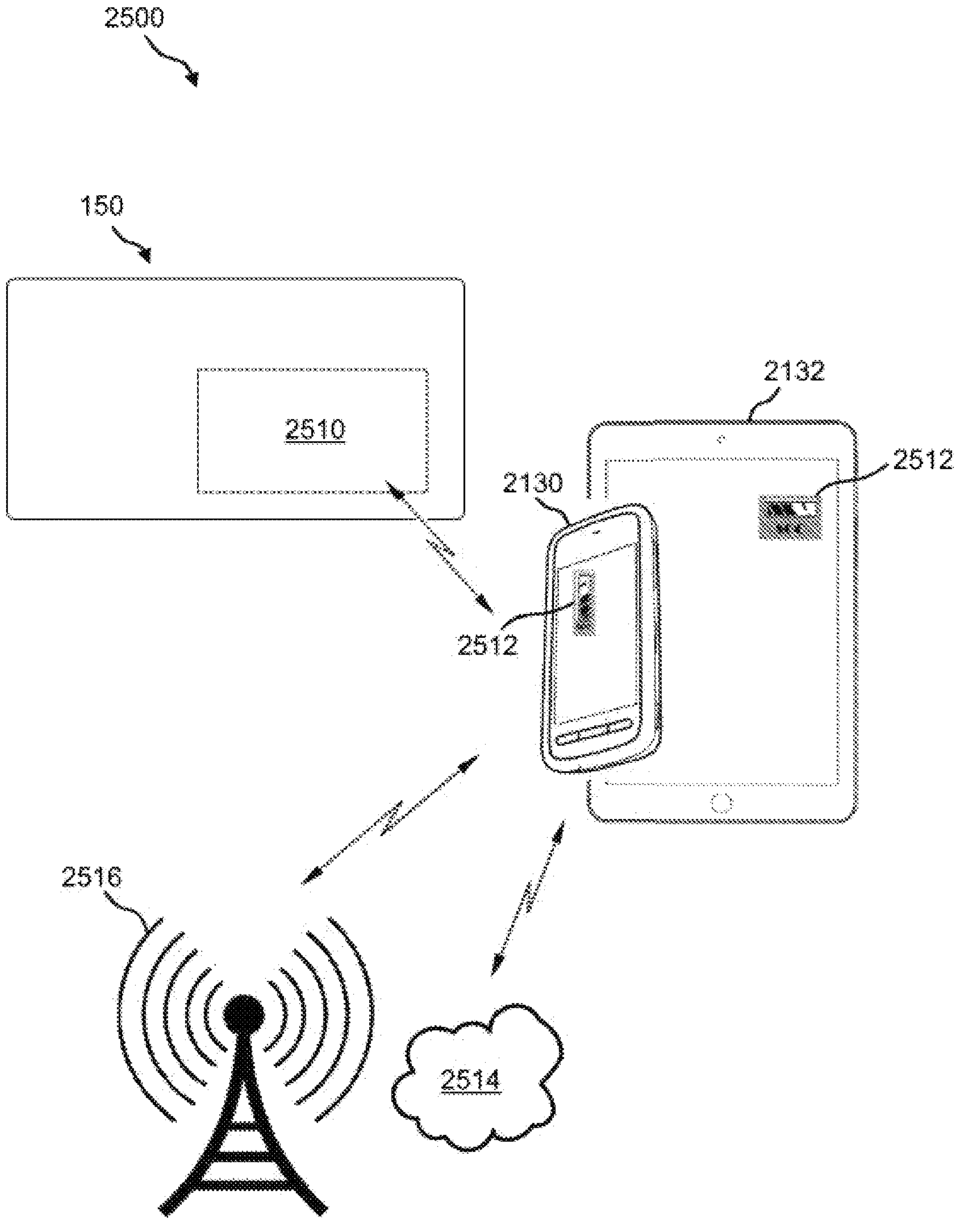
FIG. 20A illustrates a block diagram of an example of an SOC system that includes a mobile application for use with a portable battery pack.

FIG. 20A illustrates a block diagram of an example of an SOC system 2500 that includes a mobile application for use with a portable battery pack. The SOC system 2500 includes a battery 150 having a communications interface 2510.

The communications interface 2510 is any wired and/or wireless communication interface for connecting to a network and by which information is exchanged with other devices connected to the network. Examples of wired communication interfaces include, but are not limited to, USB ports, RS232 connectors, RJ45 connectors, Ethernet, and any combinations thereof. Examples of wireless communication interfaces include, but are not limited to, an Intranet connection, Internet, ISM, BLUETOOTH® technology, WI- FI®, WIMAX®, IEEE 802.11 technology, radio frequency (RF), Near Field Communication (NFC), ZIGBEE®, Infrared Data Association (IrDA) compatible protocols, Local Area Networks (LAN), Wide Area Networks (WAN), Shared Wireless Access Protocol (SWAP), any combinations thereof, and other types of wireless networking protocols.

The communications interface 2510 is used to communicate, preferably wirelessly, with at least one remote device, such as but not limited to, a mobile phone 2130 or a tablet 2132. The mobile phone 2130 can be any mobile phone that (1) is capable of running mobile applications and (2) is capable of communicating with the portable battery pack. The mobile phone 2130 can be, for example, an ANDROID™ phone, an APPLE® IPHONE®, or a SAMSUNG® GALAXY® phone. Likewise, the tablet 2132 can be any tablet that (1) is capable of running mobile applications and (2) is capable of communicating with the portable battery pack. The tablet 2132 can be, for example, the 3G or 4G version of the APPLE® IPAD®.

Further, in the SOC system 2500, the mobile phone 2130 and/or the tablet 2132 is in communication with a cellular network 2516 and/or a network 2514. The network 2514 can be any network for providing wired or wireless connection to the Internet, such as a local area network (LAN) or a wide area network (WAN).

An SOC mobile application 2512 is installed and running at the mobile phone 2130 and/or the tablet 2132. The SOC mobile application 2512 is implemented according to the type (i.e., the operating system) of mobile phone 2130 and/or tablet 2132 on which it is running. The SOC mobile application 2512 is designed to receive SOC information from the portable battery pack. The SOC mobile application 2512 indicates graphically, audibly, and/or tactilely, the state of charge to the user (not shown).

Figure 20B:
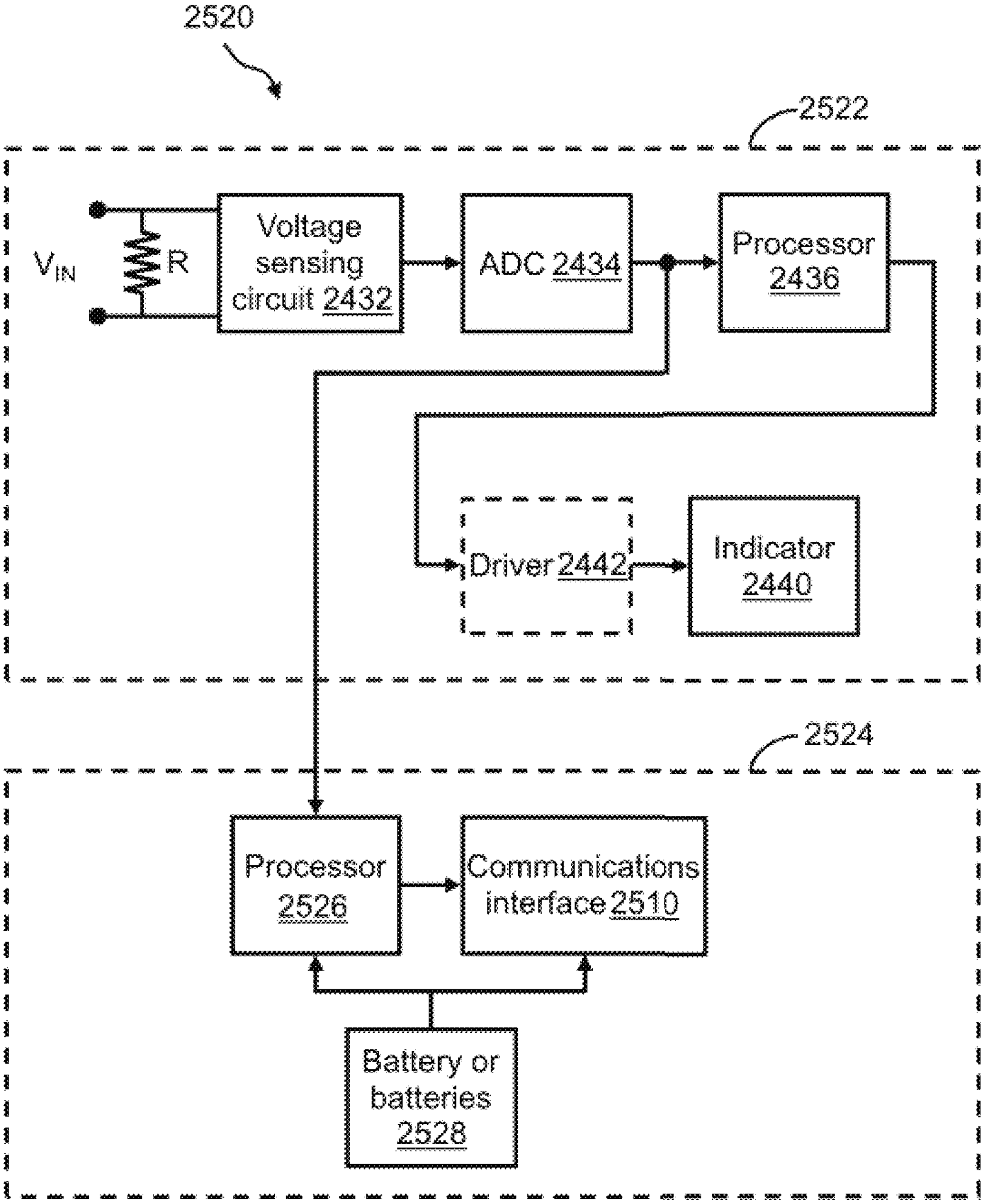
FIG. 20B illustrates a block diagram of an example of control electronics of the portable battery pack that is capable of communicating with the SOC mobile application.

FIG. 20B illustrates a block diagram of an example of an SOC system 2520 of the portable battery pack that is capable of communicating with the SOC mobile application 2512. In this example, the SOC system 2520 includes an SOC portion 2522 and a communications portion 2524. The SOC portion 2522 is substantially the same as the control electronics 2430 shown in FIG. 19. The communications portion 2524 handles the communication of the SOC information to the SOC mobile application 2512 at, for example, the mobile phone 2130 and/or the tablet 2132.

The communications portion 2524 includes a processor 2526 that is communicatively connected to the communications interface 2510. The digital output of the ADC 2434 of the SOC portion 2522, which is the SOC information, feeds an input to the processor 2526. The processor 2526 can be any controller, microcontroller, or microprocessor that is capable of processing program instructions. One or more batteries 2528 provide power to the processor 2526 and the communications interface 2510. The one or more batteries 2528 can be any standard cylindrical battery, such as quadruple-A, triple-A, or double-A, or a battery from the family of button cell and coin cell batteries. A specific example of a battery 2528 is the CR2032 coin cell 3-volt battery.

In SOC system 2520, the SOC portion 2522 and the communications portion 2524 operate substantially independent of one another. Namely, the communications portion 2524 is powered separately from the SOC portion 2522 so that the communications portion 2524 is not dependent on the presence of the input voltage VIN at the SOC portion 2522 for power. Therefore, in this example, the communications portion 2524 is operable to transmit information to the SOC mobile application 2512 at any time. However, in order to conserve battery life, in one embodiment the processor 2526 is programmed to be in sleep mode when no voltage is detected at the input voltage VIN at the SOC portion 2522 and to wake up when an input voltage VIN is detected. Alternatively, the processor 2526 is programmed to periodically measure the SOC and send SOC information to the SOC mobile application 2512 on the at least one remote device periodically, such as every hour, regardless of the state of input voltage VIN.

Figure 20C:
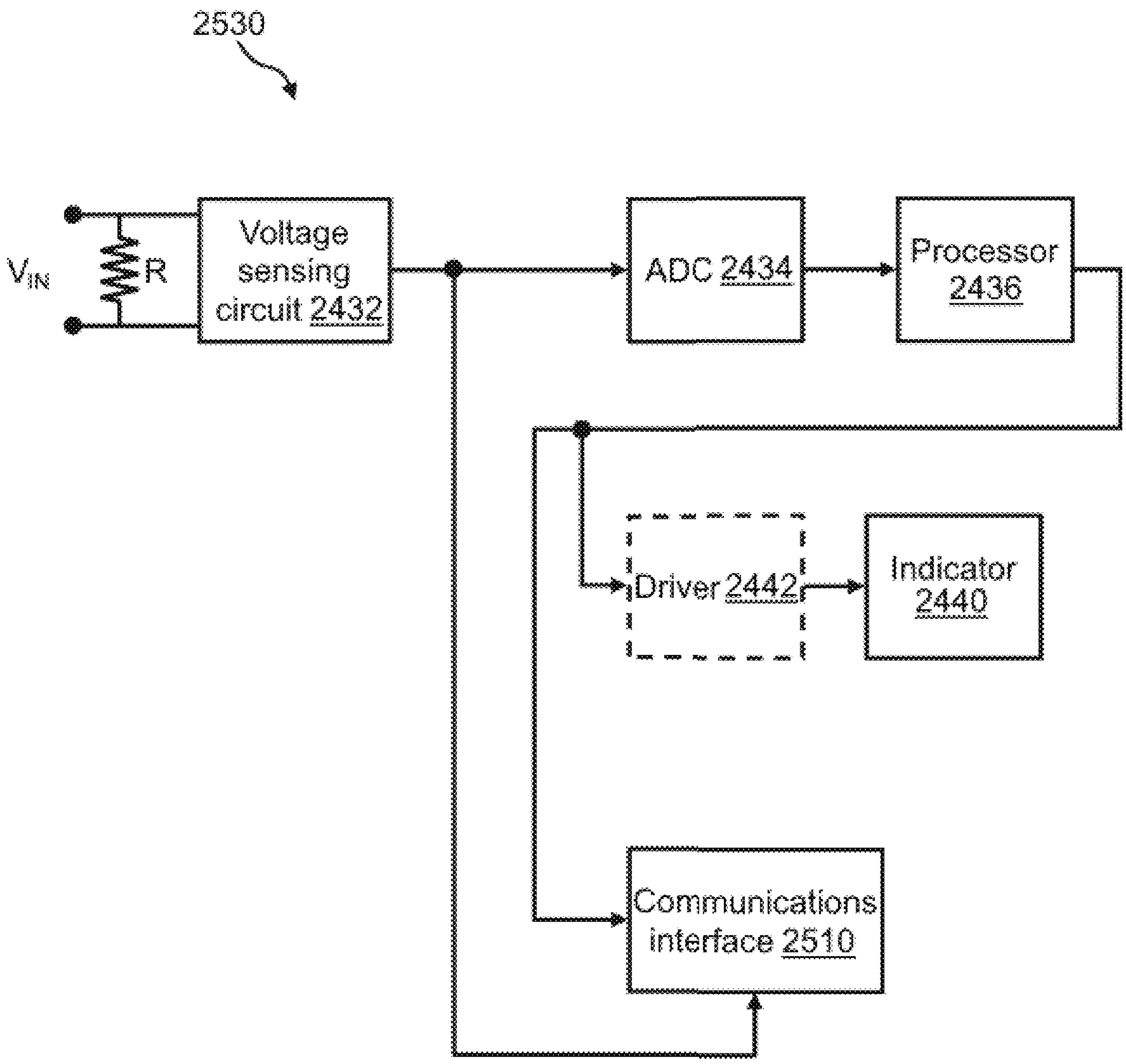
FIG. 20C illustrates a block diagram of another example of control electronics of the portable battery pack that is capable of communicating with the SOC mobile application.

FIG. 20C illustrates a block diagram of another example of control electronics 2530 of the portable battery pack that is capable of communicating with the SOC mobile application 2512. In this example, the operation of the communications interface 2510 is dependent on the presence of a voltage at input voltage VIN. This is because, in control electronics 2530, the communications interface 2510 is powered from the output of voltage sensing circuit 2432. Further, the processor 2436 provides the input (i.e., the SOC information) to the communications interface 2510. A drawback of the control electronics 2530 of FIG. 20C as compared with the SOC system 2520 of FIG. 20B, is that it is operable to transmit SOC information to the SOC mobile application 2512 only when the portable battery pack has a charge.

Alternatively, the SOC of the battery of the portable battery pack is determined by a pluggable state of charge indicator. An example of a pluggable state of charge indicator is disclosed in US Publication Nos. 20170269162 and 20150198670, each of which is incorporated herein by reference in its entirety. Advantageously, intermittently measuring the SOC of the battery extends the run time of the battery.

Figure 21:
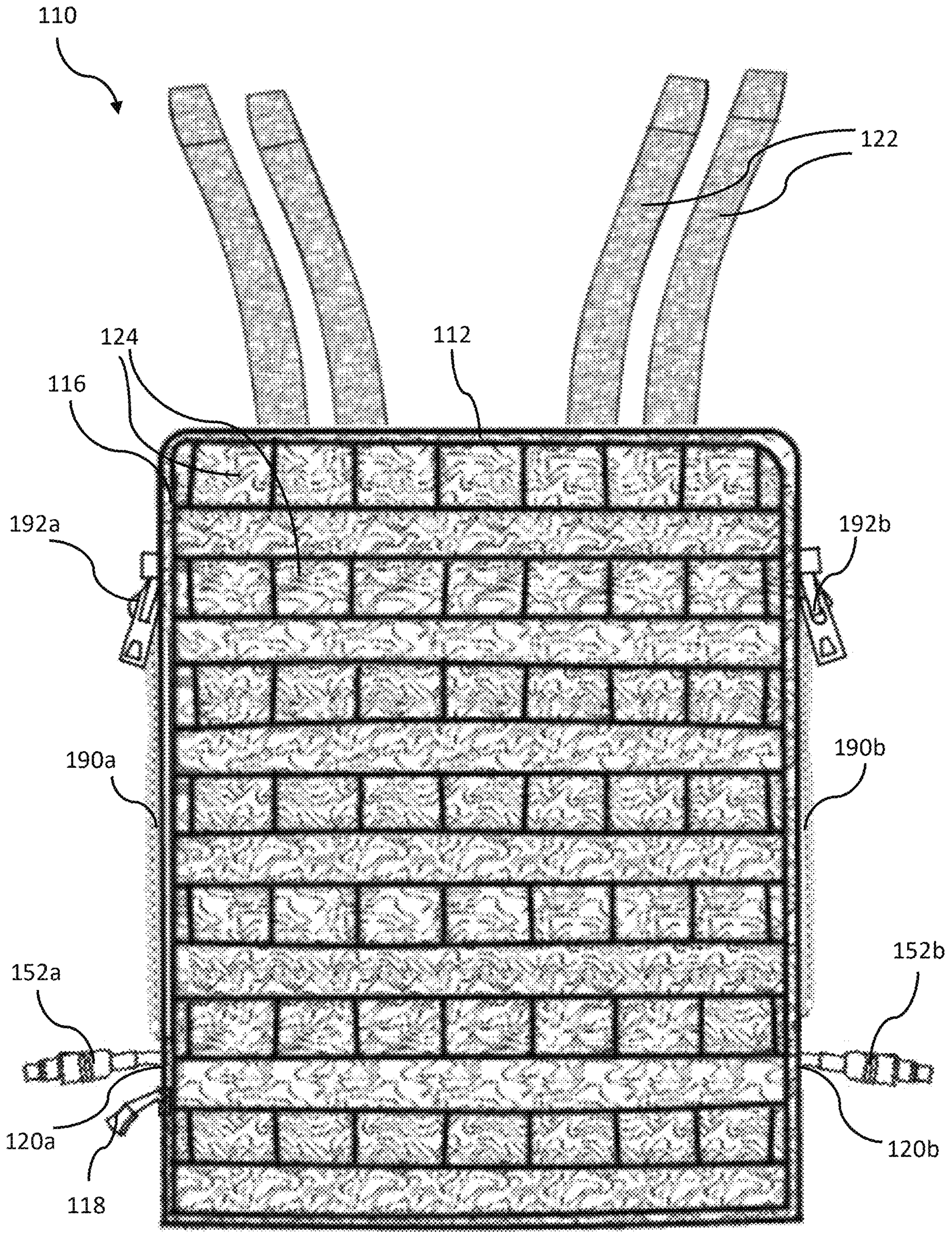
FIG. 21 illustrates a front perspective view of an example of the portable battery pack that comprises a battery enclosed by a wearable pouch or skin sized to hold the battery and additional devices or components.
Figure 22:
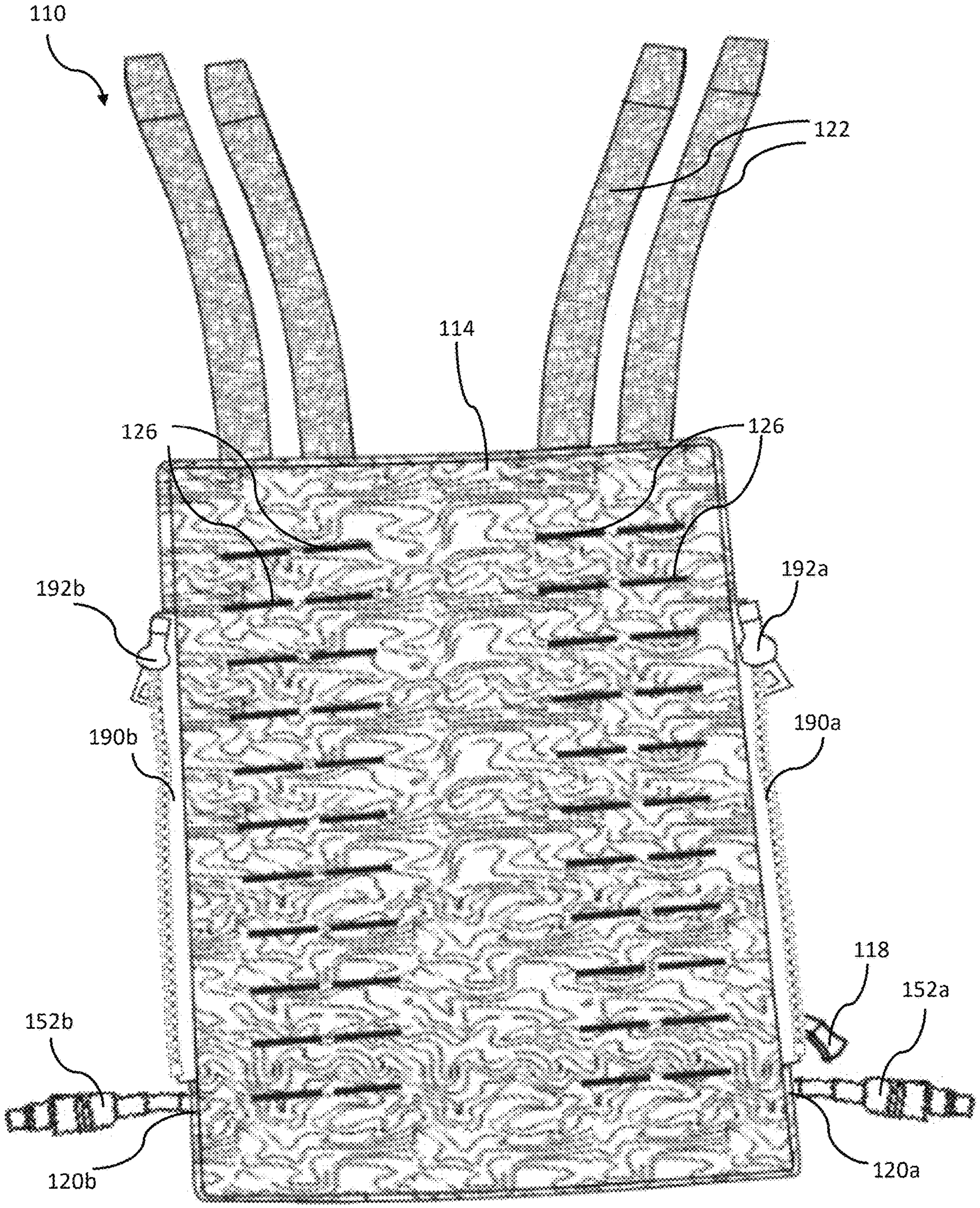
FIG. 22 illustrates a rear perspective view of an example of the portable battery pack that comprises a battery enclosed by a wearable pouch or skin sized to hold the battery and additional devices or components.

In another preferred embodiment, the portable battery pack includes a battery enclosed by a wearable pouch or skin sized to hold the battery and additional devices or components as shown in FIGS. 21-22. In this example, the pouch 110 is a wearable pouch or skin that can be sized in any manner that substantially corresponds to a size of at least one battery, at least one radio, at least one power and/or data hub, at least one GPS system, and/or other gear.

In a preferred embodiment, the pouch 110 is formed of a flexible, durable, and waterproof or at least water-resistant material. For example, the pouch 110 is formed of polyester, polyvinyl chloride (PVC)-coated polyester, vinyl-coated polyester, nylon, canvas, PVC-coated canvas, or polycotton canvas. In one embodiment, the pouch 110 is formed of a material that is laminated to or treated with a waterproofing or water repellant material (e.g., rubber, PVC, polyurethane, silicone elastomer, fluoropolymers, wax, thermoplastic elastomer). Additionally or alternatively, the pouch 110 is treated with a UV coating to increase UV resistance. The exterior finish of the pouch 110 can be any color, such as white, brown, green, orange (e.g., international orange), yellow, black, or blue, or any pattern, such as camouflage, as provided herein, or any other camouflage in use by the military, law enforcement, or hunters. For example, in FIGS. 21-22, the pouch 110 is shown to have a camouflage pattern. In one embodiment, the exterior of the pouch 110 includes a reflective tape, fabric, or material. Advantageously, the reflective tape, fabric, or material improves visibility of the user in low-light conditions.

The pouch 110 has a first side 112 and a second side 114. The pouch 110 also includes a pouch opening 116, which is the opening through which a battery is fitted into the pouch 110. In the example shown in FIGS. 21-22, the pouch opening 116 is opened and closed using a zipper, as the pouch 110 includes a zipper tab 118. Other mechanisms, however, can be used for holding the pouch opening 116 of the pouch 110 open or closed, such as, a hook and loop system (e.g., VELCRO®), buttons, snaps, hooks, ties, clips, buckles, and the like. In a preferred embodiment, the pouch 110 has at least one opening for a corresponding lead. In the example shown in FIGS. 21-22, the pouch 110 has a first lead opening 120*a* for a first lead 152*a* and a second lead opening 120*b* for a second lead 152*b*. For example, the first lead opening 120*a* and/or the second lead opening 120*b* can be a 0.5-inch long slit or a 0.75-inch long slit in the edge of the pouch 110. In one embodiment, the first lead opening 120*a* and/or the second lead opening 120*b* is finished or reinforced with stitching. In another embodiment, the first lead opening 120*a* and/or the second lead opening 120*b* is laser cut.

In a preferred embodiment, the pouch 110 of the portable battery pack 100 is MOLLE-compatible. In one embodiment, the pouch 110 incorporates a pouch attachment ladder system (PALS), which is a grid of webbing used to attach smaller equipment onto load-bearing platforms, such as vests and backpacks. For example, the PALS grid consists of horizontal rows of 1-inch (2.5 cm) webbing, spaced about one inch apart, and reattached to the backing at 1.5-inch (3.8 cm) intervals. In one embodiment, the webbing is formed of nylon (e.g., CORDURA® nylon webbing, MIL-W-43668 Type III nylon webbing). Accordingly, a set of straps 122 (e.g., four straps 122) are provided on one edge of the pouch 110 as shown. Further, rows of webbing 124 (e.g., seven rows 124) are provided on the first side 112 of the pouch 110, as shown in FIG. 21. Additionally, rows of slots or slits 126 (e.g., eleven rows of slots or slits 126) are provided on the second side 114 of the pouch 110, as shown in FIG. 22. In a preferred embodiment, the set of straps 122, the rows of webbing 124, and the rows of slots or slits 126 replicate and duplicate the MOLLE underneath the portable battery pack on the load bearing equipment. Advantageously, this allows for minimal disruption to the user because the user can place additional gear pouches or gear (e.g., water bottle, antenna pouch) on the MOLLE of the portable battery pack in an equivalent location.

In the embodiment shown in FIGS. 21-22, the portable battery pack is made to affix to a plate carrier, body armor, or a vest with at least one single width of zipper tape sewn on the front panel or the back panel (e.g., JPC 2.0™ by Crye Precision). FIGS. 21-22 show details of the first side 112 of the pouch 110 including a first single width of zipper tape 190*a* and a first zipper slider 192*a* and a second single width of zipper tape 190*b* and a second zipper slider 192*b*. The first single width of zipper tape 190*a* mates with a corresponding single width of zipper tape on the plate carrier, the body armor, or the vest. The second single width of zipper tape 190*b* also mates with a corresponding single width of zipper tape on the plate carrier, the body armor, or the vest.

Figure 23:
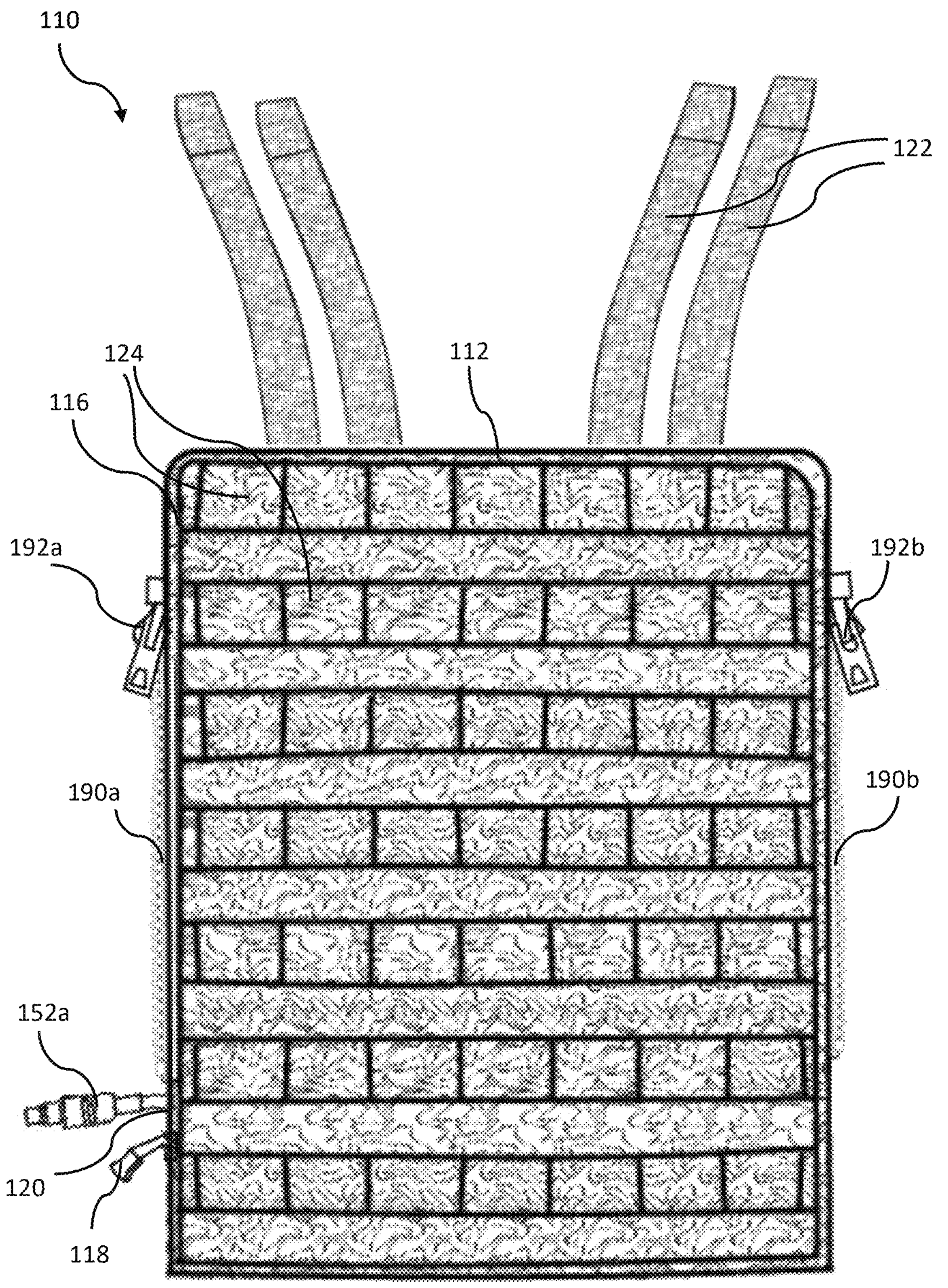
FIG. 23 illustrates a front perspective view of another example of the portable battery pack that comprises a battery enclosed by a wearable pouch or skin sized to hold the battery and additional devices or components.
Figure 24:
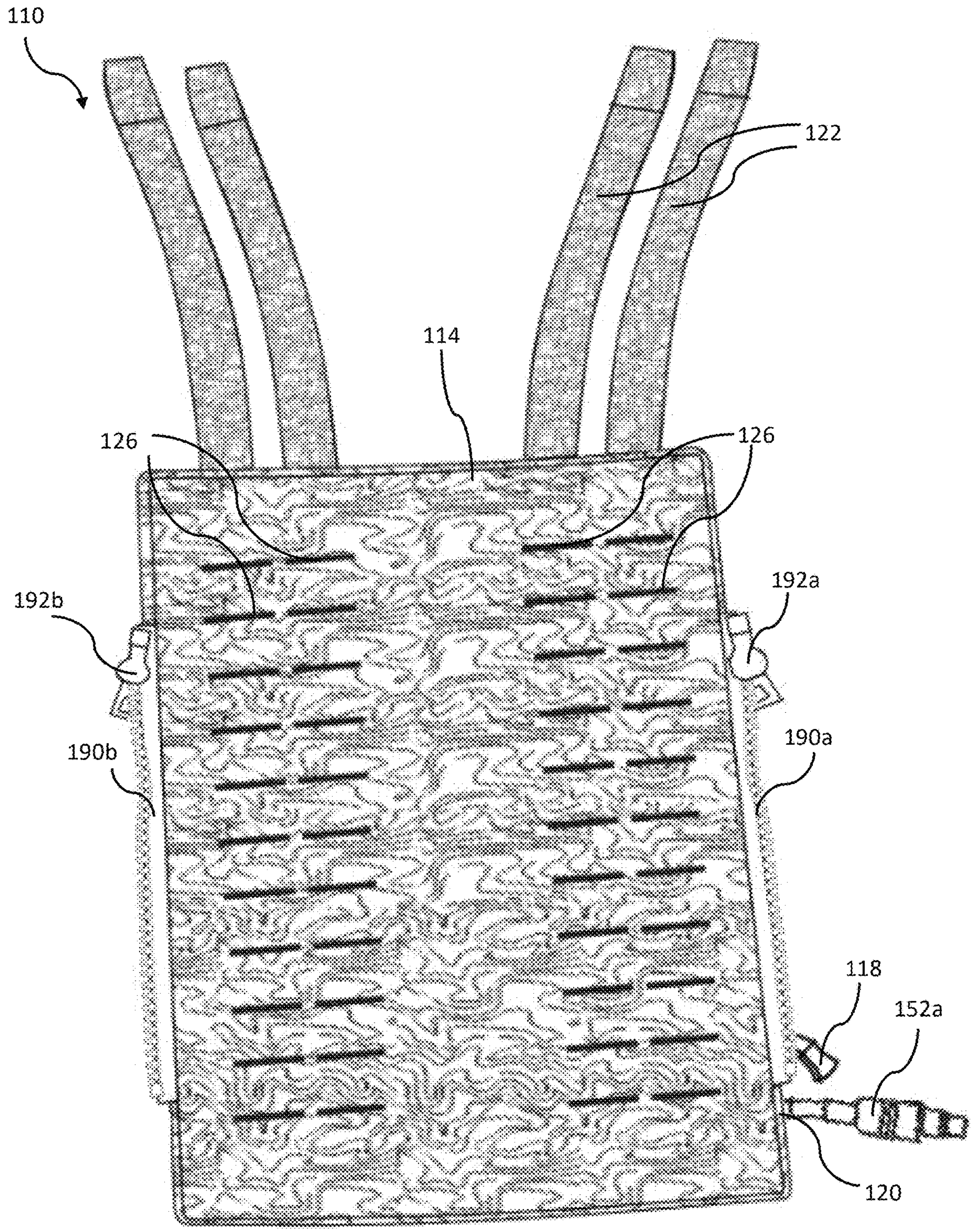
FIG. 24 illustrates a rear perspective view of another example of the portable battery pack that comprises a battery enclosed by a wearable pouch or skin sized to hold the battery and additional devices or components.

In one embodiment, at least one lead of the battery of the portable battery pack is used to power at least one device enclosed in the pouch of the portable battery pack. In the example shown in FIGS. 23-24, the battery of the portable battery pack has a first lead 152*a* and a second lead (not shown). The first lead 152*a* exits the pouch 110 through a lead opening 120. The second lead is used to power at least one device enclosed in the pouch 110 of the portable battery pack.

The portable battery pack is operable to supply power to a power distribution and data hub. The power distribution and data hub is operable to supply power to at least one peripheral device (e.g., tablet, smartphone, computer, radio, rangefinder, GPS system). The power distribution and data hub is also operable to transfer data between at least two of the peripheral devices. Additionally, the power distribution and data hub is operable to transfer data between the battery and the at least one peripheral device when the battery includes at least one processor. In a preferred embodiment, the power distribution and data hub is enclosed in the pouch of the portable battery pack. Alternatively, the power distribution and data hub is not enclosed in the pouch of the portable battery pack.

Figure 25:
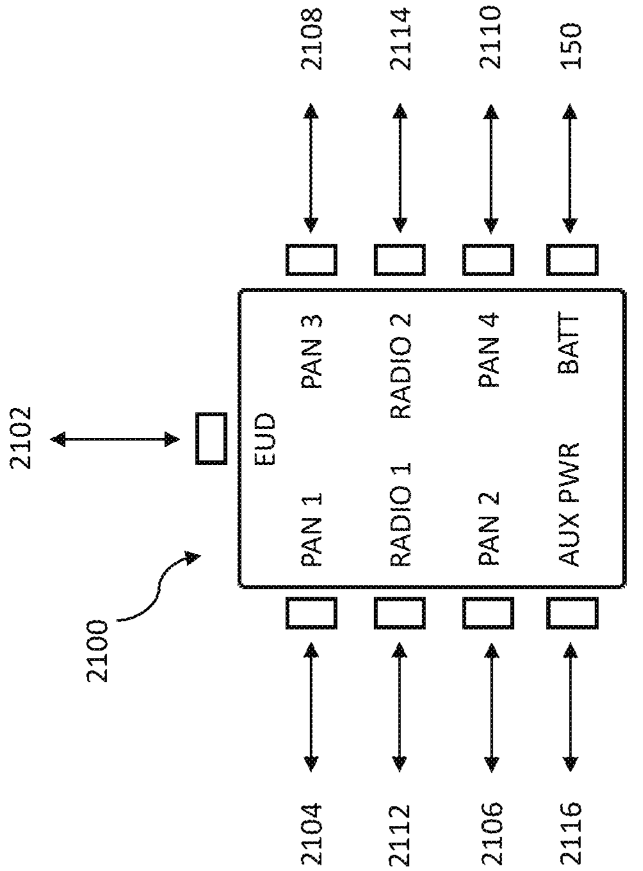
FIG. 25 illustrates a block diagram of one example of a power distribution and data hub.

FIG. 25 illustrates a block diagram of one example of a power distribution and data hub (e.g., STAR-PAN™ by Glenair). The power distribution and data hub 2100 is connected to the battery 150 of the portable battery pack. The battery 150 supplies power to the power distribution and data hub 2100. In the example shown in FIG. 25, the power distribution and data hub 2100 provides power to an end user device (EUD) 2102. The end user device 2102 is a tablet, a smartphone, or a computer (e.g., laptop computer). The power distribution and data hub 2100 is operable to provide power to a first peripheral device 2104, a second peripheral device 2106, a third peripheral device 2108, and a fourth peripheral device 2110 through a personal area network (PAN). In one embodiment, the first peripheral device 2104, the second peripheral device 2106, the third peripheral device 2108, and/or the fourth peripheral device 2110 is a radio, a rangefinder (e.g., Pocket Laser Range Finder (PLRF)), a laser designator (e.g., Special Operations Forces Laser Acquisition Marker (SOFLAM), Type 163 Laser Target Designator), a targeting system (e.g., FIRESTORM™), a GPS device (e.g., Defense Advanced GPS Receiver (DAGR)), night vision goggles, an electronic jamming system (e.g., AN/PLT-4, AN/PLT-5 (Thor II) by Sierra Nevada Corporation, Thor III), a mine detector, a metal detector, a camera (e.g., body camera), a thermal imaging device (e.g., camera, binoculars), a short wave infrared (SWIR) device, a satellite phone, an antenna, a lighting system (e.g., portable runway lights, infrared strobe lights), an environmental sensor (e.g., radiation, airborne chemicals, pressure, temperature, humidity), an amplifier, and/or a receiver (e.g., Tactical Net ROVER™, Intelligence, Surveillance, and Reconnaissance (ISR), Multi-Band Digital Video Receiver Enhanced (MVR VIE), Multi-Band Video Receiver (MVR IV), Soldier Intelligence Receiver (SIR), STRIKEHAWK™ Video Downlink Receiver). The power distribution and data hub 2100 is operable to supply power to peripheral devices that require 5V charging via a USB adapter.

The power distribution and data hub 2100 is operable to supply power to a first radio 2112 and a second radio 2114. In a preferred embodiment, the first radio 2112 and/or the second radio 2114 is a PRC-152, a PRC-154, a PRC-117G, a PRC-161, a persistent wave relay, a PRC-148 MBITR, a PRC-148 JEM, a PRC-6809 MBITR Clear, a RT-1922 SADL, a RF-7850M-HH, a ROVER® (e.g., ROVER® 6x Transceiver by L3 Communication Systems), a push-to-talk radio, and/or a PNR-1000. Alternative radios are compatible with the present invention.

In another embodiment, the first peripheral device 2104, the second peripheral device 2106, the third peripheral device 2108, and/or the fourth peripheral device 2110 is a fish finder and/or a chartplotter, an aerator or a live bait well, a camera (e.g., an underwater camera), a temperature and/or a depth sensor, a stereo, a drone, and/or a lighting system. In one embodiment, the lighting system includes at least one LED.

The power distribution and data hub is operable to recharge at least one battery. For example, the power distribution and data hub is operable to recharge a battery for a drone and/or a robot. The power distribution and data hub is also operable to recharge CR123 batteries, which are often used in devices, such as camera and lighting systems. Advantageously, this allows the power distribution and data hub to recharge batteries in remote locations without access to a power grid, a generator, and/or a vehicle battery.

The power distribution and data hub 2100 is operable to transfer data between the end user device 2102, the first peripheral device 2104, the second peripheral device 2106, the third peripheral device 2108, the fourth peripheral device 2110, the first radio 2112, the second radio 2114, and/or the battery 150 when the battery 150 includes at least one processor.

The power distribution and data hub 2100 has a port to obtain power from an auxiliary power source 2116. In one embodiment, the auxiliary power source 2116 is an alternating current (AC) adapter, a solar panel, a generator, a portable power case, a fuel cell, a vehicle battery, a rechargeable battery, and/or a non-rechargeable battery. Alternatively, the auxiliary power source 2116 is an inductive charger. In another embodiment, the auxiliary power source 2116 is operable to supply power to the power distribution and data hub 2100 by harvesting ambient radiofrequency (RF) waves, capturing exothermic body reactions (e.g., heat, sweat), using friction (e.g., triboelectric effect) or kinetic energy, or harvesting energy from running water or wind energy. In yet another embodiment, the auxiliary power source 2116 is a pedal power generator. The auxiliary power source 2116 is preferably operable to recharge the battery 150.

Figure 26:
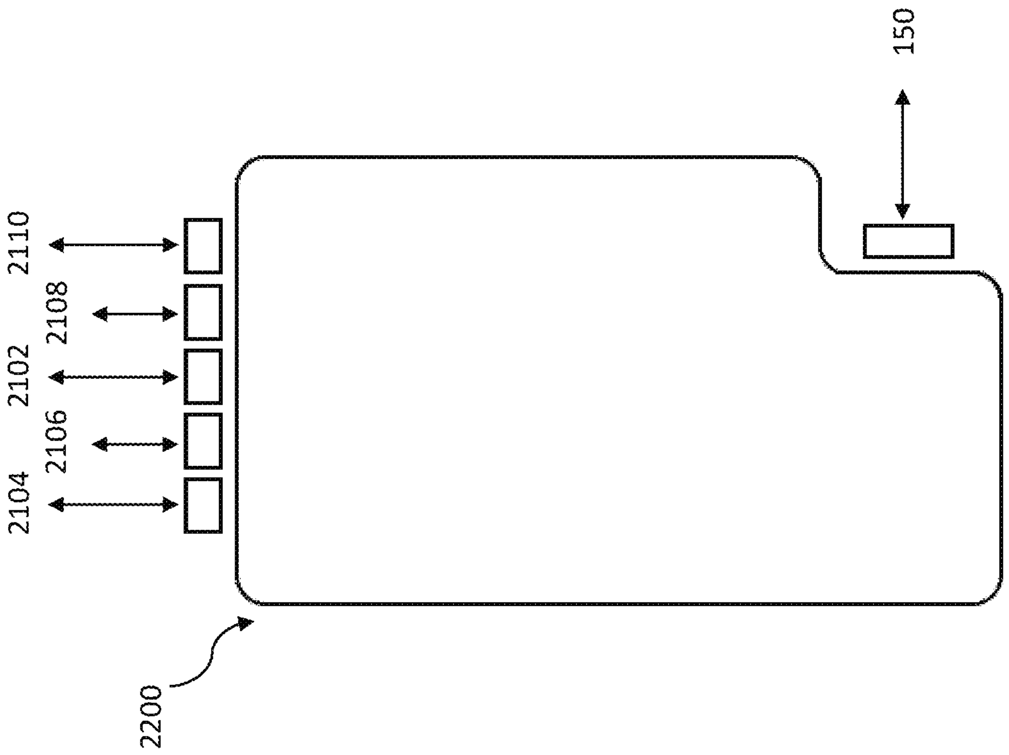
FIG. 26 illustrates a block diagram of another example of a power distribution and data hub.

FIG. 26 illustrates a block diagram of another example of a power distribution and data hub (e.g., APEX™ by Black Diamond Advanced Technology). The power distribution and data hub 2200 is connected to the battery 150 of the portable battery pack. The battery 150 supplies power to the power distribution and data hub 2200. In the example shown in FIG. 26, the power distribution and data hub 2200 provides power to an end user device 2102. The end user device 2102 is a tablet, a smartphone, or a computer (e.g., laptop computer). The power distribution and data hub 2200 is operable to provide power to a first peripheral device 2104, a second peripheral device 2106, a third peripheral device 2108, and a fourth peripheral device 2110. In one embodiment, the first peripheral device 2104, the second peripheral device 2106, the third peripheral device 2108, and/or the fourth peripheral device 2110 is a radio, a rangefinder (e.g., Pocket Laser Range Finder (PLRF)), a laser designator (e.g., Special Operations Forces Laser Acquisition Marker (SOFLAM), Type 163 Laser Target Designator), a targeting system (e.g., FIRESTORM™), a GPS device (e.g., Defense Advanced GPS Receiver (DAGR)), night vision goggles, an electronic jamming system (e.g., AN/PLT-4, AN/PLT-5 (Thor II) by Sierra Nevada Corporation, Thor III), a mine detector, a metal detector, a camera (e.g., body camera), a thermal imaging device (e.g., camera, binoculars), a short wave infrared (SWIR) device, a satellite phone, an antenna, a lighting system (e.g., portable runway lights, infrared strobe lights), an environmental sensor (e.g., radiation, airborne chemicals, pressure, temperature, humidity), an amplifier, and/or a receiver (e.g., Tactical Net ROVER™ Intelligence, Surveillance, and Reconnaissance (ISR), Multi-Band Digital Video Receiver Enhanced (MVR VIE), Multi-Band Video Receiver (MVR IV), Soldier Intelligence Receiver (SIR), STRIKEHAWK™ Video Downlink Receiver). In a preferred embodiment, the radio is a PRC-152, a PRC-154, a PRC-117G, a PRC-161, a persistent wave relay, a PRC-148 MBITR, a PRC-148 JEM, a PRC-6809 MBITR Clear, a RT-1922 SADL, a RF-7850M-HH, a ROVER® (e.g., ROVER® 6× Transceiver by L3 Communication Systems), a push-to-talk radio, and/or a PNR-1000. Alternative radios are compatible with the present invention.

The power distribution and data hub 2200 is operable to transfer data between the end user device 2102, the first peripheral device 2104, the second peripheral device 2106, the third peripheral device 2108, the fourth peripheral device 2110, and/or the battery 150 when the battery 150 includes at least one processor.

In one embodiment, the power distribution and data hub includes at least one step up voltage converter and/or at least one step down voltage converter. In one example, the power distribution and data hub is powered by a 16.8V battery and includes a step up voltage converter to 29.4V. In another example, the power distribution and data hub is powered by a 16.8V battery and includes a step down voltage converter to 5V. Advantageously, this allows the portable battery pack to power devices (e.g., smartphones) with a charging voltage of 5V. This also reduces the bulk outside the power distribution and data hub because the step down voltage converter is housed within the power distribution and data hub and a separate external voltage converter is not required.

In another embodiment, the power distribution and data hub is operable to prioritize a supply of power to the at least one peripheral device. In one example, the power distribution and data hub is connected to a first peripheral device and a second peripheral device. The power distribution and data hub will stop supplying power to the second peripheral device when the available power in the battery and/or auxiliary power source is lower than a designated threshold. In another example, the power distribution and data hub is connected to a first peripheral device, a second peripheral device, a third peripheral device, and a fourth peripheral device. The power distribution and data hub will stop supplying power to the fourth peripheral device when the available power in the battery and/or auxiliary power source is lower than a first designated threshold, the power distribution and data hub will stop supplying power to the third peripheral device when the available power in the battery and/or auxiliary power source is lower than a second designated threshold, and the power distribution and data hub will stop supplying power to the second peripheral device when the available power in the battery and/or auxiliary power source is lower than a third designated threshold.

In one embodiment, the power distribution and data hub provides power in an order of priority of the attached peripheral device and automatically cuts out devices of lower mission priority in order to preserve remaining power for higher priority devices. In one example, a radio has a first (i.e., top) priority, a tablet has a second priority, a mobile phone has a third priority, and a laser designator (e.g., Special Operations Forces Laser Acquisition Marker (SOFLAM)) has a fourth priority.

In one embodiment, the power distribution and data hub prioritizes at least one peripheral device by using at least one smart cable. The at least one smart cable stores information including, but not limited to, a unique identifier (e.g., MAC address) for the at least one peripheral device, power requirements of the at least one peripheral device, a type of device for the at least one peripheral device, and/or a priority ranking for the at least one peripheral device.

Figure 27:
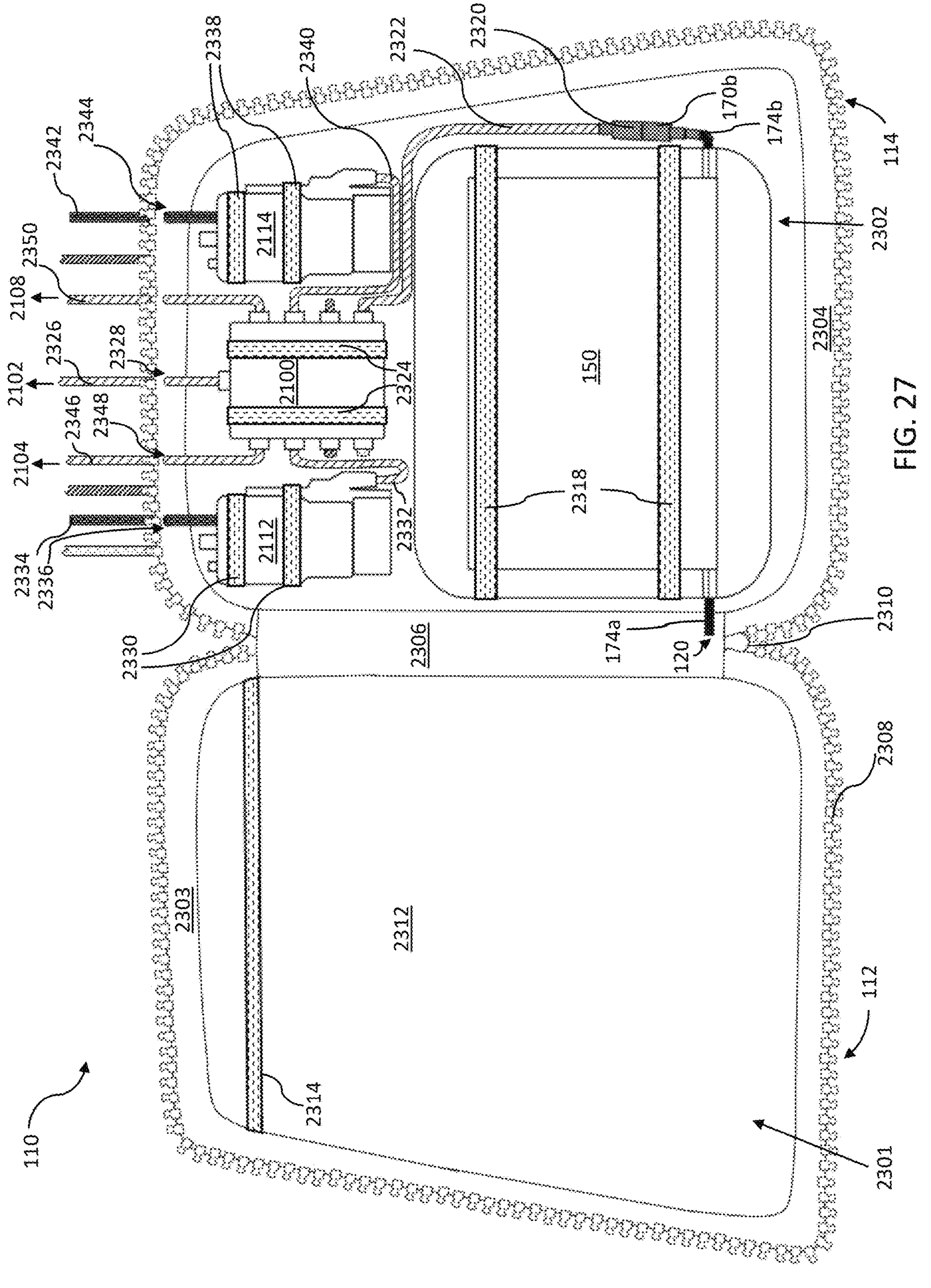
FIG. 27 illustrates an interior perspective view of an example of the portable battery pack that includes a battery and a power distribution and data hub enclosed by a wearable pouch or skin.

FIG. 27 illustrates an interior perspective view of an example of the portable battery pack that includes a battery 150 and a power distribution and data hub 2100 enclosed by a wearable pouch or skin. The first side 112 of the pouch 110 has an interior of the first side 2301. The second side 114 of the pouch 110 has an interior of the second side 2302. The first side 112 has a first side gusset 2303 and the second side 114 has a second side gusset 2304. The first side gusset 2303 and the second side gusset 2304 are attached at a top position of a fabric stop 2306 and a bottom position of the fabric stop 2306. A zipper 2308 with a zipper pull 2310 is attached to the first side gusset 2303 and the second side gusset 2304. Advantageously, this configuration allows the pouch 110 to lie flat when opened.

In a preferred embodiment, an interior of the pouch includes at least one integrated pocket. In the example shown in FIG. 27, the interior of the first side 2301 has an integrated pocket 2312. The integrated pocket 2312 is formed of polyester, polyvinyl chloride (PVC)-coated polyester, vinyl-coated polyester, nylon, canvas, PVC-coated canvas, polycotton canvas, and/or a mesh fabric. In a preferred embodiment, the integrated pocket 2312 is formed of a clear vinyl fabric. Advantageously, this allows a user to see the contents of the integrated pocket 2312. In one example, the user stores a map or instructions in the integrated pocket 2312. The integrated pocket 2312 closes using a piece of elastic 2314. Alternatively, the integrated pocket 2312 closes using a zipper, a hook and loop system, one or more buttons, one or more snaps, one or more ties, one or more buckles, one or more clips, and/or one or more hooks.

The interior of the second side 2302 holds a battery 150, a power distribution and data hub 2100, a first radio 2112, and a second radio 2114. In a preferred embodiment, the battery 150 is held in place by at least one strap 2318. The at least one strap 2318 is preferably made of an elastic material. Alternatively, the at least one strap 2318 is made of a non-elastic material. In other embodiments, the at least one strap 2318 includes hook-and-loop tape. A first spring 174*a* of a first lead (not shown) extends out of the pouch 110 through a lead opening 120. A second spring 174*b* surrounds wiring that is electrically connected to a connector portion 170*b*. The connector 170*b* is electrically connected to a mating connector 2320 that is attached to a battery cable 2322, which connects to the power distribution and data hub 2100.

In a preferred embodiment, the power distribution and data hub 2100 is held in place by at least one strap 2324. The at least one strap 2324 is preferably made of an elastic material. Alternatively, the at least one strap 2324 is made of a non-elastic material. In other embodiments, the at least one strap 2324 includes hook-and-loop tape.

The power distribution and data hub 2100 is connected to an end user device 2102 (e.g., tablet, smartphone, computer) via an end user device cable 2326. The end user device cable 2326 extends out of the pouch 110 through an end user device cable opening 2328.

The power distribution and data hub 2100 is connected to the first radio 2112 via a first radio cable 2332. The first radio 2112 is held in place by at least one strap 2330. The at least one strap 2330 is preferably made of an elastic material. Alternatively, the at least one strap 2330 is made of a non-elastic material. In other embodiments, the at least one strap 2330 includes hook-and-loop tape. In one embodiment, the first radio 2112 has an antenna 2334 that extends out of the pouch 110 through a first radio antenna opening 2336 in the second side gusset 2304. The power distribution and data hub 2100 is connected to the second radio 2114 via a second radio cable 2340. The second radio 2114 is held in place by at least one strap 2338. The at least one strap 2338 is preferably made of an elastic material. Alternatively, the at least one strap 2338 is made of a non-elastic material. In other embodiments, the at least one strap 2338 includes hook-and-loop tape. The second radio 2114 has an antenna 2342 that extends out of the pouch 110 through a second radio antenna opening 2344 in the second side gusset 2304.

Although FIG. 27 illustrates the power distribution and data hub 2100 in an orientation above the battery 150, it is equally possible for the battery 150 to be in an orientation above the power distribution and data hub 2100. In one embodiment, the orientation of the power distribution and data hub 2100 relative to the battery 150 is selected by the user based on multiple factors, including accessibility to equipment and weight distribution.

Figure 28:
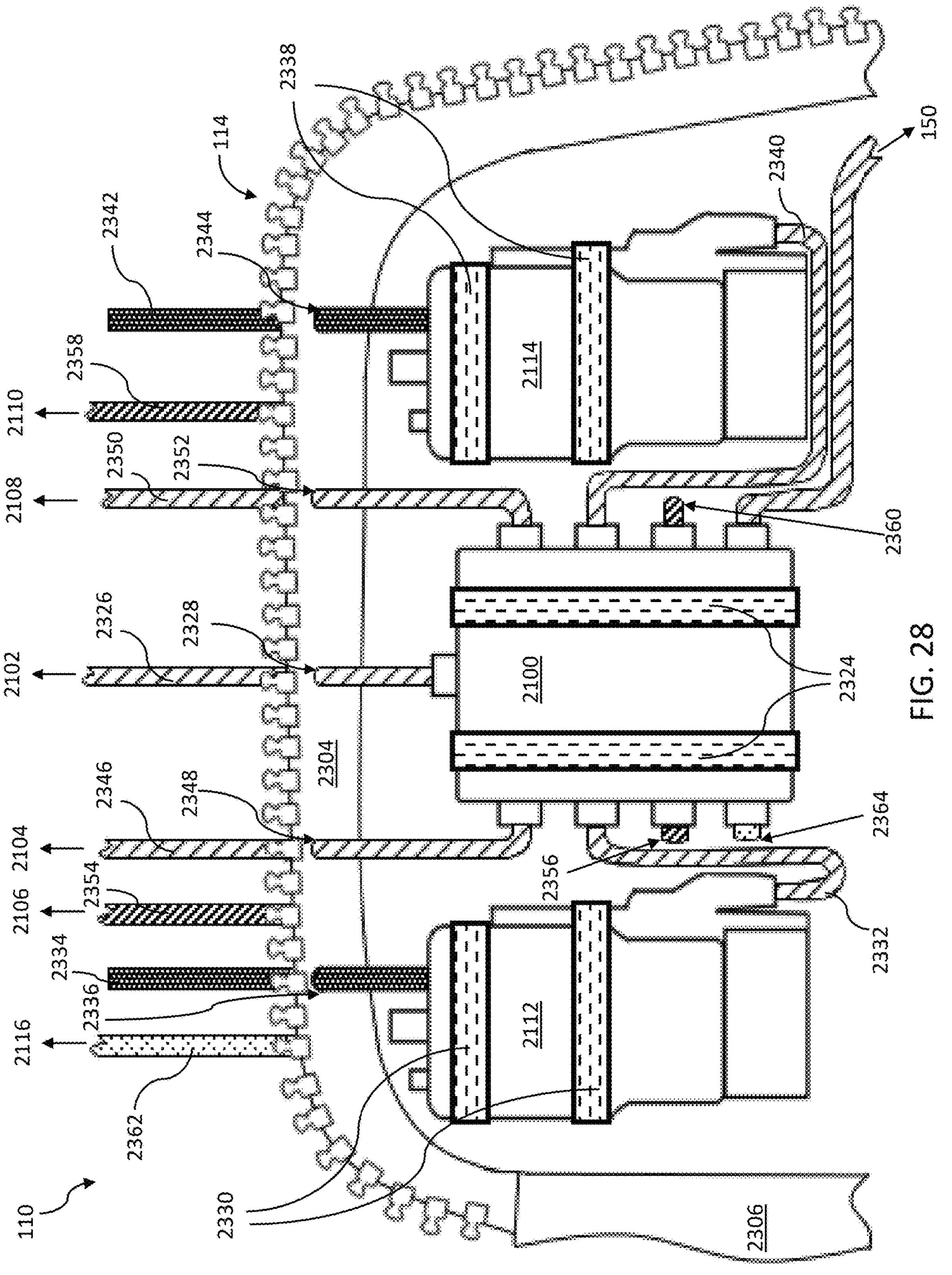
FIG. 28 is a detail view of the interior perspective view of the example of the portable battery pack shown in FIG. 27.

FIG. 28 is a detail view of the interior perspective view of the example of the portable battery pack shown in FIG. 27. The power distribution and data hub 2100 is operable to provide power to a first peripheral device 2104, a second peripheral device 2106, a third peripheral device 2108, and a fourth peripheral device 2110 through a personal area network (PAN). The power distribution and data hub 2100 is connected to the first peripheral device 2104 via a first peripheral device cable 2346. The first peripheral device cable 2346 extends out of the pouch 110 through a first peripheral device cable opening 2348 in the second side gusset 2304. Alternatively, the first peripheral device cable 2346 extends out of the pouch 110 through an opening in the second side 114 of the pouch 110. The power distribution and data hub 2100 is connected to the second peripheral device 2106 via a second peripheral device cable 2354. The second peripheral device cable 2354 extends out of the pouch 110 through a second peripheral device cable opening 2356 in the second side 114 of the pouch 110. Alternatively, the second peripheral device cable 2354 extends out of the pouch 110 through an opening in the second side gusset 2304. The power distribution and data hub 2100 is connected to the third peripheral device 2108 via a third peripheral device cable 2350. The third peripheral device cable 2350 extends out of the pouch 110 through a third peripheral device cable opening 2352 in the second side gusset 2304. Alternatively, the third peripheral device cable 2350 extends out of the pouch 110 through an opening in the second side 114 of the pouch 110. The power distribution and data hub 2100 is connected to the fourth peripheral device 2110 via a fourth peripheral device cable 2358. The fourth peripheral device cable 2358 extends out of the pouch 110 through a fourth peripheral device cable opening 2360 in the second side 114 of the pouch 110. Alternatively, the fourth peripheral device cable 2358 extends out of the pouch 110 through an opening in the second side gusset 2304. In other embodiments, at least one of the first peripheral device 2104, the second peripheral device 2106, the third peripheral device 2108, and/or the fourth peripheral device 2110 is stored in the pouch 110.

The power distribution and data hub 2100 is operable to obtain power from an auxiliary power source 2116. The power distribution and data hub 2100 is connected to the auxiliary power source 2116 via an auxiliary power source cable 2364. The auxiliary power source cable 2364 extends out of the pouch 110 through an auxiliary power source cable opening 2364 in the second side gusset 2304. Alternatively, the auxiliary power source cable 2364 extends out of the pouch 110 through an opening in the second side 114 of the pouch 110. In another embodiment, the auxiliary power source 2116 (e.g., a non-rechargeable battery) is stored in the pouch 110.

In one embodiment, the auxiliary power source 2116 is an alternating current (AC) adapter, a solar panel, a generator, a portable power case, a fuel cell, a vehicle battery, a rechargeable battery, and/or a non-rechargeable battery. Alternatively, the auxiliary power source 2116 is an inductive charger. In another embodiment, the auxiliary power source 2116 is operable to supply power to the power distribution and data hub 2100 by harvesting ambient radiofrequency (RF) waves, capturing exothermic body reactions (e.g., heat, sweat), using friction (e.g., triboelectric effect) or kinetic energy, or harvesting energy from running water or wind energy. In yet another embodiment, the auxiliary power source 2116 is a pedal power generator. The auxiliary power source 2116 is preferably operable to recharge the battery 150.

Figure 29:
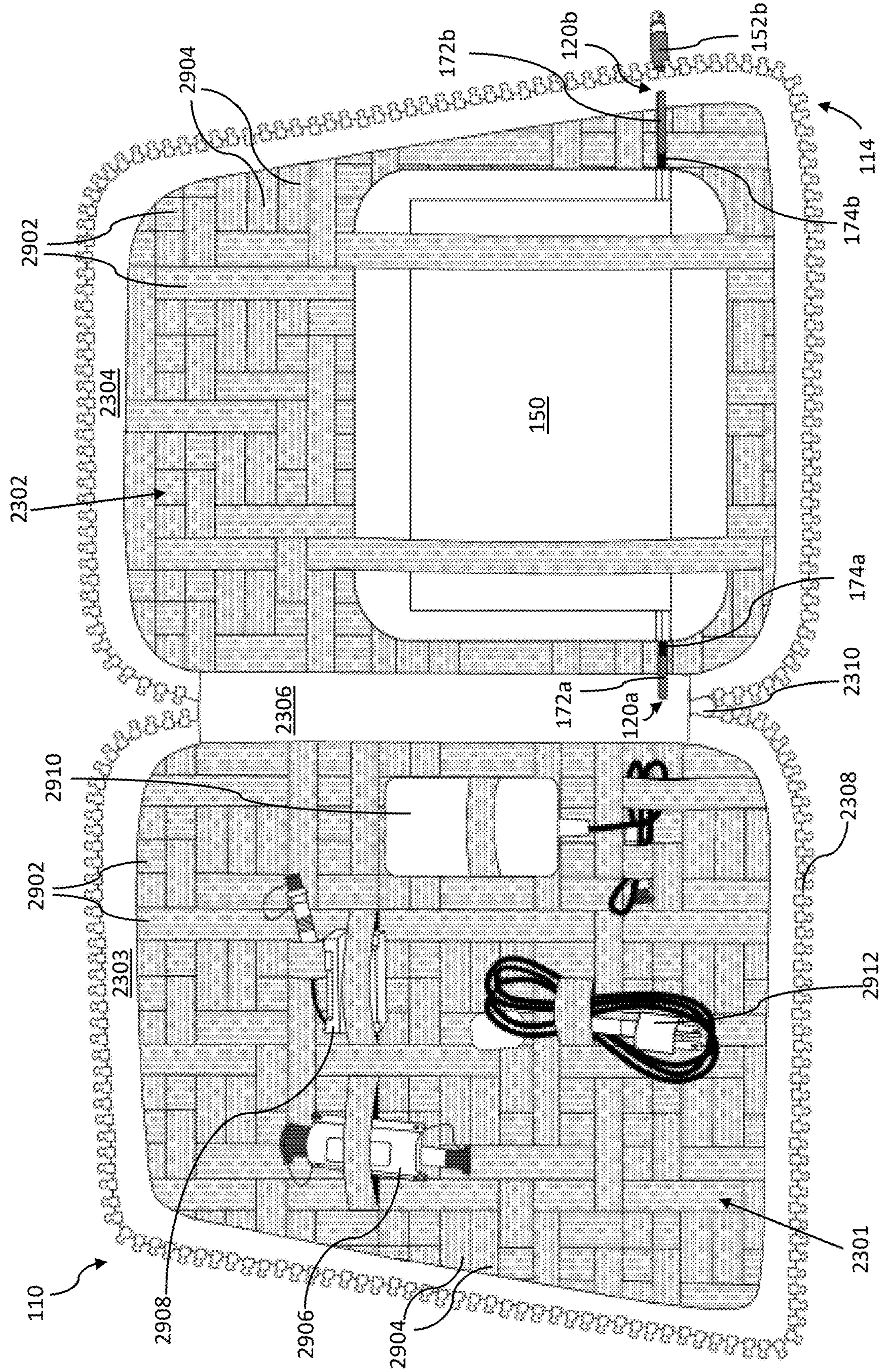
FIG. 29 illustrates an interior perspective view of an example of the portable battery pack that includes an object retention system in the wearable pouch or skin.

FIG. 29 illustrates an interior perspective view of an example of the portable battery pack that includes an object retention system in the wearable pouch or skin. The pouch 110 has an interior of a first side 2301 and an interior of a second side 2302. In a preferred embodiment, the interior of the first side 2301 and/or the interior of the second side 2302 contains an object retention system (e.g., GRID-IT® by Cocoon Innovations) as described in US Publication Nos. 20090039122, 20130214119, and 20130256498, each of which is incorporated herein by reference in its entirety.

The object retention system is formed of a weave of a plurality of rubberized elastic bands. The plurality of rubberized elastic bands is preferably formed of a first set of straps 2902 and a second set of straps 2904. The first set of straps 2902 is preferably oriented substantially perpendicular to the second set of straps 2904. Additionally, each strap in the first set of straps 2902 is preferably oriented substantially parallel to other straps in the first set of straps 2902. Further, each strap in the second set of straps 2904 is preferably oriented substantially parallel to other straps in the second set of straps 2904. In the example shown in FIG. 29, the first set of straps 2902 is shown in a substantially vertical direction and the second set of straps 2904 is shown in a substantially horizontal direction.

In the example shown in FIG. 29, the interior of the first side 2301 has an object retention system. The object retention system is shown holding a state of charge indicator 2906. An example of a state of charge indicator 2906 is disclosed in US Publication Nos. 20170269162 and 20150198670, each of which is incorporated herein by reference in its entirety. The object retention system is also shown holding a universal DC power adaptor 2908. An example of a universal DC power adaptor 2908 is disclosed in U.S. Pat. No. 9,240,651, which is incorporated herein by reference in its entirety. The object retention system is shown holding a first half of an AC adapter 2910 and a second half of an AC adapter 2912.

The interior of the second side 2302 holds a battery 150. A first wiring portion 172*a* of a first lead (not shown) extends out of the pouch 110 through a first lead opening 120*a*. A second wiring portion 172*b* of a second lead 152*b* extends out of the pouch 110 through a second lead opening 120*b*. A first spring 174*a* is provided around the first wiring portion 172*a*, such that a portion of the first spring 174*a* is inside the battery cover and a portion of the first spring 174*a* is outside the battery cover. The presence of the first spring 174*a* around the first wiring portion 172*a* of the first lead (not shown) allows the first lead to be flexed in any direction for convenient connection to equipment from any angle. The presence of the first spring 174*a* around the first wiring portion 172*a* of the first lead also allows the first lead to be flexed repeatedly without breaking or failing. A second spring 174*b* is provided around the second wiring portion 172*b*, such that a portion of the second spring 174*b* is inside the battery cover and a portion of the second spring 174*b* is outside the battery cover. The presence of the second spring 174*b* around the second wiring portion 172*b* of the second lead 152*b* allows the second lead 152*b* to be flexed in any direction for convenient connection to equipment from any angle. The presence of the second spring 174*b* around the second wiring portion 172*b* of the second lead 152*b* also allows the second lead 152*b* to be flexed repeatedly without breaking or failing. In one example, the first spring 174*a* and/or the second spring 174*b* is a steel spring that is from about 0.25 inches to about 1.5 inches long.

Figure 30:
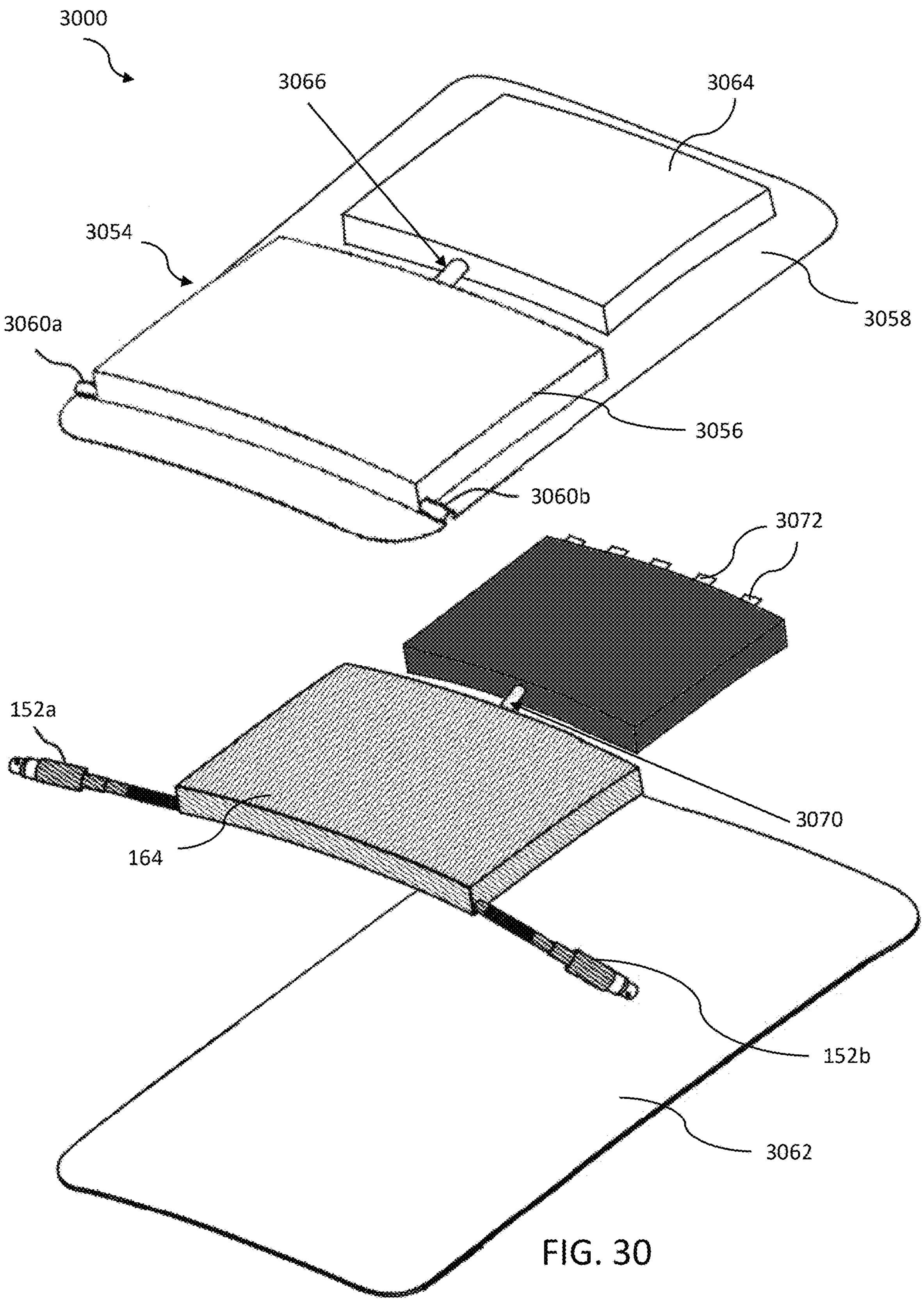
FIG. 30 is an exploded view of an example of a battery and a power distribution and data hub housed in the same enclosure.

FIG. 30 is an exploded view of an example of a battery and a power distribution and data hub housed in the same enclosure 3000. The enclosure 3000 includes a battery element 164 and a power distribution and data hub 3002 that is housed between a cover 3054 and a back plate 3062. The battery element 164 supplies the first lead 152*a* and the second lead 152*b*. The battery element 164 is formed of a plurality of sealed battery cells or individually contained battery cells, i.e. batteries with their own cases, removably disposed therein.

The power distribution and data hub 3002 is connected to the battery element 164 via a cable 3070. The power distribution and data hub 3002 includes at least one connector 3072. The at least one connector 3072 is panel mounted or an omnidirectional flexible lead (e.g., FIG. 16). In one embodiment, the at least one connector 3072 includes a dust cap (not shown) to cover a corresponding lead. Advantageously, the dust cap protects the at least one connector from dust and other environmental contaminants that may cause battery failure in the field.

The cover 3054 includes a battery compartment 3056 that is sized to receive at least one battery element 164. The cover 3054 includes a hub compartment 3064 that is sized to receive the power distribution and data hub 3002. In a preferred embodiment, the battery compartment 3056 is substantially rectangular in shape. In one embodiment, the hub compartment 3064 is substantially rectangular in shape. The battery compartment 3056 is connected to the hub compartment 3064 via a channel 3066 sized to receive the cable 3070. A top hat style rim 3058 is provided around a perimeter of the battery compartment 3056 and the hub compartment 3064. The cover 3054 incudes at least one channel formed in the cover 3054 to accommodate a wire of a corresponding lead. The example in FIG. 30 shows two channels 3060 (e.g., channels 3060*a*, 3060*b*) formed in the cover 3054 (one on each side) to accommodate the wires of the first lead 152*a* and the second lead 152*b* passing therethrough. The cover 3054 includes at least one channel formed in the cover 3054 to accommodate the at least one connector 3072.

The cover 3054 and the back plate 3062 are formed of plastic using, for example, a thermoform process or an injection molding. The back plate 3062 can be mechanically attached to the rim 3058 of the cover 3054 via, for example, an ultrasonic spot welding process or an adhesive. Advantageously, the top hat style rim 3058 provides a footprint for the ultrasonic spot welding process and provides structural integrity for the battery and the power distribution and data hub housed in the same enclosure. In one embodiment, a water barrier material (e.g., silicone) is applied to the mating surfaces of the rim 3058 and the back plate 3062. In another embodiment, the cover 3054, the back plate 3062, the power distribution and data hub 3002, and/or the battery element 164 has a slight curvature or contour for conforming to, for example, the user's vest, backpack, or body armor. In one example, the curvature of the portable battery pack is engineered to match the outward curve of body armor.

Advantageously, this means that the portable battery pack does not jostle as the operator moves, which results in less caloric energy expenditure when the operator moves. Alternatively, the cover 3054, the back plate 3062, the power distribution and data hub 3002, and/or the battery element 164 can have a slight outward curvature or contour for conforming to a user's body (e.g., back region, chest region, abdominal region, arm, leg). In yet another embodiment, the cover 3054, the back plate 3062, the power distribution and data hub 3002, and/or the battery element 164 can have a slight outward curvature or contour for conforming to a user's helmet or hat.

Figure 31:
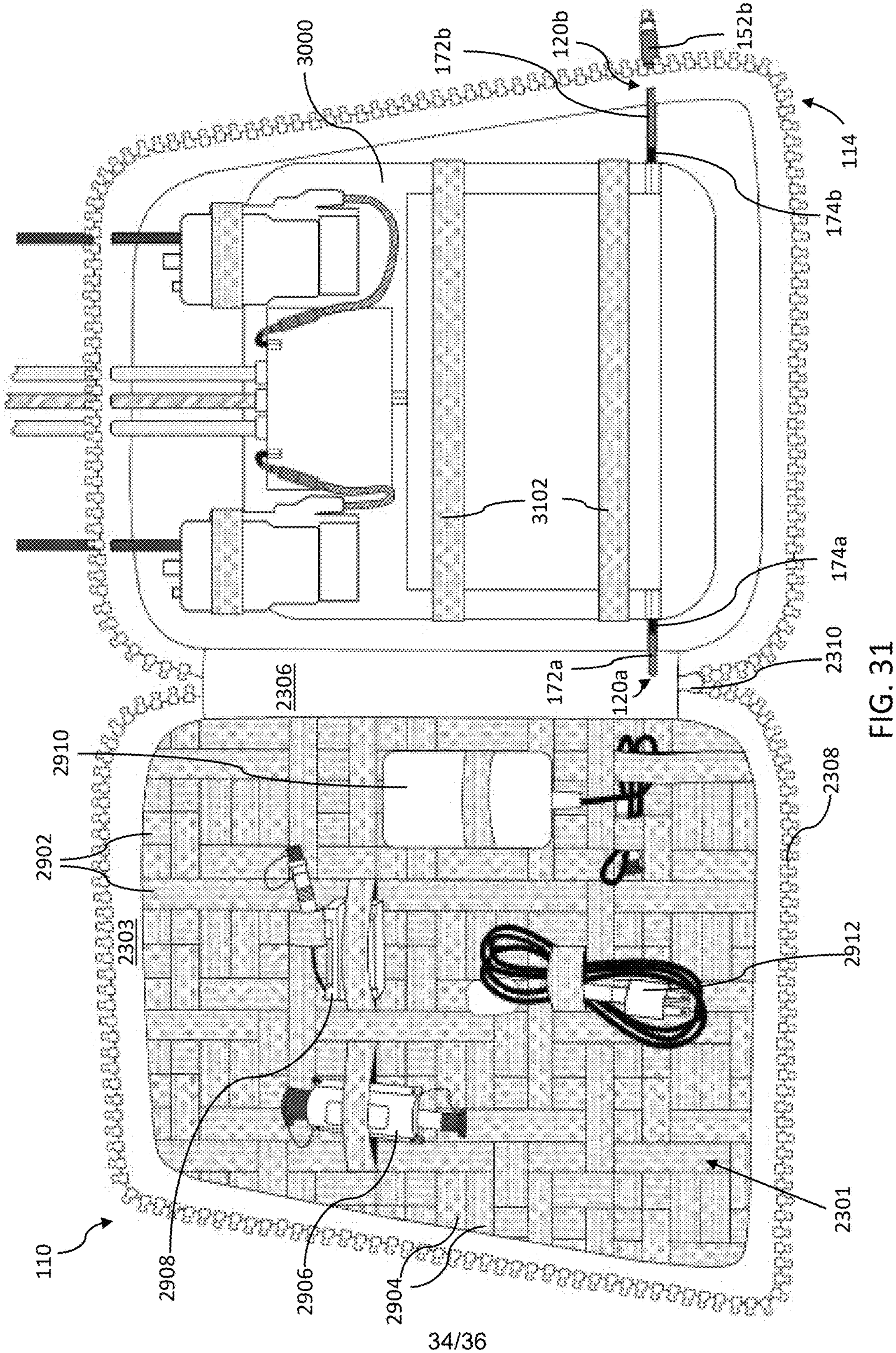
FIG. 31 illustrates an interior perspective view of an example of the portable battery pack that includes a battery and a power distribution and data hub housed in the same enclosure.

FIG. 31 illustrates an interior perspective view of an example of the portable battery pack that includes a battery and a power distribution and data hub housed in the same enclosure 3000. The first side 112 of the pouch 110 has an interior of the first side 2301. The second side 114 of the pouch 110 has an interior of the second side 2302. The first side 112 has a first side gusset 2303 and the second side 114 has a second side gusset 2304. The first side gusset 2303 and the second side gusset 2304 are attached at a top position of a fabric stop 2306 and a bottom position of the fabric stop 2306. A zipper 2308 with a zipper pull 2310 is attached to the first side gusset 2303 and the second side gusset 2304. Advantageously, this configuration allows the pouch 110 to lie flat when opened.

In the example shown in FIG. 31, the interior of the first side 2301 has an object retention system. The object retention system is shown holding a state of charge indicator 2906. An example of a state of charge indicator 2906 is disclosed in US Publication Nos. 20170269162 and 20150198670, each of which is incorporated herein by reference in its entirety. The object retention system is also shown holding a universal DC power adaptor 2908. An example of a universal DC power adaptor 2908 is disclosed in U.S. Pat. No. 9,240,651, which is incorporated herein by reference in its entirety. The object retention system is shown holding a first half of an AC adapter 2910 and a second half of an AC adapter 2912.

The interior of the second side 2302 holds a battery and a power distribution and data hub housed in the same enclosure 3000. In a preferred embodiment, the battery and the power distribution and data hub housed in the same enclosure 3000 is held in place by at least one strap 3102. The at least one strap 3102 is preferably made of an elastic material. Alternatively, the at least one strap 3102 is made of a non-elastic material. In other embodiments, the at least one strap 3102 includes hook-and-loop tape.

A first wiring portion 172*a* of a first lead (not shown) extends out of the pouch 110 through a first lead opening 120*a*. A second wiring portion 172*b* of a second lead 152*b* extends out of the pouch 110 through a second lead opening 120*b*. A first spring 174*a* is provided around the first wiring portion 172*a*, such that a portion of the first spring 174*a* is inside the battery cover and a portion of the first spring 174*a* is outside the battery cover. The presence of the first spring 174*a* around the first wiring portion 172*a* of the first lead (not shown) allows the first lead to be flexed in any direction for convenient connection to equipment from any angle. The presence of the first spring 174*a* around the first wiring portion 172*a* of the first lead also allows the first lead to be flexed repeatedly without breaking or failing. A second spring 174*b* is provided around the second wiring portion 172*b*, such that a portion of the second spring 174*b* is inside the battery cover and a portion of the second spring 174*b* is outside the battery cover. The presence of the second spring 174*b* around the second wiring portion 172*b* of the second lead 152*b* allows the second lead 152*b* to be flexed in any direction for convenient connection to equipment from any angle. The presence of the second spring 174*b* around the second wiring portion 172*b* of the second lead 152*b* also allows the second lead 152*b* to be flexed repeatedly without breaking or failing. In one example, the first spring 174*a* and/or the second spring 174*b* is a steel spring that is from about 0.25 inches to about 1.5 inches long.

Figure 32:
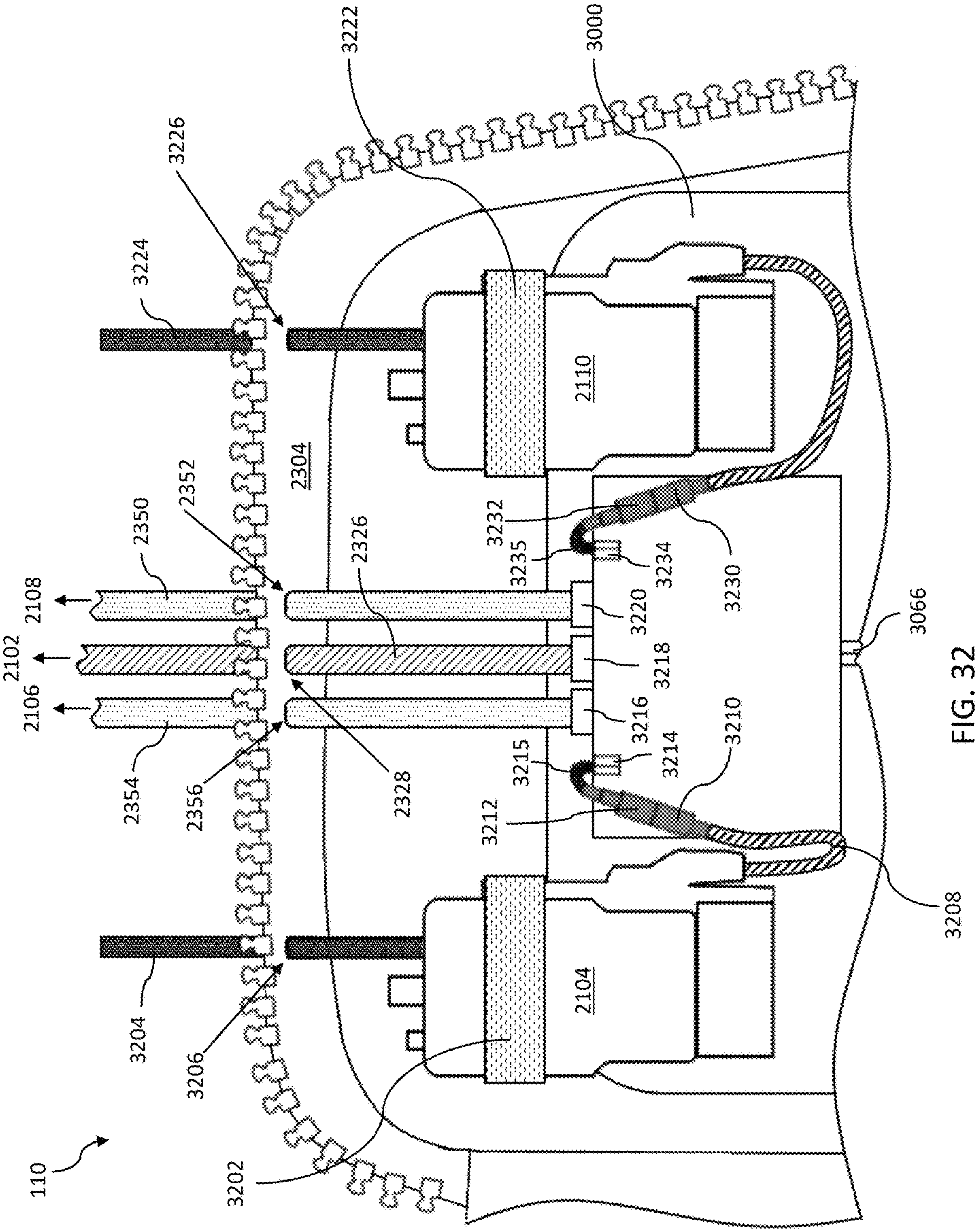
FIG. 32 is a detail view of the interior perspective view of the example of the portable battery pack shown in FIG. 31.

FIG. 32 is a detail view of the interior perspective view of the example of the portable battery pack shown in FIG. 31. As previously mentioned, the cover of the battery and the power distribution and data hub housed in the same enclosure 3000 includes a channel 3066 sized to receive a cable to connect the battery element and the power distribution and data hub. The power distribution and data hub of the battery and the power distribution and data hub housed in the same enclosure 3000 is connected to an end user device 2102 (e.g., tablet, smartphone, computer) via an end user device cable 2326 connected to a second panel mount connector 3218. The end user device cable 2326 extends out of the pouch 110 through an end user device cable opening 2328.

The power distribution and data hub of the battery and the power distribution and data hub housed in the same enclosure 3000 is operable to provide power to a first peripheral device 2104, a second peripheral device 2106, a third peripheral device 2108, and a fourth peripheral device 2110 through a personal area network (PAN). In the example shown in FIG. 32, the first peripheral device 2104 is a first radio. The first peripheral device 2104 is held in place by at least one strap 3202. The at least one strap 3202 is preferably made of an elastic material. Alternatively, the at least one strap 3202 is made of a non-elastic material. In other embodiments, the at least one strap 3202 includes hook-and-loop tape. In one embodiment, the first peripheral device 2104 has an antenna 3204 that extends out of the pouch 110 through a first antenna opening 3206 in the second side gusset 2304. The power distribution and data hub is connected to the first peripheral device 2104 via a first peripheral device cable 3208 with a connector 3210 that mates to a first flexible omnidirectional lead 3212 of the power distribution and data hub. The first flexible omnidirectional lead 3212 of the power distribution and data hub extends out of the cover of the battery and the power distribution and data hub housed in the same enclosure 3000 via a first channel 3214 in the cover.

A first spring 3215 is provided around the wiring portion of the first flexible omnidirectional lead 3212, such that a portion of the first spring 3215 is inside the cover of the battery and the power distribution and data hub housed in the same enclosure 3000 and a portion of the first spring 3215 is outside the cover of the battery and the power distribution and data hub housed in the same enclosure 3000. In one example, the first spring 3215 is a steel spring that is from about 0.25 inches to about 1.5 inches long. In another example, the first spring 3215 is a steel spring that is from about 0.25 inches to about 8 inches long. The wiring portion of the first flexible omnidirectional lead 3212 and the first spring 3215 are held securely in the first channel 3214 via a clamping mechanism. Alternatively, the wiring portion of the lead and the spring are held securely in the first channel using an adhesive, a retention pin, a hex nut, a hook anchor, and/or a zip tie. The presence of the first spring 3215 around the wiring portion of the first flexible omnidirectional lead 3212 allows the first flexible omnidirectional lead 3212 to be flexed in any direction for convenient connection to equipment from any angle. The presence of the first spring 3215 around the wiring portion of the first flexible omnidirectional lead 3212 also allows the first flexible omnidirectional lead 3212 to be flexed repeatedly without breaking or failing.

The power distribution and data hub is connected to the second peripheral device 2106 via a second peripheral device cable 2354 connected to a first panel mount connector 3216. The second peripheral device cable 2354 extends out of the pouch 110 through a second peripheral device cable opening 2356 in the second side gusset 2304. Alternatively, the second peripheral device cable 2354 extends out of the pouch 110 through an opening in the second side 114 of the pouch 110. The power distribution and data hub is connected to the third peripheral device 2108 via a third peripheral device cable 2350 connected to a third panel mount connector 3220. The third peripheral device cable 2350 extends out of the pouch 110 through a third peripheral device cable opening 2352 in the second side gusset 2304. Alternatively, the third peripheral device cable 2350 extends out of the pouch 110 through an opening in the second side 114 of the pouch 110.

In the example shown in FIG. 32, the fourth peripheral device 2110 is a second radio. The first peripheral device 2104 is held in place by at least one strap 3222. The at least one strap 3222 is preferably made of an elastic material. Alternatively, the at least one strap 3222 is made of a non-elastic material. In other embodiments, the at least one strap 3222 includes hook-and-loop tape. In one embodiment, the fourth peripheral device 2110 has an antenna 3224 that extends out of the pouch 110 through a second antenna opening 3226 in the second side gusset 2304. The power distribution and data hub is connected to the fourth peripheral device 2110 via a fourth peripheral device cable 3228 with a connector 3230 that mates to a second flexible omnidirectional lead 3232 of the power distribution and data hub. The second flexible omnidirectional lead 3232 of the power distribution and data hub extends out of the cover of the battery and the power distribution and data hub housed in the same enclosure 3000 via a second channel 3234 in the cover.

A second spring 3235 is provided around the wiring portion of the second flexible omnidirectional lead 3232, such that a portion of the second spring 3235 is inside the cover of the battery and the power distribution and data hub housed in the same enclosure 3000 and a portion of the second spring 3235 is outside the cover of the battery and the power distribution and data hub housed in the same enclosure 3000. In one example, the second spring 3235 is a steel spring that is from about 0.25 inches to about 1.5 inches long. In another example, the second spring 3235 is a steel spring that is from about 0.25 inches to about 8 inches long. The wiring portion of the second flexible omnidirectional lead 3232 and the second spring 3235 are held securely in the second channel 3234 via a clamping mechanism. Alternatively, the wiring portion of the lead and the spring are held securely in the first channel using an adhesive, a retention pin, a hex nut, a hook anchor, and/or a zip tie. The presence of the second spring 3235 around the wiring portion of the second flexible omnidirectional lead 3232 allows the second flexible omnidirectional lead 3232 to be flexed in any direction for convenient connection to equipment from any angle. The presence of the second spring 3235 around the wiring portion of the second flexible omnidirectional lead 3232 also allows the second flexible omnidirectional lead 3232 to be flexed repeatedly without breaking or failing.

As previously described, the power distribution and data hub includes at least one flexible omnidirectional lead in one embodiment. The flexible omnidirectional lead of the power distribution and data hub is preferably formed using a spring that is about 0.25 inches to about 8 inches long. In one embodiment, the spring of the power distribution and data hub extends out of the pouch through an opening in the second side gusset. In one embodiment, the opening includes a grommet. In another embodiment, the pouch has a seal around an opening for a corresponding lead of the power distribution and data hub. The seal is tight around the lead, which prevents water from entering the pouch through the opening. In one embodiment, the seal is formed of a rubber (e.g., neoprene).

In one embodiment, the power distribution and data hub includes at least one processor and at least one memory. Advantageously, this allows the power distribution and data hub to run software. In one embodiment, the end user device is a screen (e.g., touch screen). An additional advantage of running software off of the power distribution and data hub is that if the screen breaks, a user can leave the screen behind without a risk of confidential information being exposed. In another embodiment, the power distribution and data hub includes at least one data port. Advantageously, this allows the power distribution and data hub to receive information from another computing device (e.g., laptop, desktop computer).

In another embodiment, the power distribution and data hub includes at least one layer of a material to dissipate heat. In one embodiment, the at least one layer of a material to dissipate heat is housed within the power distribution and data hub. In one embodiment, at least one layer of a material to dissipate heat is housed within the power distribution and data hub on an external facing side. Advantageously, this protects the power distribution and data hub from external heat sources (e.g., a hot vehicle). In another embodiment, at least one layer of a material to dissipate heat is housed within the power distribution and data hub on a side of the power distribution and data hub facing the wearer. Advantageously, this protects the wearer from heat given off by the power distribution and data hub.

In yet another embodiment, the at least one layer of a material to dissipate heat is between the cover and the power distribution and data hub of the battery and the power distribution and data hub housed in the same enclosure. Advantageously, this protects the power distribution and data hub from external heat sources (e.g., a hot vehicle). In another embodiment, the at least one layer of a material to dissipate heat is between the back plate and the power distribution and data hub of the battery and the power distribution and data hub housed in the same enclosure. Advantageously, this protects the wearer from heat given off by the power distribution and data hub.

In one embodiment, the battery management system of the battery of the portable battery pack is housed in the power distribution and data hub. Advantageously, this separates heat generated by the battery management system from the plurality of electrochemical cells. In this embodiment, the power distribution and data hub preferably includes at least one layer of a material to dissipate heat. This embodiment also provides additional benefits for distributing weight within the pouch.

In another embodiment, the power distribution and data hub includes a material to provide resistance to bullets and/or shrapnel. In one embodiment, the material to provide resistant to bullets and/or shrapnel is incorporated into a housing of the power distribution and data hub. In an alternative embodiment, the material to provide resistance to bullets and/or shrapnel is housed within the power distribution and data hub on an external facing side. Advantageously, this layer protects the electronics housed in the power distribution and data hub as well as the user. Additionally or alternatively, the material to provide resistance to bullets and/or shrapnel is housed within the power distribution and data hub on a side of the power distribution and data hub facing the wearer. Advantageously, this layer provides additional protection to the user. In another embodiment, the material to provide resistance to bullets and/or shrapnel is incorporated into the cover and/or back plate of the battery and the power distribution and data hub housed in the same enclosure.

Figure 33:
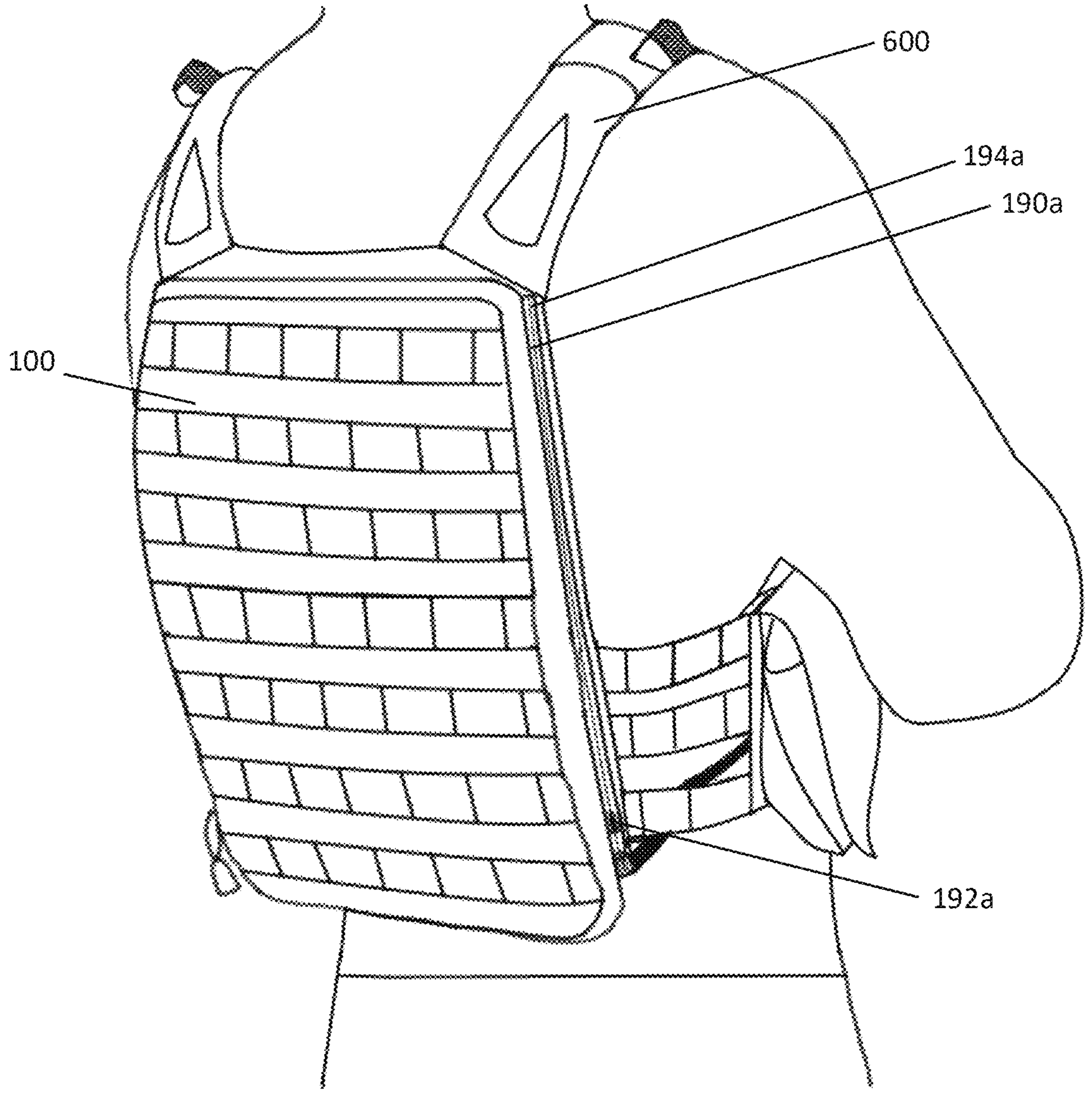
FIG. 33 illustrates a side perspective view of another example of a portable battery pack affixed to a vest using zippers.

FIG. 33 illustrates a side perspective view of another example of a portable battery pack 100 affixed to a vest 600 using zippers. In the example shown in FIG. 33, the pouch of the portable battery pack 100 is sized to hold the battery and additional devices or components. A first single width of zipper tape 190*a* is shown mated with a corresponding first single width of zipper tape 194*a* on a right side of the vest 600 using a first zipper slider 192*a*, thereby attaching the portable battery pack 100 to the vest 600. Similarly, a second single width of zipper tape (not shown) is mated with a corresponding second single width of zipper tape (not shown) on a left side of the vest 600 using a second zipper slider (not shown).

In summary and referring now to FIG. 1 through FIG. 33, the present invention provides a system for supplying power to at least one power distribution and data hub using a portable battery pack including one or more batteries enclosed in a wearable pouch, wherein the one or more batteries include at least one battery element, a battery cover, a battery back plate, and one or more flexible omnidirectional leads that include a connector portion and a wiring portion, wherein a flexible spring is provided around the wiring portion such that a portion of the flexible spring is positioned inside the battery cover and a portion of the flexible spring is positioned outside the battery cover.

In other embodiments, the present invention provides a portable battery pack including a wearable pouch and one or more batteries enclosed in the wearable pouch, wherein the pouch has a first side and an opposite second side, a closable opening through which the one or more batteries can be fitted into the pouch, one or more openings through which one or more leads from the one or more batteries can be accessed, and wherein the pouch includes a pouch attachment ladder system (PALS) adapted to attach the pouch to a load-bearing platform.

In some embodiments, the pouch is formed of a flexible, durable, and waterproof and/or water-resistant material. In particular embodiments, the material forming the pouch is selected from the group consisting of polyester, polyvinyl chloride (PVC)-coated polyester, vinyl-coated polyester, nylon, canvas, PVC-coated canvas, and polycotton canvas.

In yet more particular embodiments, the pouch has an exterior finish with a camouflage pattern. In representative embodiments, the camouflage pattern is selected from the group consisting of Universal Camouflage Pattern (UCP), MultiCam, Universal Camouflage Pattern-Delta (UCP-Delta), Airman Battle Uniform (ABU), Navy Working Uniform (NWU), MARPAT, Disruptive Overwhite Snow Digital Camouflage, Urban Digital Camouflage, and Tactical Assault Camouflage (TACAM).

In some embodiments, the closable opening can be closed by a mechanism selected from the group consisting of a zipper, a hook and loop system, one or more buttons, one or more snaps, one or more ties, one or more buckles, one or more clips, and one or more hooks.

In particular embodiments, the load-bearing platform is selected from the group consisting of a vest (e.g., bulletproof vest, Rhodesian vest), a backpack, body armor, a belt (e.g., tactical belt), a chair, a seat, a boat, a kayak, a canoe, a body of a user (e.g., back region, chest region, abdominal region, arm, leg), a vehicle (e.g., truck, high mobility multipurpose wheeled vehicle (Humvee), all-terrain vehicle (ATV), sport utility vehicle (SUV)), a cargo rack, a helmet, or a hat. In certain embodiments, the portable battery pack is Modular Lightweight Load-carrying Equipment (MOLLE)-compatible. In yet more certain embodiments, the pouch attachment ladder system is formed of a plurality of straps, a plurality of horizontal rows of webbing, a plurality of slits, and combinations thereof.

In some embodiments, the one or more batteries include a battery element, a battery cover, and a battery back plate. In particular embodiments, one or more of the battery element, battery cover, and battery back plate have a curvature or contour adapted to conform to a curvature or contour of the load-bearing platform.

In further embodiments, the one or more batteries includes one or more flexible omnidirectional leads, wherein each lead includes a connector portion and a wiring portion, and wherein at least a portion of the wiring portion is encompassed by a flexible spring.

In certain embodiments, the battery has a length having a range from about 12 inches to about 8 inches, a width having a range from about 10 inches to about 7 inches, and a thickness having a range from about 2 inches to about 0.5 inches.

The above-mentioned examples are provided to serve the purpose of clarifying the aspects of the invention, and it will be apparent to one skilled in the art that they do not serve to limit the scope of the invention. By way of example, and not limitation, the battery includes more than two flexible omnidirectional leads. Also by way of example, the pouch is operable to have different dimensions than those listed. By nature, this invention is highly adjustable, customizable and adaptable. The above-mentioned examples are just some of the many configurations that the mentioned components can take on. All modifications and improvements have been deleted herein for the sake of conciseness and readability but are properly within the scope of the present invention.

The invention claimed is:

1. A system for supplying power comprising:

a battery pack including one or more batteries;

at least one power consuming device; and a Y-splitter with a first connector and a second connector;

wherein the one or more batteries include one or more leads;

wherein the Y-splitter is attached to the one or more leads;

wherein the one or more batteries supply power to the at least one power consuming device;

wherein the at least one power consuming device includes a power distribution and data hub configured to prioritize power output to at least one peripheral device.

2. The system of claim 1, wherein the one or more batteries are enclosed in a receptacle, wherein the receptacle includes one or more openings through which the one or more leads from the one or more batteries can be accessed.

3. The system of claim 1, wherein the first connector and the second connector of the Y-splitter each include a dust cap.

4. The system of claim 1, wherein the power distribution and data hub is configured to stop powering the at least one peripheral device when available power in the one or more batteries is lower than a designated threshold.

5. The system of claim 1, wherein the battery pack is operable to affix to a vest using at least one zipper.

6. The system of claim 1, wherein the power distribution and data hub includes at least one smart cable, wherein the at least one smart cable is configured to connect to the at least one peripheral device, wherein the at least one smart cable is configured to store peripheral device data, and wherein the peripheral device data includes a unique identifier, at least one power requirement, a type of device, and/or a priority ranking.

7. The system of claim 1, wherein the battery pack is Modular Lightweight Load-carrying Equipment (MOLLE)-compatible.

8. The system of claim 1, wherein the at least one power consuming device includes a radio, a rangefinder, a laser designator, a Global Positioning System (GPS) device, an electronic jamming system, a mine detector, a metal detector, a camera, a thermal imaging device, a short wave infrared device, a satellite phone, an antenna, a lighting system, an environmental sensor, an amplifier, and/or a receiver.

9. A system for supplying power comprising:
- a battery pack including one or more batteries;
- at least one power consuming device; and
- a Y-splitter including a first connector and a second connector;
- wherein the one or more batteries include one or more leads including a wiring portion;
- wherein the Y-splitter is attached to the one or more leads;
- wherein the at least one power consuming device includes a power distribution and data hub configured to prioritize power output to at least one peripheral device.

10. The system of claim 9, wherein the one or more batteries are operable to be enclosed in a wearable article, and wherein the wearable article includes one or more openings through which the one or more leads from the one or more batteries can be accessed.

11. The system of claim 9, wherein the one or more batteries are rechargeable.

12. The system of claim 9, wherein the battery pack is Modular Lightweight Load-carrying Equipment (MOLLE)-compatible.

13. The system of claim 9, wherein the one or more batteries include a battery cover and a battery back plate attached to the battery cover.

14. The system of claim 13, wherein the wiring portion is held securely in the battery cover.

15. The system of claim 9, wherein the first connector of the Y-splitter is configured to supply power from the one or more batteries to the at least one power consuming device, wherein the second connector of the Y-splitter is configured to charge the one or more batteries simultaneously with the first connector of the Y-splitter supplying the power to the at least one power consuming device.

16. The system of claim 9, wherein the one or more leads further include a heat shrink tubing.

17. A system for supplying power comprising:
- a battery pack including one or more batteries; and
- at least one power consuming device;
- wherein the one or more batteries include one or more leads;
- wherein the at least one power consuming device includes a power distribution and data hub configured to prioritize power output to at least one peripheral device and at least one second peripheral device based on available power in the one or more batteries.

18. The system of claim 17, further comprising a pouch, wherein the pouch further includes a pouch attachment ladder system (PALS) operable to attach the pouch to a load bearing platform.

19. The system of claim 17, wherein the one or more leads include two or more leads, wherein at least one of the two or more leads is operable to charge at least one of the one or more batteries and at least one different lead of the two or more leads is operable to simultaneously power at least one power consuming device.

20. The system of claim 17, wherein a Y-splitter with a first connector and a second connector is attached to the one or more leads.

* * * * *